(12) United States Patent
Aoai et al.

(10) Patent No.: US 6,852,467 B2
(45) Date of Patent: Feb. 8, 2005

(54) POSITIVE RESIST COMPOSITION

(75) Inventors: Toshiaki Aoai, Shizuoka (JP);
Shoichiro Yasunami, Shizuoka (JP);
Kazuyoshi Mizutani, Shizuoka (JP);
Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 249 days.

(21) Appl. No.: 09/961,281

(22) Filed: Sep. 25, 2001

(65) Prior Publication Data

US 2002/0061464 A1 May 23, 2002

(30) Foreign Application Priority Data

| Sep. 26, 2000 | (JP) | P.2000-292537 |
| Dec. 13, 2000 | (JP) | P.2000-379284 |
| Mar. 6, 2001 | (JP) | P.2001-062158 |
| Jul. 3, 2001 | (JP) | P.2001-202298 |

(51) Int. Cl.$^7$ ............................................. G03F 7/004
(52) U.S. Cl. ................................. 430/270.1; 430/907
(58) Field of Search .......................... 430/270.1, 907

(56) References Cited

U.S. PATENT DOCUMENTS 5,693,452 A * 12/1997 Aoai et al. ............... 430/270.1
6,087,064 A * 7/2000 Lin et al. ................. 430/270.1
6,100,004 A * 8/2000 Elsaesser et al. ............ 430/176
6,265,135 B1 * 7/2001 Kodama et al. ......... 430/286.1
6,461,791 B1 * 10/2002 Hatakeyama et al. .... 430/270.1

FOREIGN PATENT DOCUMENTS

GB 2 356 258 A 5/2001
WO WO 00/67072 11/2000

OTHER PUBLICATIONS

Kim, US 2002/0177067 A1, Nov. 2002 for U.S. Appl. No. 09/947,582 filed Sep. 2001.*

* cited by examiner

*Primary Examiner*—Rosemary Ashton
(74) *Attorney, Agent, or Firm*—Sughrue Mion, PLLC

(57) ABSTRACT

A positive resist composition comprising:

(A) a fluorine group-containing resin having: a structure wherein at least one of the main chain and the side chain of the polymer skeleton has at least one fluorine atom; and having a group capable of decomposing under the action of an acid to increase the solubility in an alkali developer;

(B) a compound capable of generating an acid upon irradiation with one of actinic ray and radiation, and (C) a surfactant containing at least one of a silicon atom and a fluorine atom.

20 Claims, No Drawings

POSITIVE RESIST COMPOSITION

FIELD OF THE INVENTION

The present invention relate to a positive resist composition suitable for use in the microlithography process in the production of VLSI or high-capacity microchip, or in other photo-fabrication processes. More specifically, the present invention relates to a positive resist composition capable of forming a highly definite pattern using a vacuum ultraviolet ray of 160 nm or less.

BACKGROUND OF THE INVENTION

The integration degree of integrated circuits is more and more intensified and in the production of a semiconductor substrate of VLSI, an ultrafine pattern comprising lines having q width of quarter-micron or less must be processed. For achieving refinement of a pattern, means of using an exposure light source having a shorter wavelength in the formation of a resist pattern is known.

For example, in the production of a semiconductor device having an integration degree of up to 64 M bits, the i-line (365 nm) of a high-pressure mercury lamp has been heretofore used as the light source until today. For the positive resist respondent to this light source, a large number of compositions comprising a novolak resin and a naphthoquinone diazide compound as a photosensitive material have been developed and succeeded in giving a satisfactory result in the processing of lines having a width of about 0.3 µm or more. In the production of a semiconductor device having an integration degree of 256 M-bits or more, a KrF excimer laser ray (248 nm) is employed as the exposure light source in place of the i-line.

Recently, for producing a semiconductor having an integration degree of 1 G-bit or more, an ArF excimer laser ray (193 nm) which is a light source having a short wavelength is used. Furthermore, use of an $F_2$ excimer laser ray (157 nm) is being studied for forming a pattern of 0.1 µm or less.

To cope with this tendency toward shorter wavelength of the light source, the resist material is greatly changed in its constituent components and chemical structure. More specifically, conventional resists comprising a novolak resin and a naphthoquinonediazide compound have large absorption in the far ultraviolet region at 248 nm and therefore, the ray may fail in reaching the resist bottom to a sufficient depth, as a result, only a tapered pattern and low sensitivity is obtained.

In order to solve this problem, a so-called chemical amplification-type resist, that is, a composition mainly comprising a resin having a basic skeleton of poly(hydroxystyrene) which shows small absorption in the region of 248 nm and is protected with an acid-decomposable group, and using in combination a compound (photoacid generator) capable of generating an acid upon irradiation with a far ultraviolet ray has been developed. In the chemical amplification-type resist, the acid generated in the exposed area causes a catalytic decomposition reaction and thereby changes the solubility in a developer, so that a high-sensitivity and high-resolution pattern can be formed.

However, the compound having an aromatic group originally has large absorption in the region at a wavelength of 193 nm and therefore, when an ArF excimer laser ray (193 nm) is used, even the above-described chemical amplification-type resist cannot provide sufficiently high performance.

To solve this problem, the acid decomposable resin having a basic skeleton of poly(hydroxystyrene) is replaced by an acid decomposable resin having incorporated into the main or side chain of the polymer an alicyclic structure having no absorption at 193 nm, with an attempt to improve the chemical amplification-type resist.

However, this alicyclic resin has large absorption in the region of 157 nm and therefore, with use of an $F_2$ excimer laser ray (157 nm), is still deficient in obtaining an objective pattern of 0.1 µm or less. On the other hand, Proc. SPIE., Vol. 3678, page 13 (1999) has reported that a resin having incorporated thereinto a fluorine atom (perfluoro-structure) has sufficiently high transparency to light at 157 nm, and effective fluorine resin structures have been reported in Proc. SPIE., Vol. 3999, page 330 (2000), ibidem., page 357 (2000), ibidem., page 365 (2000) and WO-00/17712.

The resists comprising such a fluorine resin are, however, not always satisfied with respect to the dry etching resistance and since these resins show peculiar water repellency or oil repellency attributable to the perfluoro-structure, improvement of the coatability (uniformity of the coated surface) and prevention of development defects are being demanded.

SUMMARY OF THE INVENTION

Accordingly, an object of the present invention is to provide a positive resist composition suitable for the case using an exposure light source of 160 nm or less, particularly a $F_2$ excimer laser ray (157 nm). More specifically, the object of the present invention is to provide a positive resist composition capable of exhibiting sufficiently high transparency on use of a light source at 157 nm and satisfying the properties with respect to the coatability and the development defect.

Another object of the present invention is to provide a positive resist composition capable of forming a pattern with good sensitivity and high resolution and ensuring excellent dry etching resistance.

As a result of extensive investigations by taking account of various properties described above, the present inventors have found that the objects of the present invention can be successfully attained by the use of the following specific composition. The present invention has been accomplished based on this finding.

More specifically, the present invention has the following constructions.

(1) A positive resist composition comprising:

(A) a fluorine group-containing resin having: a structure wherein at least one of the main chain and the side chain of the polymer skeleton has at least one fluorine atom; and a group capable of decomposing under the action of an acid to increase the solubility in an alkali developer;

(B) a compound capable of generating an acid upon irradiation with at least one of an actinic ray or radiation; and (C) a surfactant containing at least one of a silicon atom and fluorine atom.

(2) The positive resist composition as described in item (1), wherein the resin (A) comprises at least one of fluorine group-containing resins (i) and (ii) below:

(i) a fluorine group-containing resin having at least one selected from a perfluoroalkylene group and a perfluoroarylene group as a part or all of the main chain of the polymer skeleton;
(ii) a fluorine group-containing resin having at least one selected from a perfluoroalkyl group, a perfluoroaryl group, a hexafluoro-2-propanol group and a group wherein the OH group in a hexafluoro-2-propanol group is protected, as a part or all of the side chain of the polymer skeleton.

(3) The positive resist composition as described in item (1) or (2), wherein the resin (A) contains at least one of repeating units represented by formulae (I) to (X):

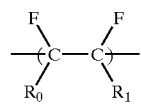
(I)

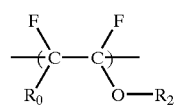
(II)

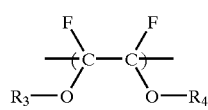
(III)

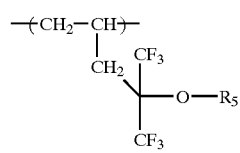
(IV)

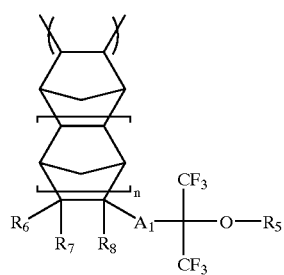
(V)

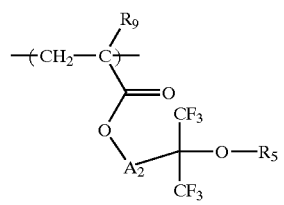
(VI)

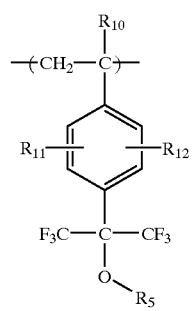
(VII)

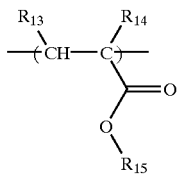
(VIII)

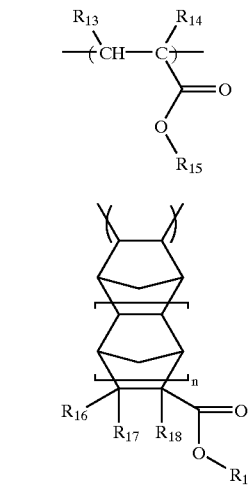
(IX)

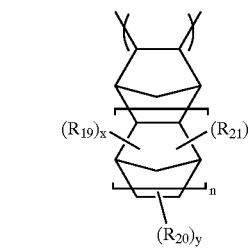
(X)

wherein $R_0$ and $R_1$ each represents a hydrogen atom, a fluorine atom, or an alkyl, perfluoroalkyl, cycloalkyl or aryl group, each of which may have a substituent;

$R_2$ to $R_4$ each represents an alkyl, perfluoroalkyl, cycloalkyl or aryl group, each of which may have a substituent and $R_0$ and $R_1$ may combine to form a ring, $R_0$ and $R_2$ may combine to form a ring and $R_3$ and $R_4$ may combine to form a ring;

$R_5$ represents a hydrogen atom, an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom or an alkyl, perfluoroalkyl or alkoxy group, each of which may have a substituent;

$R_9$ and $R_{10}$ each represents a hydrogen atom, a halogen atom, a cyano group, or an alkyl or haloalkyl group, each of which may have a substituent;

$R_{11}$, and $R_{12}$ each represents a hydrogen atom, a hydroxyl group, a halogen atom a cyano group, an alkoxy group, an acyl group, an alkyl, cycloalkyl, alkenyl, aralkyl or aryl group, and the alkyl, the cycloalkyl, the alkenyl, the aralkyl or the aryl group each may have a substituent;

$R_{13}$ and $R_{14}$ each represents a hydrogen atom, a halogen atom, a cyano group, or an alkyl or haloalkyl, each of which may have a substituent;

$R_{15}$ represents an alkyl, monocyclic or polycyclic cycloalkyl, alkenyl, aralkyl or aryl group, each of which has a fluorine atom;

$R_{16}$, $R_{17}$ and $R_{18}$ each represents a hydrogen atom, a halogen atom, a cyano group, or an alkyl, perfluoroalkyl, alkoxy or —CO—O—$R_{15}$ group, each of which may have a substituent;

$R_{19}$, $R_{20}$ and $R_{21}$ each represents a hydrogen atom, a fluorine atom or an alkyl, monocyclic or polycyclic cycloalkyl, alkenyl, aralkyl, aryl or alkoxy group, each of which has a fluorine atom, provided that at least one of $R_{19}$, $R_{20}$ and $R_{21}$ is a group other than a hydrogen atom;

$A_1$ and $A_2$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane group or a ureido group;

$R_{24}$ represents a hydrogen atom or an alkyl, cycloalkyl, aralkyl or aryl group, each of which may have a substituent;

n represents 0 or 1; and x, y and z each represents an integer of 0 to 4.

(4) The positive resist composition as described in any one of item (1) to (3), wherein the resin (A) contains at least one of repeating units represented by formulae (XI) to (XIII):

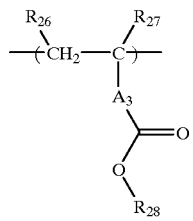

(XI)

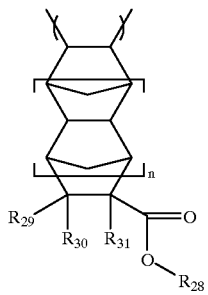

(XII)

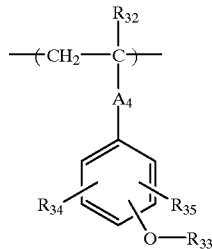

(XIII)

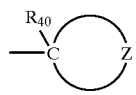

(XIV)

wherein $R_{29}$, $R_{30}$ and $R_{31}$ each represents a hydrogen atom, a halogen atom, a cyano group or an alkyl, perfluoroalkyl, alkoxy or —CO—O—$R_{28}$ group, each of which may have a substituent;

$R_{34}$ and $R_{35}$ each represents a hydrogen atom, a hydroxyl group, a halogen atom, a cyano group, an alkoxy group, an acyl group, an alkyl, cycloalkylene, alkenyl, aralkyl or aryl group, and the alkyl, cycloalkylene, alkenyl, aralkyl or aryl group each may have a substituent;

$R_{36}$, $R_{37}$, $R_{38}$ and $R_{39}$ each represents an alkyl, cycloalkyl, alkenyl, aralkyl or aryl group, each of which may have a substituent, and two of $R_{36}$, $R_{37}$ and $R_{38}$, or two of $R_{36}$, $R_{37}$ and $R_{39}$ may combine to form a ring;

$R_{40}$ represents an alkyl, cycloalkyl, alkenyl, alkynyl, aralkyl or aryl group, each of which may have a substituent;

$A_3$ and $A_4$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group, each of which may have a substituent;

$R_{22}$ to $R_{25}$ have the same meanings as above;

Z represents an atomic group constituting a monocyclic or polycyclic alicyclic group together with the carbon atom; and n represents 0 or 1.

(5) The positive composition as described in any one of items (1) to (4), wherein the resin (A) contains at least one of repeating units represented by formulae (XV) to (XVII):

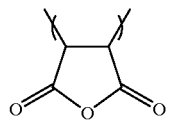

(XV)

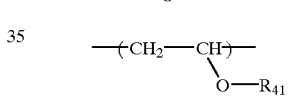

(XVI)

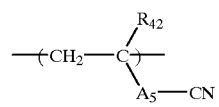

(XVII)

wherein $R_{41}$ represents an alkyl, cycloalkyl, aralkyl or aryl group, each of which may have a substituent;

$R_{42}$ represents a hydrogen atom, a halogen atom, a cyano group, or an alkyl or haloalkyl group, each of which may have a substituent;

$A_5$ represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$ to $R_{25}$ have the same meanings as above.

(6) The positive resist composition as described in any one of items (1) to (5), wherein the resin (A) contains: at least one of repeating units represented by formulae (I) to (III); and at least one of repeating units represented by formulae (IV) to (VI):

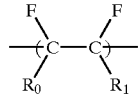

(I)

wherein $R_{26}$, $R_{27}$ and $R_{32}$ each represents a hydrogen atom, a halogen atom, a cyano group, or an alkyl or haloalkyl group, each of which may have a substituent;

$R_{28}$ and $R_{33}$ each represents —C($R_{36}$)($R_{37}$)($R_{38}$), —C($R_{36}$)($R_{37}$)(O$R_{39}$) or a group represented by formula (XIV):

-continued

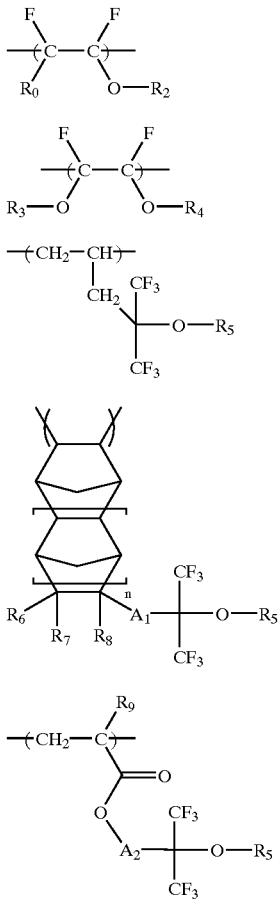

(II)

(III)

(IV)

(V)

(VI)

wherein $R_0$ and $R_1$ each represents a hydrogen atom, a fluorine atom or an alkyl, perfluoroalkyl, cycloalkyl or aryl group, each of which may have a substituent, $R_2$ to $R_4$ each represents an alkyl, perfluoroalkyl, cycloalkyl or aryl group, each of which may have a substituent, and Ro and $R_1$ may combine to form a ring, $R_0$ and $R_2$ may combine to form a ring, and $R_3$ and $R_4$ may combine to form a ring;

$R_5$ represents a hydrogen atom or an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom or an alkyl, perfluoroalkyl or alkoxy group, each of which may have a substituent;

$R_9$ represents a hydrogen atom, a halogen atom, a cyano group, or an alkyl or haloalkyl group, each of which may have a substituent;

$A_1$ and $A_2$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane or a ureido group;

$R_{24}$ represents a hydrogen atom or an alkyl, cycloalkyl, aralkyl or aryl group, each of which may have a substituent; and n represents 0 or 1.

(7) The positive resist composition as described in any one of items (1) to (5), wherein the resin (A) contains: at least one of repeating units represented by formulae (IV) to (VI) below; and at least one of repeating units represented by formulae (VIII) to (X) below:

(IV)

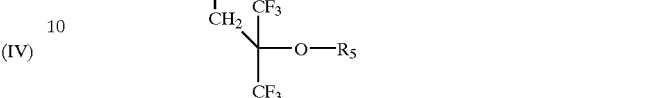

(V)

(VI)

(VIII)

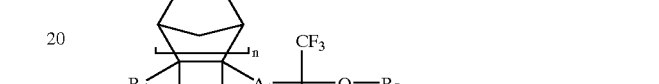

(IX)

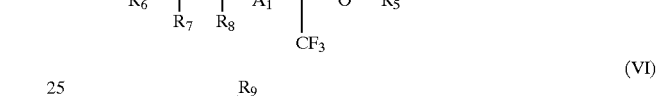

(X)

wherein $R_5$ represents a hydrogen atom or an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom or an alkyl, perfluoroalkyl or alkoxy group, each of which may have a substituent;

$R_9$ represents a hydrogen atom, a halogen atom, a cyano group, or an alkyl or haloalkyl group, each of which may have a substituent;

$R_{13}$ and $R_{14}$ each represents a hydrogen atom, a halogen atom, a cyano group, or an alkyl or haloalkyl group, each of which may have a substituent;

$R_{15}$ represents an alkyl, monocyclic or polycyclic cycloalkyl, alkenyl, aralkyl or aryl group, each of which has a fluorine atom;

$R_{16}$, $R_{17}$ and $R_{18}$ each represents a hydrogen atom, a halogen atom, a cyano group, or an alkyl, perfluoroalkyl, alkoxy or —CO—O—$R_{15}$ group, each of which may have a substituent;

$R_{19}$, $R_{20}$ and $R_{21}$ each represents a hydrogen atom, a fluorine atom or an alkyl, monocyclic or polycyclic cycloalkyl, alkenyl, aralkyl, aryl or alkoxy group, each of which has a fluorine atom, provided that at least one of $R_{19}$, $R_{20}$ and $R_{21}$ is a group other than a hydrogen atom;

$A_1$ and $A_2$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane group or a ureido group;

$R_{24}$ represents a hydrogen atom or an alkyl, cycloalkyl, aralkyl or aryl group, each of which may have a substituent;

n represents 0 or 1; and x, y and z each represents an integer of 0 to 4.

(8) The positive resist composition as described in any one of items (1) to (5), wherein the resin (A) contains: at least one of repeating units represented by formulae (IV) to (VII) below; and at least one of repeating units represented by formulae (XV) to (XVII) below:

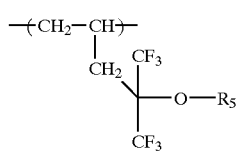 (IV)

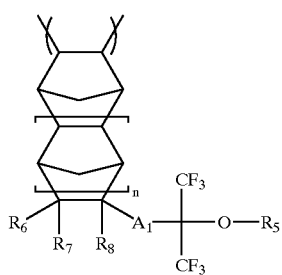 (V)

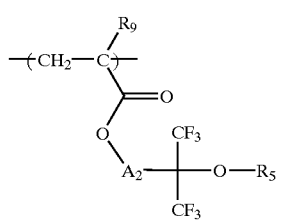 (VI)

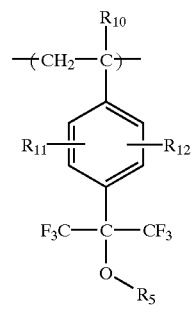 (VII)

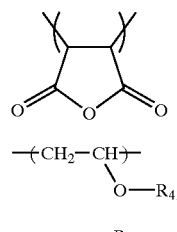 (XV)

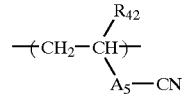 (XVI)

(XVII)

wherein $R_5$ represents a hydrogen atom or an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom, or an alkyl, perfluoroalkyl or alkoxy group, each of which may have a substituent;

$R_9$ and $R_{10}$ each represents a hydrogen atom, a halogen atom, a cyano group, or an alkyl or haloalkyl group, each of which may have a substituent;

$R_{11}$ and $R_{12}$ each represents a hydrogen atom, a hydroxyl group, a halogen atom, a cyano group, an alkoxy group, an acyl group, an alkyl, cycloalkyl, alkenyl, aralkyl or aryl group, and the alkyl, cycloalkyl, alkenyl, aralkyl or aryl group each may have a substituent;

$A_1$ and $A_2$ each represents a single bond or a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane group or a ureido group;

$R_{24}$ represents a hydrogen atom or an alkyl, cycloalkyl, aralkyl or aryl group, each of which may have a substituent;

n represents 0 or 1;

$R_{41}$ represents an alkyl, cycloalkyl, aralkyl or aryl group, each of which may have a substituent;

$R_{42}$ represents a hydrogen atom, a halogen atom, a cyano group, or an alkyl or haloalkyl group, each of which may have a substituent; and $A_5$ represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent.

(9) The positive resist composition as described in item (1) or (2), wherein the resin (A) contains: at least one of repeating units represented by formula (IA) below; and at least one of repeating units represented by formula (IIA) below:

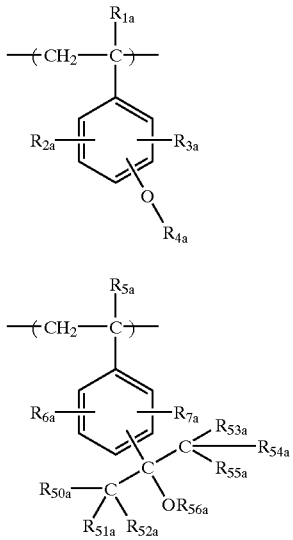

wherein $R_{1a}$ and $R_{5a}$ each represents a hydrogen atom, a halogen atom, a cyano group or an alkyl group which may have a substituent;

$R_{2a}$, $R_{3a}$, $R_{6a}$ and $R_{7a}$ each represents a hydrogen atom, a halogen atom, a cyano group, a hydroxyl group or an alkyl, cycloalkyl, alkoxy, acyl, acyloxy, alkenyl, aryl or aralkyl group, each of which may have a substituent;

$R_{50a}$ to $R_{55a}$ each represents a hydrogen atom, a fluorine atom or an alkyl group which may have a substituent, and at least one of $R_{50a}$ to $R_{55a}$ represents a fluorine atom or an alkyl group where at least one hydrogen atom is substituted by a fluorine atom;

$R_{56a}$ represents a hydrogen atom or an alkyl, cycloalkyl, acyl or alkoxycarbonyl group, each of which may have a substituent;

$R_{4a}$ represents a group represented by formula (IVA) or (VA):

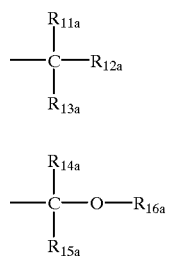

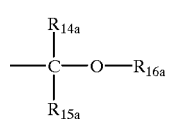

wherein in formula (IVA), $R_{11a}$, $R_{12a}$ and $R_{13a}$ each represents an alkyl, cycloalkyl, alkenyl, aralkyl or aryl group, each of which may have a substituent; and in formula (VA), $R_{14a}$ and $R_{15a}$ each represents a hydrogen atom or an alkyl group which may have a substituent; and $R_{16a}$ represents an alkyl, cycloalkyl, aralkyl or aryl group, each of which may have a substituent, and two of $R_{14a}$ to $R_{16a}$ may combine to form a ring.

(10) The positive resist composition as described in item (1) or (2), wherein the resin (A) contains: at least one of repeating units represented by formula (IIA) below; and at least one of repeating units represented by (VIA) below:

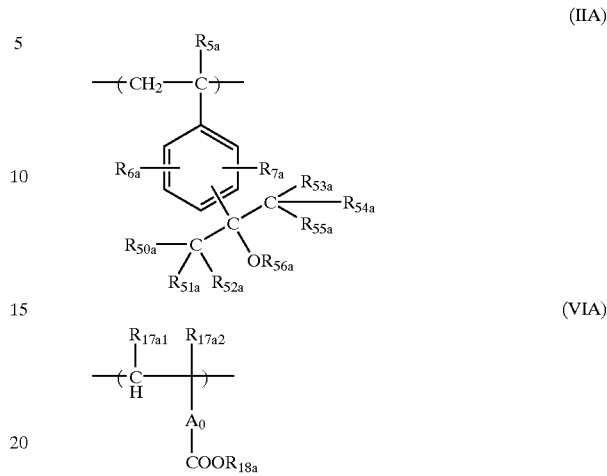

wherein in formula (IIA), $R_{5a}$ represents a hydrogen atom, a halogen atom, a cyano group or an alkyl group which may have a substituent;

$R_{6a}$ and $R_{7a}$ each represents a hydrogen atom, a halogen atom, a cyano group, a hydroxyl, or an alkyl, cycloalkyl, alkoxy, acyl, acyloxy, alkenyl, aryl or aralkyl group, each of which may have a substituent;

$R_{50a}$ to $R_{55a}$ each represents a hydrogen atom, a fluorine atom or an alkyl group which may have a substituent, and at least one of $R_{50a}$ to $R_{55a}$ represents a fluorine atom or an alkyl group where at least one hydrogen atom is substituted by a fluorine atom;

$R_{56a}$ represents a hydrogen atom or an alkyl, cycloalkyl, acyl or alkoxycarbonyl group, each of which may have a substituent;

in formula (VIA), $R_{17a1}$ and $R_{17a2}$ each represents a hydrogen atom, a halogen atom, a cyano group or an alkyl group which may have a substituent;

$R_{18a}$ represents $-C(R_{18a1})(R_{18a2})(R_{18a3})$ or $-C(R_{18a1})(R_{18a2})(OR_{18a4})$ $R_{18a1}$ to $R_{18a4}$ each represents a hydrogen atom or an alkyl, cycloalkyl, alkenyl, aralkyl or aryl group, each of which may have a substituent, and two of $R_{18a1}$, $R_{18a2}$ and $R_{18a3}$ or two of $R_{18a1}$, $R_{18a2}$ and $R_{18a4}$ may combine to form a ring; and $A_0$ represents a single bond or a divalent linking group which may have a substituent.

(11) The positive resist composition as described in item (10), wherein in formula (VIA), $R_{18a}$ is a group represented by formula (VIA-A):

wherein $R_{18a5}$ and $R_{18a6}$ each represents an alkyl group which may have a substituent; and $R_{18a7}$ represents a cycloalkyl group which may have a substituent.

(12) The positive resist composition as described in item (10), wherein in formula (VIA), $R_{18a}$ is a group represented by formula (VIA-B):

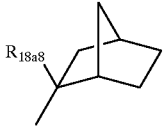

(VIA-B)

wherein $R_{18a8}$ represents an alkyl, alkenyl, alkynyl, aralkyl or aryl group, each of which may have a substituent.

(13) The positive resist composition as described in item (9), wherein at least one of $R_{1a}$ in formula (IA) and $R_{5a}$ in formula (IIA) is a trifluoromethyl group.

(14) The positive resist composition as described in item (10), wherein at least one of $R_{5a}$ in formula (IIA) and $R_{17a2}$ in formula (VIA) is a trifluoromethyl group.

(15) The positive resist composition as described in item (9) or (10), wherein the resin (A) further contains at least one of repeating units represented by formulae (IIIA) and (VIIA):

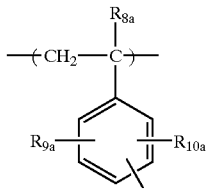

(IIIA)

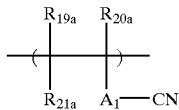

(VIIA)

wherein in formula (IIIA), $R_{8a}$ represents a hydrogen atom, a halogen atom, a cyano group or an alkyl group which may have a substituent; $R_{9a}$ and $R_{10a}$ each represents a hydrogen atom, a halogen atom, a cyano group or an alkyl, cycloalkyl, alkoxy, acyl, acyloxy, alkenyl, aryl or aralkyl group, each of which may have a substituent; and in formula (VIIA), $R_{19a}$ and $R_{20a}$ each represents a hydrogen atom, a halogen atom, a cyano group or an alkyl group which may have a substituent, $R_{21a}$ represents a hydrogen atom, a halogen atom, an alkyl which may have a substituent or -$A_1$-CN group; and $A_1$ represents a single bond or a divalent linking group.

(16) The positive resist composition as described in any one of items (1) to (15), which further comprises a compound containing a basic nitrogen atom.

(17) The positive resist composition as described in any one of items (1) to (16), wherein the compound (B) comprises at least one compound selected from sulfonium salt and iodonium salt compounds capable of generating at least one of acids (i) to (iii) below upon irradiation with one of an actinic ray and radiation:

(i) a perfluoroalkylsulfonic acid having 2 or more carbon atoms;
(ii) a perfluoroarylsulfonic acid; and
(iii) an arylsulfonic acid having a perfluoroalkyl group as a substituent.

(18) The positive resist composition as described in any one of items (1) to 17), which is a composition to be irradiated with an ultraviolet ray having a wave length of 160 nm or less.

(19) The positive resist composition as described in item (18), wherein the ultraviolet ray is $F_2$ excimer laser ray having a wave length of 157 nm.

DETAILED DESCRIPTION OF THE INVENTION

The compounds for use in the present invention are described in detail below.

[1] Fluorine Group-Containing Resin (A) of the Present Invention

The fluorine group-containing resin (A) for use in the present invention is a resin characterized by having on the main chain and/or the side chain of the polymer a structure such that the fluorine atom is substituted, and having a group capable of decomposing under the action of an acid to increase the solubility in an alkali developer. This is preferably a fluorine group-containing resin having on the main chain of the polymer skeleton at least one site selected from a perfluoroalkylene group and a perfluoro-arylene group, or a fluorine group-containing resin having on the side chain of the polymer skeleton at least one site selected from a perfluoroalkyl group, a perfluoroaryl group, a hexafluoro-2-propanol group and a group resulting from protecting the OH group of a hexafluoro-2-propanol group.

To speak specifically, this is a resin having at least one repeating unit represented by formulae (I) to (X), more preferably a fluorine group-containing resin containing an acid-decomposable group having at least one repeating unit represented by formulae (XI) to (XIII).

Also, for controlling the physical properties of the fluorine group-containing resin, such as hydro-philicity/hydrophobicity, glass transition point and transmittance to exposure light or for controlling the polymerizability on the synthesis of polymer, the resin may have at least one repeating unit derived from a vinyl compound containing a maleic anhydride, a vinyl ether or a cyano group, each of which is represented by formula (XV), (XVI) or (XVII).

In formulae, $R_0$ and $R_1$ each represents a hydrogen atom, a fluorine atom or an alkyl, perfluoroalkyl, cycloalkyl or aryl group which may have a substituent.

$R_2$ to $R_4$ each represents an alkyl, perfluoroalkyl, cycloalkyl or aryl group which may have a substituent. Also, each of the pairs $R_0$ and $R_1$, $R_0$ and $R_2$, and $R_3$ and $R_4$ may combine to form a ring.

$R_5$ represents a hydrogen atom or an alkyl, perfluoroalkyl, a monocyclic or polycyclic cycloalkyl, acyl or alkoxycarbonyl group which may have a substituent.

$R_6$, $R_7$ and $R_8$, which may be identical or different, each represents a hydrogen atom, a halogen atom or an alkyl, perfluoroalkyl or alkoxy group which may have a substituent.

$R_9$ and $R_{10}$, which may be identical or different, each represents a hydrogen atom, a halogen atom, a cyano group or an alkyl or haloalkyl group which may have a substituent.

$R_{11}$ and $R_{12}$, which may be identical or different, each represents a hydrogen atom, a hydroxyl group, a halogen atom, a cyano group, an alkoxy group, an acyl group or an alkyl, cycloalkyl, alkenyl, aralkyl or aryl group which may have a substituent.

$R_{13}$ and $R_{14}$, which may be identical or different, each represents a hydrogen atom, a halogen atom, a cyano group or an alkyl or haloalkyl group which may have a substituent.

$R_{15}$ represents an alkyl, monocyclic or polycyclic cycloalkyl, alkenyl, aralkyl or aryl group having a fluorine atom.

$R_{16}$, $R_{17}$ and $R_{18}$, which may be identical or different, each represents a hydrogen atom, a halogen atom, a cyano group, a cyano group or an alkyl, perfluoroalkyl, alkoxy or —CO—O—$R_{15}$ group which may have a substituent.

$R_{19}$, $R_{20}$ and $R_{21}$, which may be identical or different, each represents a hydrogen atom, a fluorine atom or an alkyl, monocyclic or polycyclic cycloalkyl, alkenyl, aralkyl, aryl or alkoxy group having a fluorine atom. However, at least one of $R_{19}$, $R_{20}$ and $R_{21}$ is a group other than a hydrogen atom.

$A_1$ and $A_2$ each represents a single bond, a divalent alkylene, alkenylene, cycloalkylene or arylene group which may have a substituent, —O—CO—$R_{22}$—, —CO—O—$R_{23}$— or —CO—N($R_{24}$)—$R_{25}$—.

$R_{22}$, $R_{23}$ and $R_{25}$, which may be identical or different, each represents a single bond or a divalent alkylene, alkenylene, cycloalkylene or arylene group which may have an ether group, an ester group, an amide group, a urethane group or a ureido group. $R_{24}$ represents a hydrogen atom or an alkyl, cycloalkyl, aralkyl or aryl group which may have a substituent.

$R_{26}$, $R_{27}$ and $R_{32}$, which may be identical or different, each represents a hydrogen atom, a halogen atom, a cyano group or an alkyl or haloalkyl group which may have a substituent.

$R_{28}$ and $R_{33}$ each represents —C($R_{36}$E)($R_{37}$)($R_{38}$), —C($R_{36}$)($R_{37}$)(O$R_{39}$) or a group represented by formula (XIV).

$R_{29}$, $R_{30}$ and $R_{31}$, which may be identical or different, each represents a hydrogen atom, a halogen atom, a cyano group or an alkyl, perfluoroalkyl, alkoxy or —CO—O—$R_{28}$ group which may have a substituent.

$R_{34}$ and $R_{35}$, which may be identical or different, each represents a hydrogen atom, a hydroxyl group, a halogen atom, a cyano group, an alkoxy group, an acyl group or an alkyl, cycloalkyl, alkenyl, aralkyl or aryl group which may have a substituent.

$R_{36}$, $R_{37}$, $R_{38}$ and $R_{39}$, which may be identical or different, each represents an alkyl, cycloalkyl, alkenyl, alkynyl, aralkyl or aryl group which may have a substituent. Two of $R_{36}$, $R_{37}$ and $R_{38}$ or two of $R_{36}$, $R_{37}$ and $R_{39}$ may combine to form a ring. The formed ring may contain an oxo group.

$R_{40}$ represents an alkyl, cycloalkyl, alkenyl, aralkyl or aryl group which may have a substituent.

$A_3$ and $A_4$ each represents a single bond, a divalent alkylene, alkenylene, cycloalkylene or arylene group which may have a substituent, —O—CO—$R_{22}$—, —CO—O—$R_{23}$— or —CO—N($R_{24}$)—$R_{25}$—.

Z represents an atomic group constituting a monocyclic or polycyclic alicyclic group together with the carbon atom.

$R_{41}$ represents an alkyl, cycloalkyl, aralkyl or aryl group which may have a substituent.

$R_{42}$ represents a hydrogen atom, a halogen atom, a cyano group or an alkyl or haloalkyl group which may have a substituent.

$A_5$ represents a single bond, a divalent alkylene, alkenylene, cycloalkylene or arylene group which may have a substituent, —O—CO—$R_{22}$—, —CO—O—$R_{23}$— or —CO—N($R_{24}$)—$R_{25}$—.

n represents 0 or 1, and x, y and z represents an integer of 0 to 4.

More preferred examples of the fluorine group-containing resin (A) for use in the present invention include a resin containing at least one repeating unit represented by formula (IA) and at least one repeating unit represented by formula (IIA), and a resin containing at least one repeating unit represented by formula (IIA) and at least one repeating unit represented by formula (VIA) These fluorine group-containing resins (A) each may further contain at least one repeating unit represented by formula (IIA) or (VIIA). In these fluorine group-containing resins (A), $R_{18a}$ of formula (VIA) is preferably represented by formula (VIA-A) or (VIA-B). Furthermore, in these fluorine group-containing resins (A), at least one of $R_{1a}$ of formula (IA) and $R_{5a}$ of formula (IIA) is preferably a trifluoromethyl group, and at least one of $R_{5a}$ of formula (IIA) and $R_{17a2}$ of formula (VIA) is preferably a trifluoromethyl group.

The fluorine group-containing resin (A) containing at least one repeating unit represented by formula (IA) and at least one repeating unit represented by formula (IIA), and the fluorine group-containing resin (A) containing at least one repeating unit represented by formula (IIA) and at least one repeating unit represented by formula (VIA) each may further contain a repeating unit represented by formulae (I) to (V).

In formulae (IA) and (IIA), $R_{1a}$ and $R_{5a}$ may be identical or different and each represents a hydrogen atom, a halogen atom, a cyano group or an alkyl group which may have a substituent. $R_{2a}$, $R_{3a}$, $R_{6a}$ and $R_{7a}$ may be identical or different and each represents a hydrogen atom, a halogen atom, a cyano group, a hydroxyl group or an alkyl, cycloalkyl, alkoxy, acyl, acyloxy, alkenyl, aryl or aralkyl group which may have a substituent. $R_{50a}$ to $R_{55a}$ may be identical or different and each represents a hydrogen atom, a fluorine atom or an alkyl group which may have a substituent. However, at least one of $R_{50a}$ to $R_{55a}$ represents a fluorine atom or an alkyl group where at least one hydrogen atom is substituted by a fluorine atom. $R_{56a}$ represents a hydrogen atom or an alkyl, cycloalkyl, acyl or alkoxycarbonyl group which may have a substituent, preferably a hydrogen atom. $R_{4a}$ represents a group represented by formula (IVA) or (VA).

In formula (IVA), $R_{11a}$, $R_{12a}$ and $R_{13a}$ may be identical or different and each represents an alkyl, cycloalkyl, alkenyl, aralkyl or aryl group which may have a substituent.

In formula (VA), $R_{14a}$ and $R_{15a}$ may be identical or different and each represents a hydrogen atom or an alkyl group which may have a substituent. $R_{16a}$ represents an alkyl, cycloalkyl, aralkyl or aryl group which may have a substituent. Two of $R_{14a}$ to $R_{16a}$ may combine to form a ring.

In formula (VIA), $R_{17a1}$ and $R_{17a2}$ may be identical or different and each represents a hydrogen atom, a halogen atom, a cyano group or an alkyl group which may have a substituent. $R_{18a}$ represents —C($R_{18a1}$)($R_{18a2}$)($R_{18a3}$) or —C($R_{18a1}$)($R_{18a2}$)(O$R_{18a4}$). $R_{18a1}$ to $R_{18a4}$ may be identical or different and each represents a hydrogen atom or an alkyl, cycloalkyl, alkenyl, aralkyl or aryl group which may have a substituent. Two of $R_{18a1}$, $R_{18a2}$ and $R_{18a3}$ or two of $R_{18a1}$, $R_{18a2}$ and $R_{18a4}$ may combine to form a ring. $A_0$ represents a single bond or a divalent linking group which may have a substituent, preferably a single bond.

In formula (VIA-A), $R_{18a5}$ and $R_{18a6}$ may be identical or different and each represents an alkyl group which may have a substituent. $R_{18a7}$ represents a cycloalkyl group which may have a substituent.

In formula (VIA-B), $R_{18a8}$ represents an alkyl, alkenyl, alkynyl, aralkyl or aryl group which may have a substituent.

In formula (IIIA), $R_{8a}$ represents a hydrogen atom, a halogen atom, a cyano group or an alkyl group which may have a substituent. $R_{9a}$ and $R_{10a}$ may be identical or different and each represents a hydrogen atom, a halogen atom, a cyano group or an alkyl, cycloalkyl, alkoxy, acyl, acyloxy, alkenyl, aryl or aralkyl group which may have a substituent.

In formula (VIIA), $R_{19a}$ and $R_{20a}$ may be identical or different and each represents a hydrogen atom, a halogen atom, a cyano group or an alkyl group which may have a substituent. $R_{21a}$ represents a hydrogen atom, a halogen atom, an alkyl group which may have a substituent or an -$A_1$-CN group. $A_1$ represents a single bond or a divalent linking group.

The alkyl group is, for example, an alkyl group having from 1 to 8 carbon atoms and specific preferred examples thereof include a methyl group, an ethyl group, a propyl group, an n-butyl group, a sec-butyl group, a hexyl group, a 2-ethylhexyl group and an octyl group.

The cycloalkyl group may be monocyclic or polycyclic. The monocyclic cycloalkyl group is a cycloalkyl group having from 3 to 8 carbon atoms and preferred examples thereof include a cyclopropyl group, a cyclopentyl group, a cyclohexyl group, a cycloheptyl group and a cyclooctyl group. The polycyclic cycloalkyl group is a cycloalkyl group having from 6 to 20 carbon atoms and preferred examples thereof include an adamantyl group, a norbornyl group, an isoboronyl group, a camphanyl group, a dicyclopentyl group, an a-pinel group, a tricyclodecanyl group, a tetracyclododecyl group and an androstanyl group. However, in the monocyclic or polycyclic alkyl group, the carbon atom may be substituted by a hetero atom such as oxygen atom.

The perfluoroalkyl group is, for example, a perfluoroalkyl group having from 4 to 12 carbon atoms and specific preferred examples thereof include a perfluorobutyl group, a perfluorohexyl group, a perfluorooctyl group, a perfluorooctylethyl group and a perfluorododecyl group.

The haloalkyl group is, for example, a haloalkyl group having from 1 to 4 carbon atoms and specific preferred examples thereof include a chloromethyl group, a chloroethyl group, a chloropropyl group, a chlorobutyl group, a boromomethyl group and a bromoethyl group.

The aryl group is, for example, an aryl group having from 6 to 15 carbon atoms and specific preferred examples thereof include a phenyl group, a tolyl group, a dimethylphenyl group, a 2,4,6-trimethylphenyl group, a naphthyl group, an anthryl group and a 9,10-dimethoxyanthryl group.

The aralkyl group is, for example, an aralkyl group having from 7 to 12 carbon atoms and specific preferred examples thereof include a benzyl group, a phenethyl group and a naphthylmethyl group.

The alkenyl group is, for example, an alkenyl group having from 2 to 8 carbon atoms and specific preferred examples thereof include a vinyl group, an allyl group, a butenyl group and a cyclohexenyl group.

The alkoxy group is, for example, an alkoxy group having from 1 to 8 carbon atoms and specific preferred examples thereof include a methoxy group, an ethoxy group, an n-propoxy group, an iso-propoxy group, a butoxy group, a pentoxy group, an allyloxy group and an octoxy group.

The acyl group is, for example, an acyl group having from 1 to 10 carbon atoms and specific preferred examples thereof include a formyl group, an acetyl group, a propanoyl group, a butanoyl group, a pivaloyl group, an octanoyl group and a benzoyl group.

The acyloxy group is preferably an acyloxy group having from 2 to 12 carbon atoms and examples thereof include an acetoxy group, a propionyloxy group and a benzoyloxy group.

The alkynyl group is preferably an alkynyl group having from 2 to 5 carbon atoms and examples thereof include an ethynyl group, a propynyl group and a butynyl group.

Examples of the alkoxycarbonyl group include an i-propoxycarbonyl group, a tert-butoxycarbonyl group, a tert-amyloxycarbonyl group and a 1-methyl-1-cyclohexyloxy-carbonyl group. The alkoxycarbonyl group is preferably a secondary alkoxycarbonyl group, more preferably a tertiary alkoxycarbonyl group.

Examples of the halogen atom include a fluorine atom, a chlorine atom, a bromine atom and an iodine atom.

The alkylene group is preferably an alkylene group having from 1 to 8 carbon atoms, such as methylene group, ethylene group, propylene group, butylene group, hexylene group and octylene group, which may have a substituent.

The alkenylene group is preferably an alkenylene group having from 2 to 6 carbon atoms, such as ethenylene group, propenylene group and butenylene group, which may have a substituent.

The cycloalkylene group is preferably a cycloalkylene group having from 5 to 8 carbon atoms, such as cyclopentylene group and cyclohexylene group, which may have a substituent.

The arylene group is preferably an arylene group having from 6 to 15 carbon atoms, such as phenylene group, tolylene group and naphthylene group, which may have a substituent.

The divalent linking group is a divalent alkylene, cycloalkylene, alkenylene or arylene group which may have a substituent, —O—CO—$R_{22a}$, —CO—O—$R_{23a}$— or —CO—N($R_{24a}$)—$R_{25a}$—(wherein $R_{22a}$, $R_{23a}$ and $R_{25a}$, which may be identical or different, each represents a single bond or a divalent alkylene, alkenylene, cycloalkylene or arylene group which may have an ether group, an ester group, an amido group, a urethane group or a ureido group, and $R_{24a}$ represents a hydrogen atom or an alkyl, cycloalkyl, aralkyl or aryl group which may have a substituent).

The ring formed resulting from $R_0$ and $R_1$, $R_0$ and $R_2$, or $R_3$ and $R_4$ combining with each other is, for example, a 5-, 6- or 7-membered ring and specific examples thereof include a pentane ring, a hexane ring, a furan ring, a dioxonol ring and a 1,3-dioxolan ring, which are each substituted by fluorine.

The ring formed resulting from two of $R_{36}$ to $R_{38}$ or two of $R_{36}$ to $R_{37}$ and $R_{39}$ combining with each other is, for example, a 3-, 4-, 5-, 6-, 7- or 8-membered ring and specific preferred examples thereof include a cyclopropane ring, a cyclopentane ring, a cyclohexane ring, a furan ring and a pyran ring.

The ring formed resulting from two of $R_{14a}$ to $R_{16a}$, two of $R_{18a1}$ to $R_{18a3}$, or two of $R_{18a1}$, $R_{18a2}$ and $R_{18a4}$ combining with each other is preferably a 3-, 4-, 5-, 6-, 7- or 8-membered ring and examples thereof include a cyclopropane ring, a cyclopentane ring, a cyclohexane ring, a tetramethylene oxide ring, a pentamethylene oxide ring, a hexamethylene oxide ring, a furan ring, a pyran ring, a dioxonol ring and a 1,3-dioxolan ring.

Z represents an atomic group constituting a monocyclic or polycyclic alicyclic group. In the case of a monocyclic group, the formed alicyclic group is an alicyclic group having from 3 to 8 carbon atoms and preferred examples thereof include a cyclopropyl group, a cyclopentyl group, a cyclohexyl group, a cycloheptyl group and a cyclooctyl group. In the case of a polycyclic group, the formed alicyclic group is an alicyclic group having from 6 to 20 carbon atoms and preferred examples thereof include an adamantyl group, a norbornyl group, an isoboronyl group, a camphanyl group, a dicyclopentyl group, an a-pinel group, a tricyclodecanyl group, a tetracyclododecyl group and an androstanyl group.

Examples of the substituent substituted to these groups include substituents having active hydrogen, such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

Examples of the alkyl group, the cycloalkyl group and the aryl group include those described above, but the alkyl group may further be substituted by a fluorine atom or a cycloalkyl group.

Examples of the group capable of decomposing under the action of an acid to show alkali solubility, contained in the fluorine group-containing resin for use in the present invention, include —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$) and —COO—C($R_{36}$)($R_{37}$)(O$R_{39}$) (wherein $R_{36}$ to $R_{39}$ have the same meanings as above, and $R_{01}$ and $R_{02}$ each represents a hydrogen atom or the above-described alkyl, cycloalkyl, alkenyl, aralkyl or aryl group which may have a substituent.

Specific preferred examples thereof include an ether or ester group of a tertiary alkyl group such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group, an acetal or acetal ester group such as 1-alkoxy-1-ethoxy group and tetrahydropyranyl group, a tert-alkylcarbonate group and a tert-alkylcarbonylmethoxy group.

The total content of the repeating units represented by formulae (I) to (X) is generally from 10 to 80 mol %, preferably from 30 to 70 mol %, more preferably from 35 to 65 mol %, in the entire polymer composition.

The content of the repeating unit represented by formulae (XI) to (XIII) is generally from 0 to 70 mol %, preferably from 10 to 60 mol %, more preferably from 20 to 50 mol %, in the entire polymer composition.

The content of the repeating unit represented by formulae (XV) to (XVII) is generally from 0 to 70 mol %, preferably from 10 to 60 mol %, more preferably from 20 to 50 mol %.

The resin (A) for use in the present invention more preferably has at least one repeating unit represented by formulae (I) to (III) and at least one repeating unit represented by formulae (IV) to (VI).

Similarly to the above, the resin (A) for use in the present invention more preferably has at least one repeating unit represented by formulae (IV) to (VI) and at least one repeating unit represented by formulae (VIII) to (X).

Furthermore, similarly to the above, the resin (A) for use in the present invention more preferably has at least one repeating unit represented by formulae (IV) to (VII) and at least one repeating unit represented by formulae (XV) to (XVII).

By containing the repeating units as such, the resin can be sufficiently elevated in the transmittance at 157 nm and suppressed in the reduction of the dry etching resistance.

In the case where the resin (A) for use in the present invention has at least one repeating unit represented by formulae (I) to (III) and at least one repeating unit represented by formulae (IV) to (VI), the total content of the repeating units represented by formulae (I) to (III) used in the entire polymer composition is generally from 0 to 70 mol %, preferably from 10 to 60 mol %, more preferably from 20 to 50 mol %.

The total content of the repeating units represented by formulae (IV) to (VI) used in the entire polymer composition is generally from 10 to 80 mol %, preferably from 30 to 70 mol %, more preferably from 35 to 65 mol %.

In the case where the resin (A) for use in the present invention has at least one repeating unit represented by formulae (IV) to (VI) and at least one repeating unit represented by formulae (VIII) to (X), the total content of the repeating units represented by formulae (IV) to (VI) used in the entire polymer composition is generally from 10 to 80 mol %, preferably from 30 to 70 mol %, more preferably from 35 to 65 mol %.

The total content of the repeating units represented by formulae (VIII) to (X) used in the entire polymer composition is generally from 0 to 70 mol %, preferably from 10 to 60 mol %, more preferably from 20 to 50 mol %.

In the case where the resin (A) for use in the present invention has at least one repeating unit represented by formulae (IV) to (VII) and at least one repeating unit represented by formulae (XV) to (XVII), the total content of the repeating units represented by formulae (IV) to (VII) used in the entire polymer composition is generally from 10 to 80 mol %, preferably from 30 to 70 mol %, more preferably from 35 to 65 mol %.

The total content of the repeating units represented by formulae (XV) to (XVII) used in the entire polymer composition is generally from 0 to 70 mol %, preferably from 10 to 60 mol %, more preferably from 20 to 50 mol %.

In the fluorine-containing resin (A) having at least one repeating unit represented by formula (IA) and at least one repeating unit represented by formula (IIA), the content of the repeating unit represented by formula (IA) is generally from 5 to 80 mol %, preferably from 10 to 75 mol %, more preferably from 20 to 70 mol %.

In the fluorine-containing resin (A) having at least one repeating unit represented by formula (IA) and at least one repeating unit represented by formula (IIA), the content of the repeating unit represented by formula (IIA) is generally from 5 to 80 mol %, preferably from 10 to 70 mol %, more preferably from 20 to 65 mol %.

In the fluorine-containing resin (A) having at least one repeating unit represented by formula (IA) and at least one repeating unit represented by formula (VIA), the content of the repeating unit represented by formula (IIA) is generally from 5 to 80 mol %, preferably from 10 to 70 mol %, more preferably from 20 to 65 mol %.

In the fluorine-containing resin (A) having at least one repeating unit represented by formula (IIA) and at least one repeating unit represented by formula (VIA), the content of the repeating unit represented by formula (VIA) is generally from 5 to 80 mol %, preferably from 10 to 70 mol %, more preferably from 20 to 65 mol %.

In these fluorine-containing resin (A), the content of the repeating unit represented by formula (IIIA) is generally from 1 to 40 mol %, preferably from 3 to 35 mol %, more preferably from 5 to 30 mol %.

In these fluorine-containing resin (A), the content of the repeating unit represented by formula (VIIA) is generally from 1 to 40 mol %, preferably from 3 to 35 mol %, more preferably from 5 to 30 mol %.

In the resin (A) for use in the present invention, in addition to the above-described repeating structural units, another polymerizable monomer may also be copolymerized so as to improve the performance of the positive resist of the present invention.

Examples of the copolymerizable monomer which can be used include compounds having one addition-polymerizable unsaturated bond, selected from acrylic acid esters other than those described above, acrylamides, methacrylic acid esters, methacrylamides, allyl compounds, vinyl ethers, vinyl esters, styrenes and crotonic acid esters.

Specific examples thereof include acrylic acid esters such as alkyl (the alkyl group is preferably an alkyl group having from 1 to 10 carbon atoms) acrylate (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate) and aryl acrylate (e.g., phenyl acrylate);

methacrylic acid esters such as alkyl (the alkyl group is preferably an alkyl group having from 1 to 10 carbon atoms) methacrylate (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, cresyl methacrylate, naphthyl methacrylate);

acrylamides such as acrylamide, N-alkylacrylamide (the alkyl group is an alkyl group having from 1 to 10 carbon atoms, such as methyl group, ethyl group, propyl group, butyl group, tert-butyl group, heptyl group, octyl group, cyclohexyl group, benzyl group and hydroxyethyl group), N-arylacrylamide (the aryl group is, for example, a phenyl group, a tolyl group, a nitrophenyl group, a naphthyl group, a cyanophenyl group, a hydroxyphenyl group or a carboxyphenyl group), N,N-dialkylacrylamide (the alkyl group is an alkyl group having from 1 to 10 carbon atoms, such as methyl group, ethyl group, butyl group, isobutyl group, ethylhexyl group and cyclohexyl group), N,N-diarylacrylamide (the aryl group is, for example, a phenyl group), N-methyl-N-phenylacrylamide, N-hydroxyethyl-N-methylacrylamide and N-2-acetamidoethyl-N-acetylacrylamide;

methacrylamides such as methacrylamide, N-alkylmethacrylamide (the alkyl group is an alkyl group having from 1 to 10 carbon atoms, such as methyl group, ethyl group, tert-butyl group, ethylhexyl group, hydroxyethyl group and cyclohexyl group), N-arylmethacrylamide (the aryl group is, for example, a phenyl group), N,N-dialkylmethacrylamide (the alkyl group is, for example, an ethyl group, a propyl group or a butyl group), N,N-diarylmethacrylamide (the aryl group is, for example, a phenyl group) and N-hydroxyethyl-N-methylmethacrylamide; allyl compounds such as allyl ester (e.g., allyl acetate, allyl caproate, allyl caprate, allyl laurate, allyl palmitate, allyl stearate, allyl benzoate, allyl acetoacetate, allyl lactate) and allyloxy ethanol;

vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and vinyl aryl ether (e.g., vinyl phenyl ether, vinyl tolyl ether, vinyl chlorophenyl ether, vinyl-2,4-dichlorophenyl ether, vinyl naphthyl ether, vinyl anthranyl ether);

vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinylchlorohexyl carboxylate, vinyl benzoate, vinyl salicylate, vinyl chlorobenzoate, vinyl tetrachlorobenzoate and vinyl naphthoate;

styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrene (e.g., methoxystyrene, 4-methoxy-3-methylstyrene, dimethoxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), carboxystyrene and vinyl naphthalene; and crotonic acid esters such as alkyl crotonate (e.g., butyl crotonate, hexyl crotonate, glycerin monocrotonate); dialkyl itaconates (e.g., dimethyl itaconate, diethyl itaconate, dibutyl itaconate); dialkyl esters of maleic acid or fumaric acid (e.g., dimethyl maleate, dibutyl fumarate), maleic anhydride, maleimide, acrylonitrile, methacrylonitrile and maleylonitrile. In addition, addition-polymerizable unsaturated compounds which can be copolymerized in general may be used.

Specific examples of the repeating structural units represented by formulae (I) to (X) are set forth below, however, the present invention is not limited thereto.

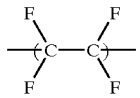

(F-1)

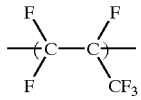

(F-2)

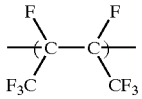

(F-3)

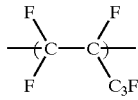

(F-4)

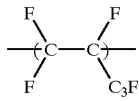

(F-5)

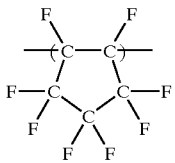

(F-6)

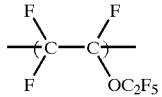

(F-7)

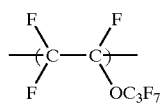 (F-8)
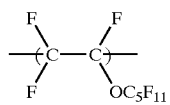 (F-9)
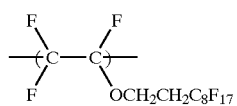 (F-10)
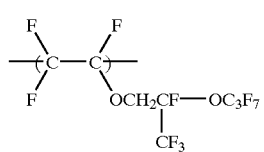 (F-11)
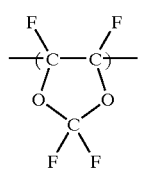 (F-12)
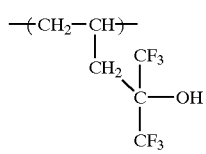 (F-13)
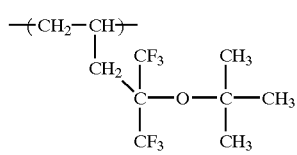 (F-14)
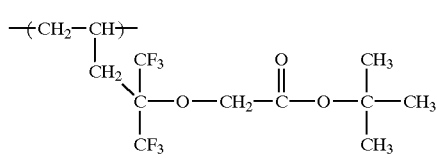 (F-15)
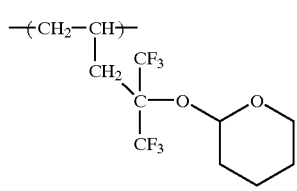 (F-16)
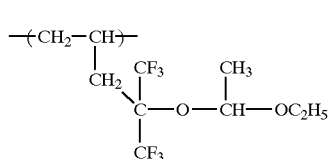 (F-17)
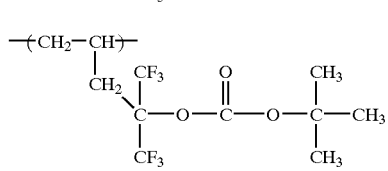 (F-18)
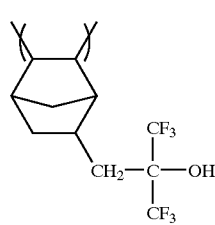 (F-19)
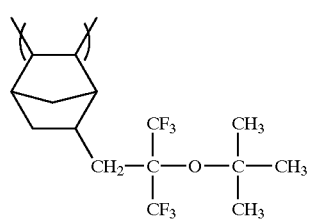 (F-20)
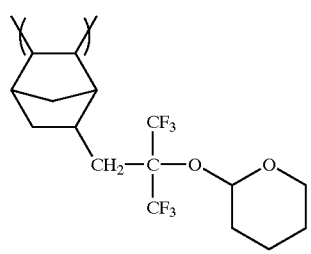 (F-21)
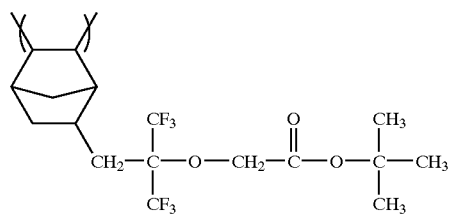 (F-22)
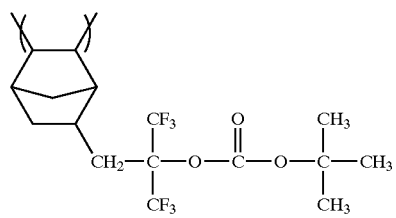 (F-23)
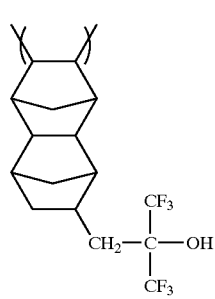 (F-24)

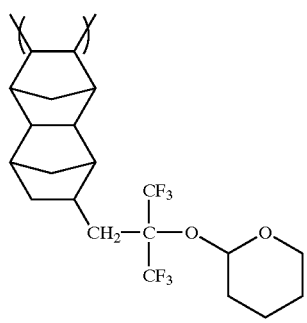
(F-25)
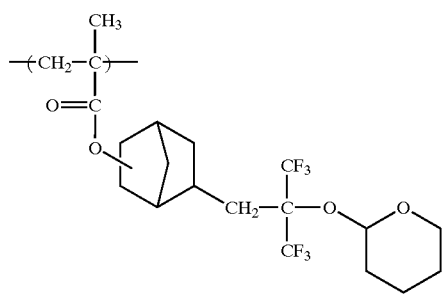
(F-30)
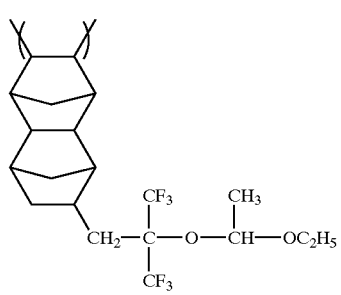
(F-26)
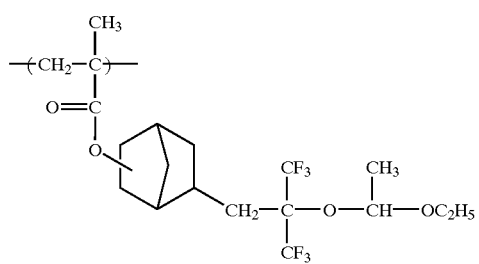
(F-31)
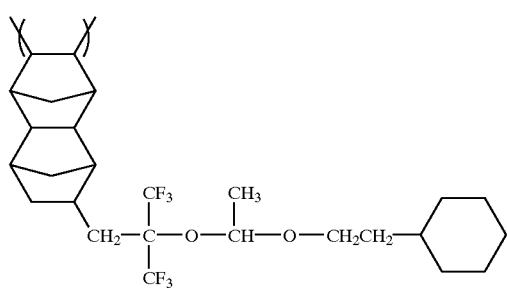
(F-27)
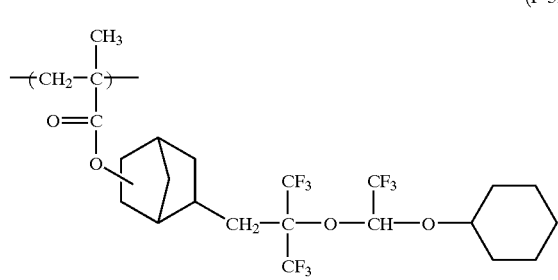
(F-32)
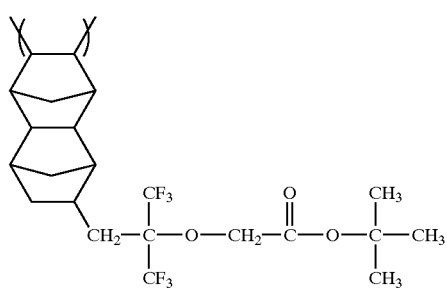
(F-28)
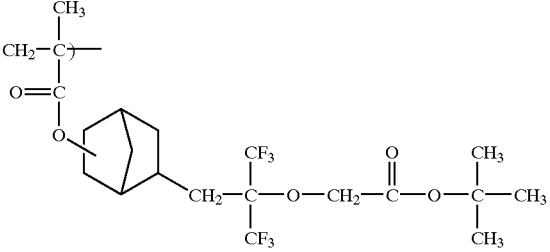
(F-33)
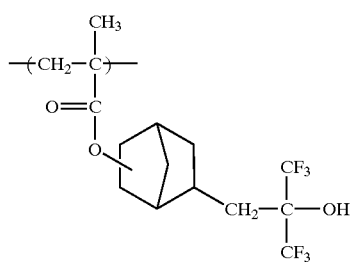
(F-29)
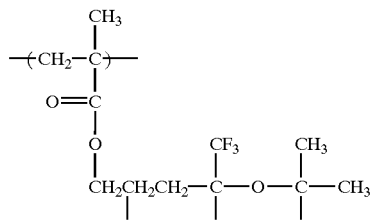
(F-34)

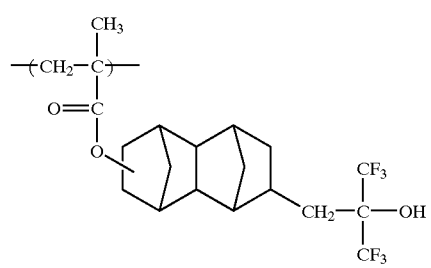 (F-35)
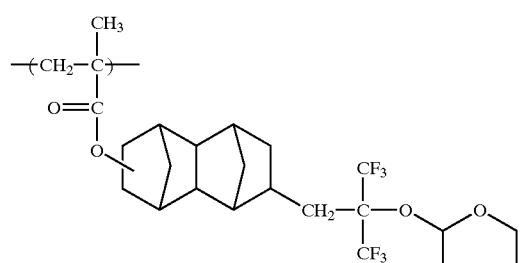 (F-36)
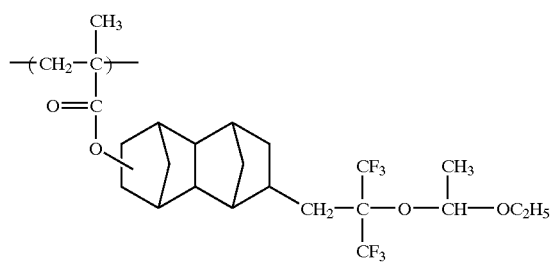 (F-37)
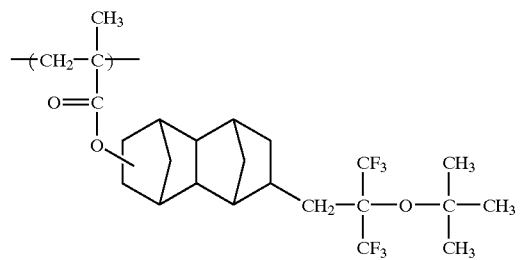 (F-38)
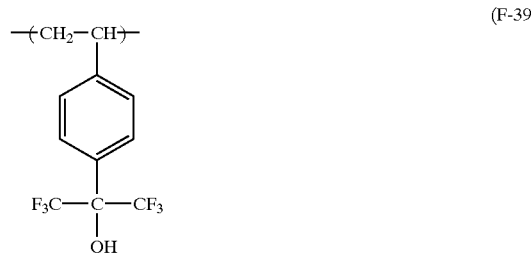 (F-39)
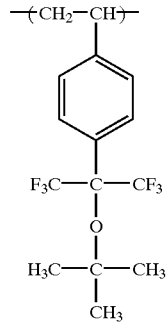 (F-40)
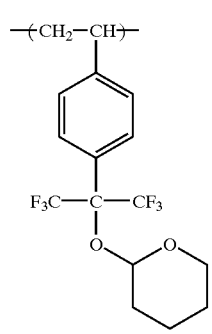 (F-41)
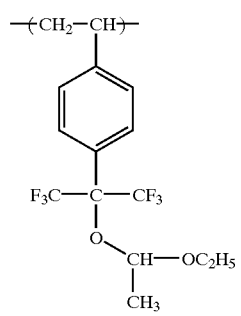 (F-42)
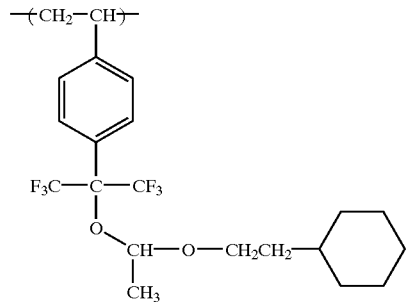 (F-43)
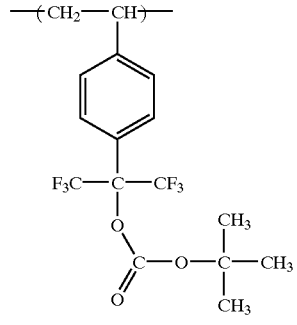 (F-44)

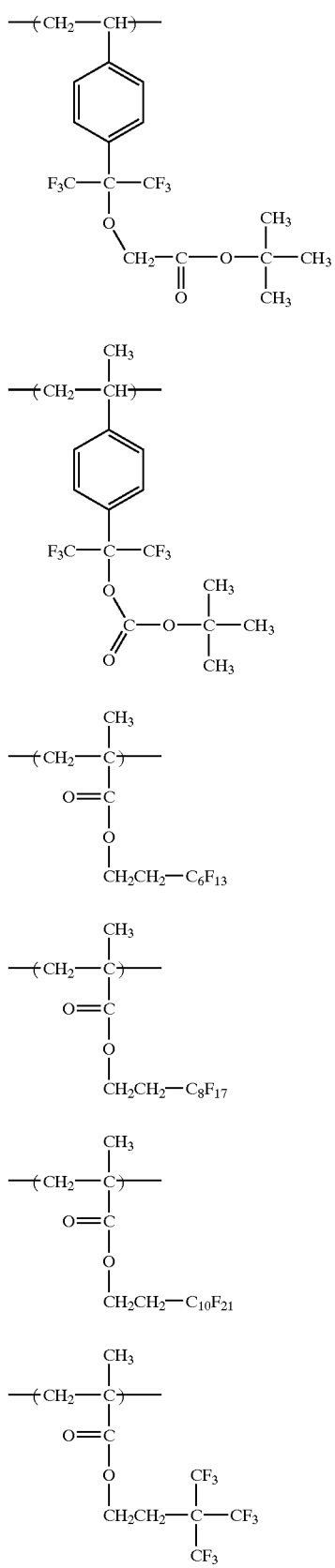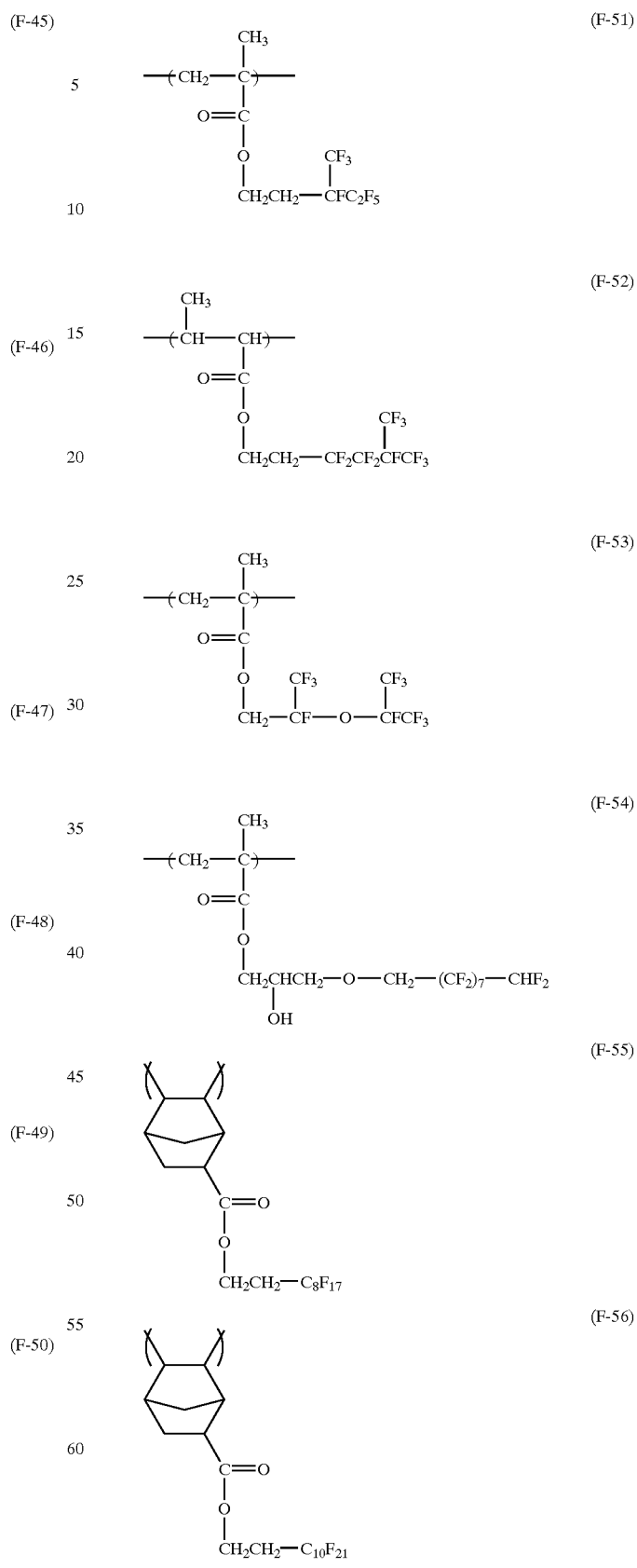

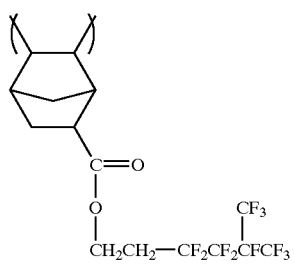
(F-57)
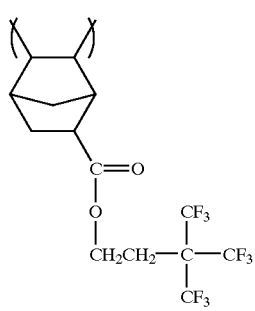
(F-58)
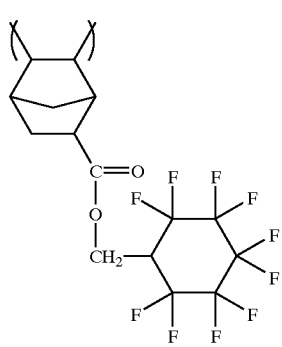
(F-59)
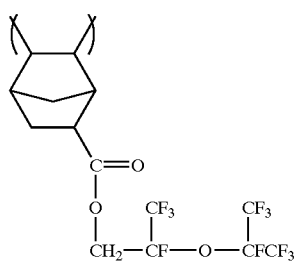
(F-60)
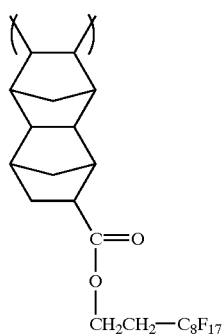
(F-61)
(F-62)
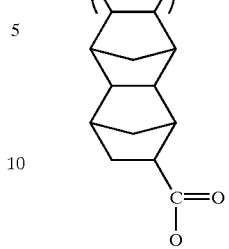
(F-63)
n = 8
(F-64)
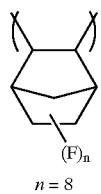
(F-65)
Specific examples of the repeating structural units represented by formulae (XI) to (XIII) are set forth below, however, the present invention is not limited thereto.
(B-1)
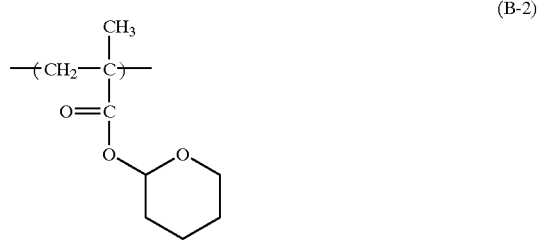
(B-2)

(B-3) 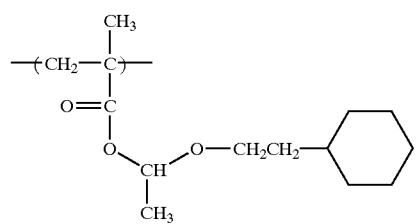
(B-4) 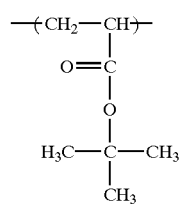
(B-5) 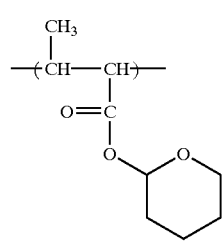
(B-6) 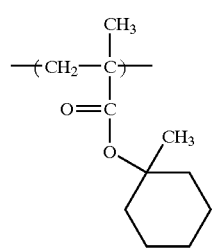
(B-7) 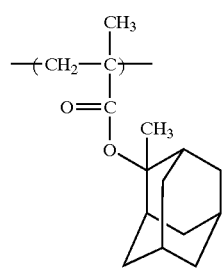
(B-8) 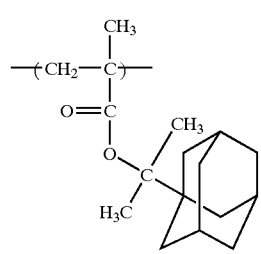
(B-9) 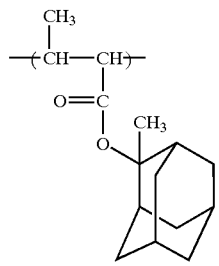
(B-10) 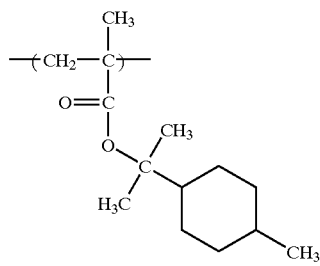
(B-11) 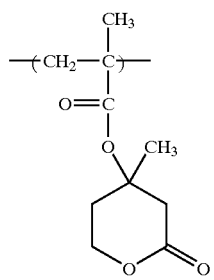
(B-12) 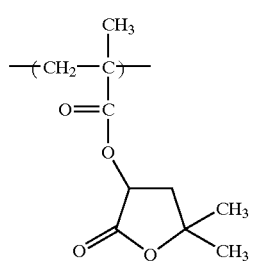
(B-13) 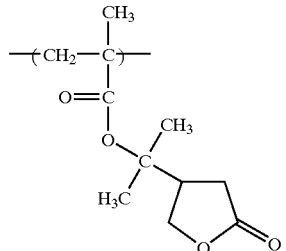
(B-14) 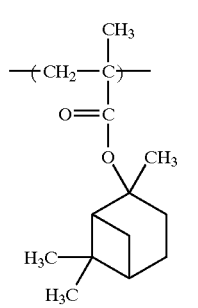

(B-15) 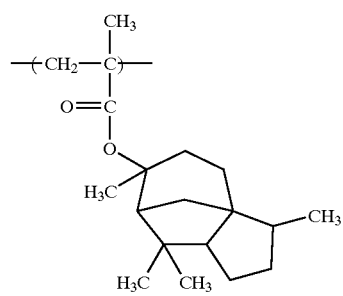
(B-16) 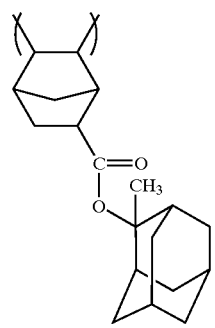
(B-17) 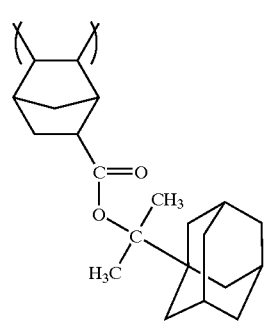
(B-18) 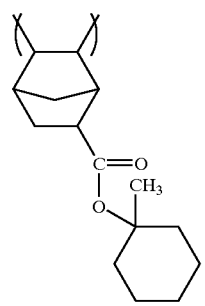
(B-19) 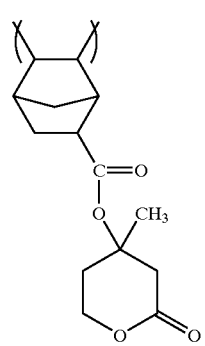
(B-20) 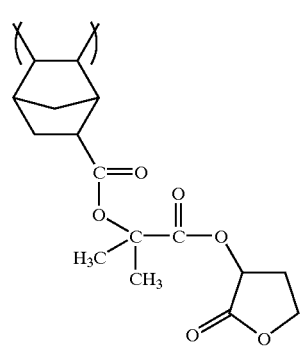
(B-21)
(B-22)
(B-23)
(B-24)

(B-25) 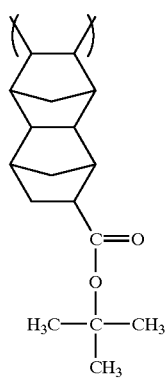
(B-26) 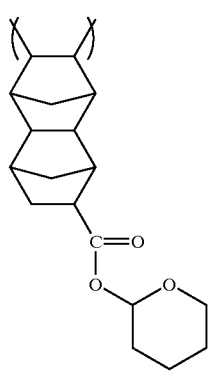
(B-27) 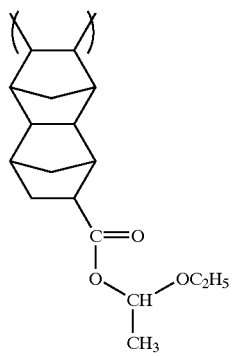
(B-28) 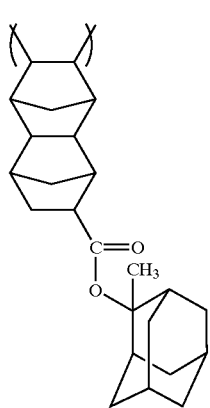
(B-29) 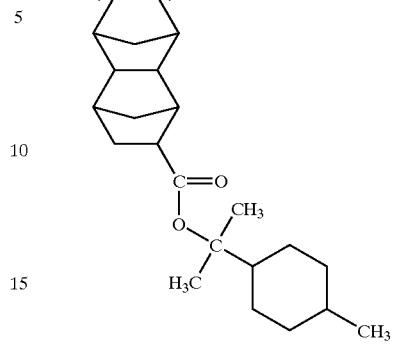
(B-30) 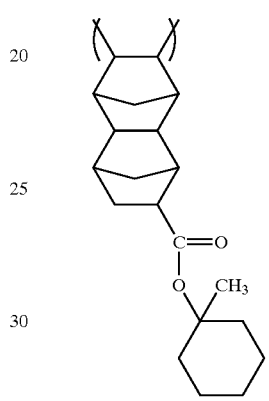
(B-31) 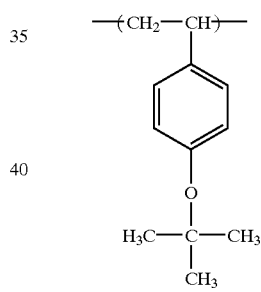
(B-32) 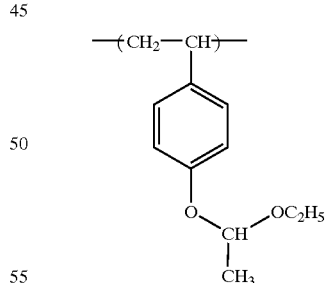
(B-33) 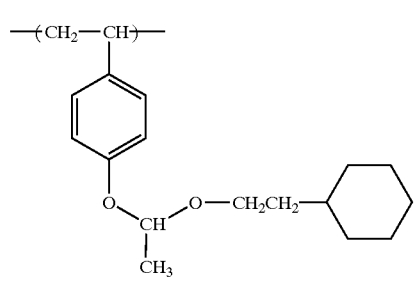

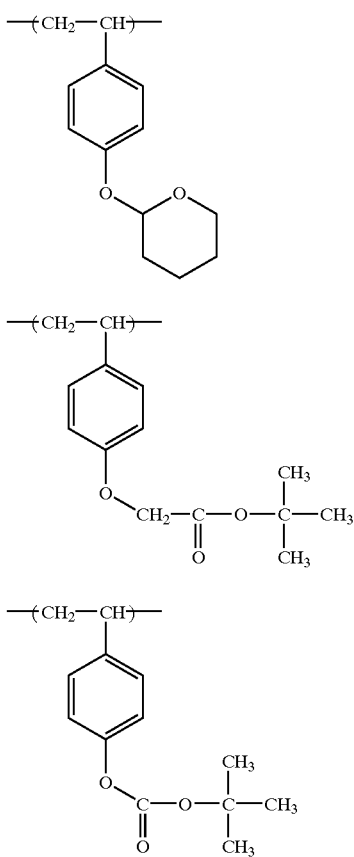
Specific examples of the repeating structural units represented by formulae (XVI) to (XVII) are set forth below, however, the present invention is not limited thereto.
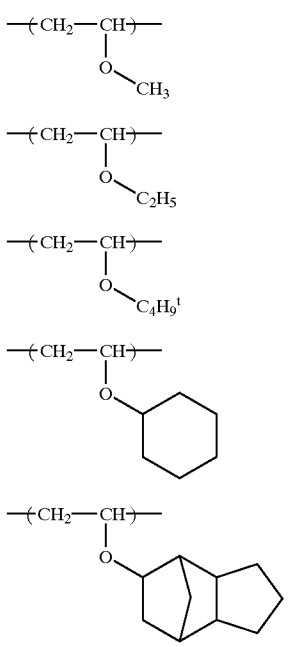
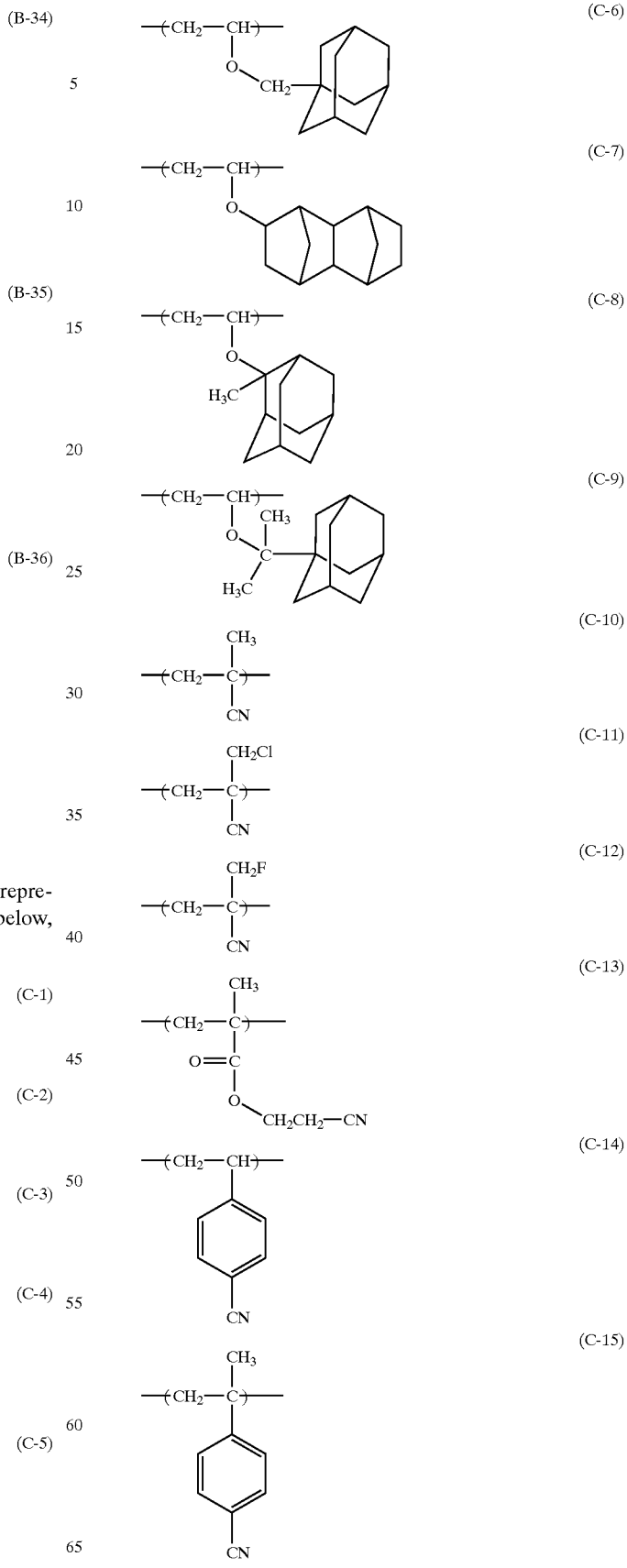

Specific examples of the repeating structural unit represented by formula (IA) are set forth below, however, the present invention is not limited thereto.
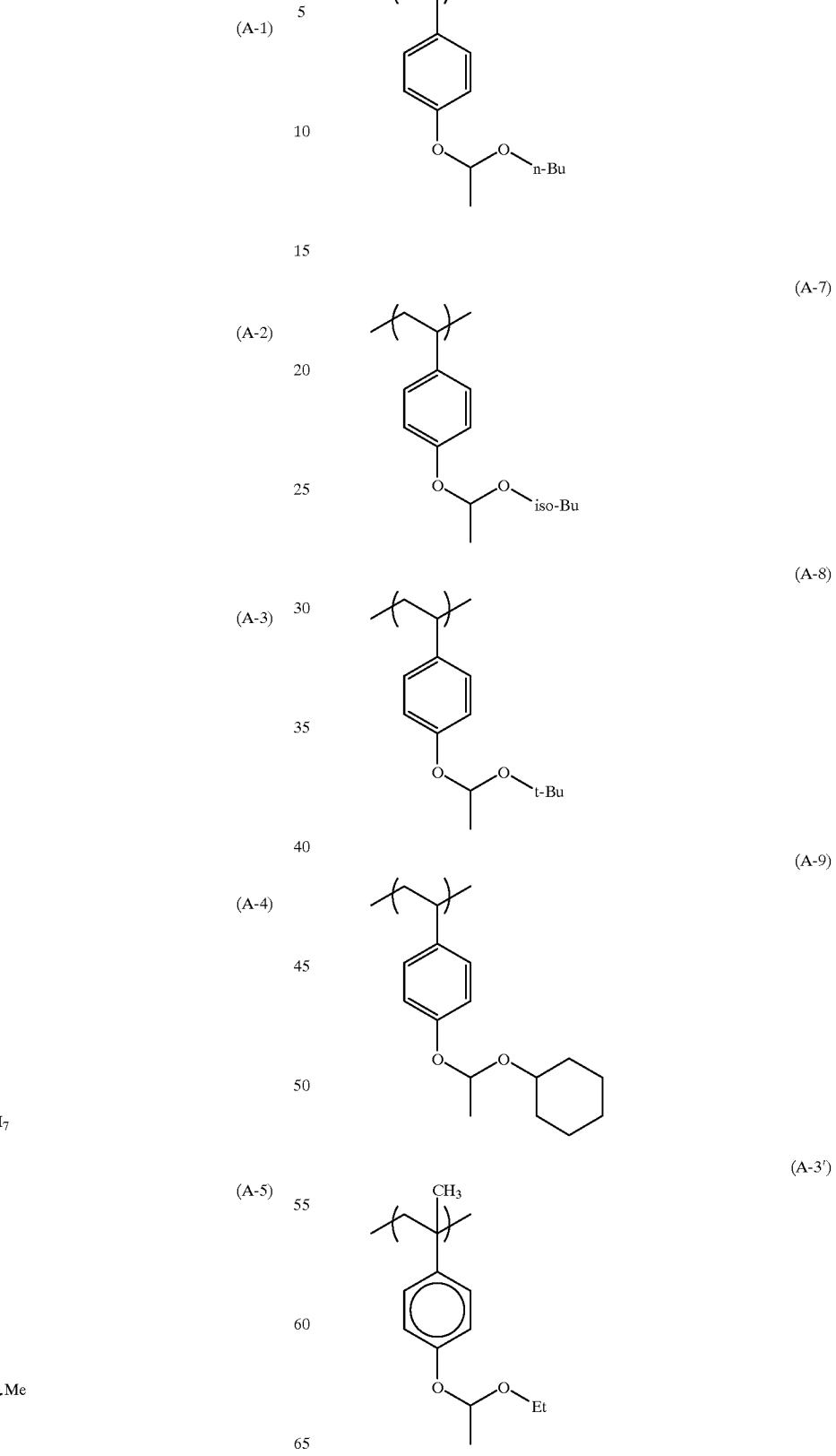

(A-3″)
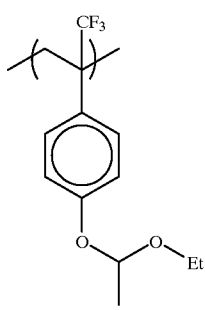
(A-10)
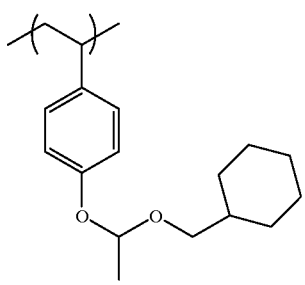
(A-11)
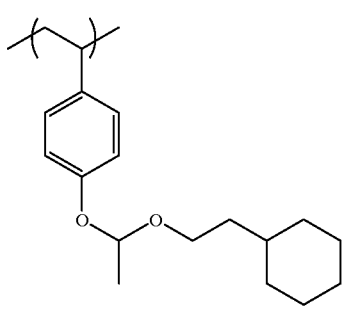
(A-12)
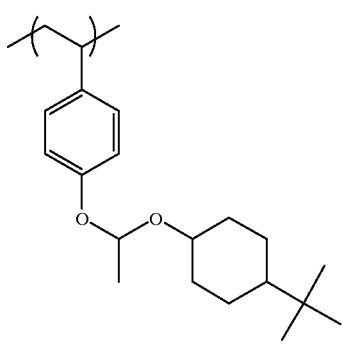
(A-13)
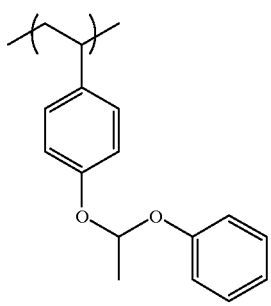
(A-14)
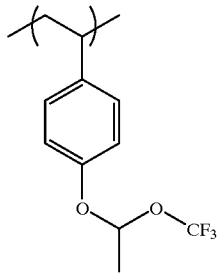
(A-15)
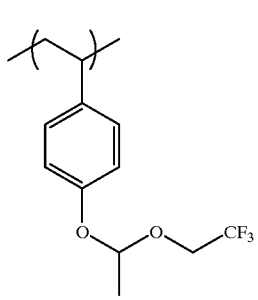
(A-16)
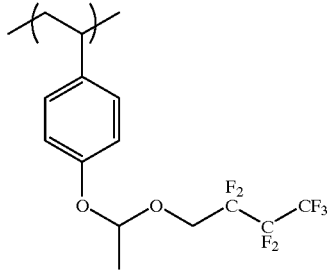
(A-17)
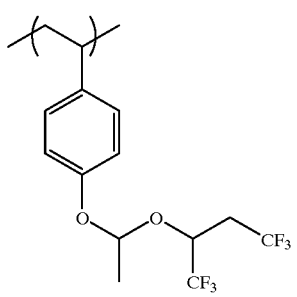
(A-18)
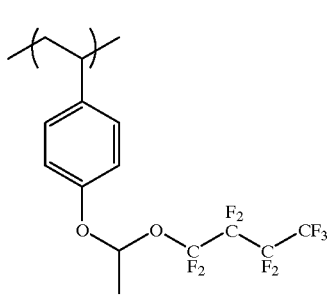

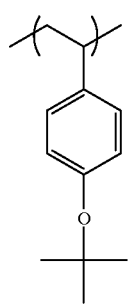 (A-19)
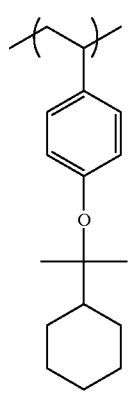 (A-20)
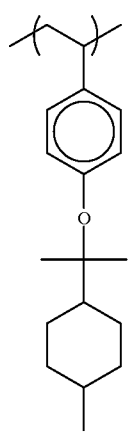 (A-20')
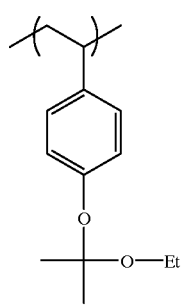 (A-24)
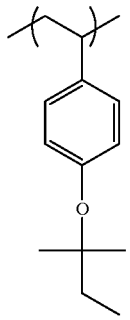 (A-25)
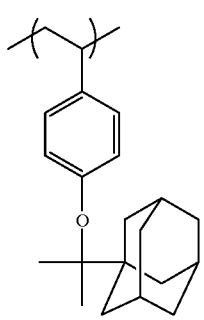 (A-26)
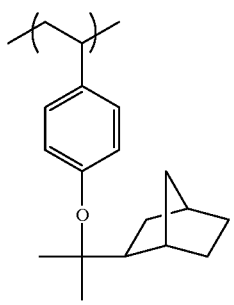 (A-27)
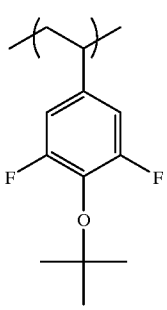 (A-28)
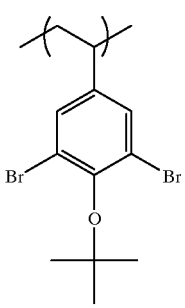 (A-29)

(A-30)
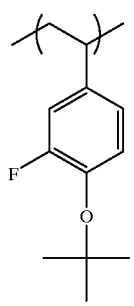
(A-31)
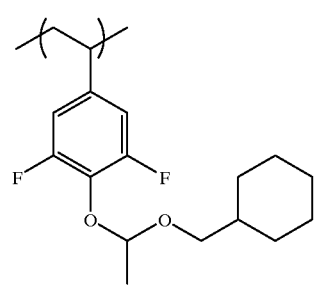
(A-32)
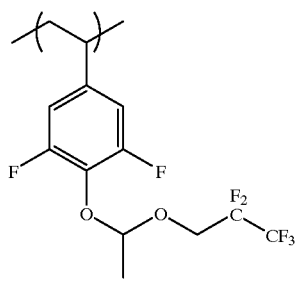
(A-33)
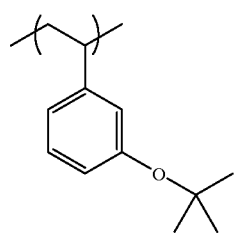
(A-34)
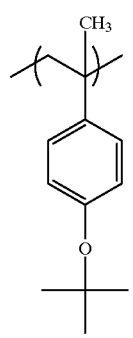
(A-35)
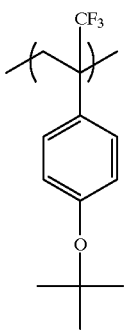
(A-37)
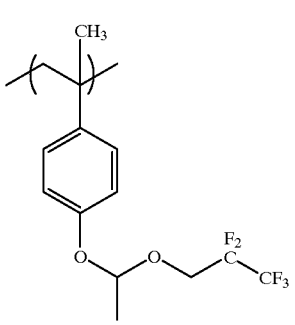
(A-38)
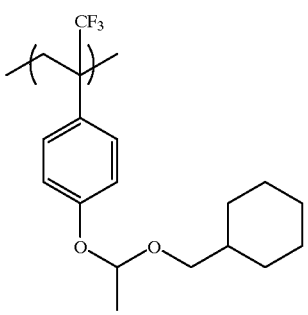
(A-39)
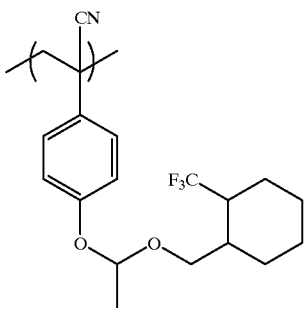
Specific examples of the repeating structural unit represented by formula (IIA) are set forth below, however, the present invention is not limited thereto.

(II-1)
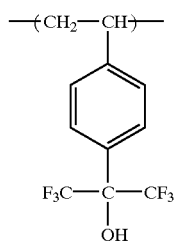
(II-2)
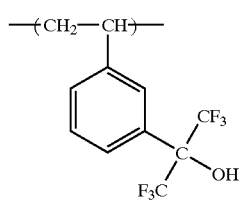
(II-1')
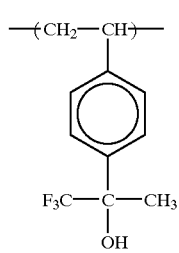
(II-1")
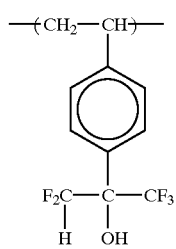
(II-1''')
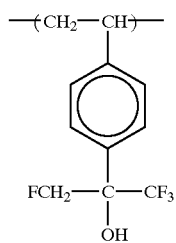
(II-3)
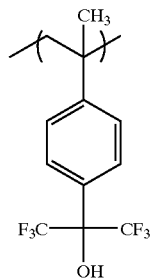
(II-4)
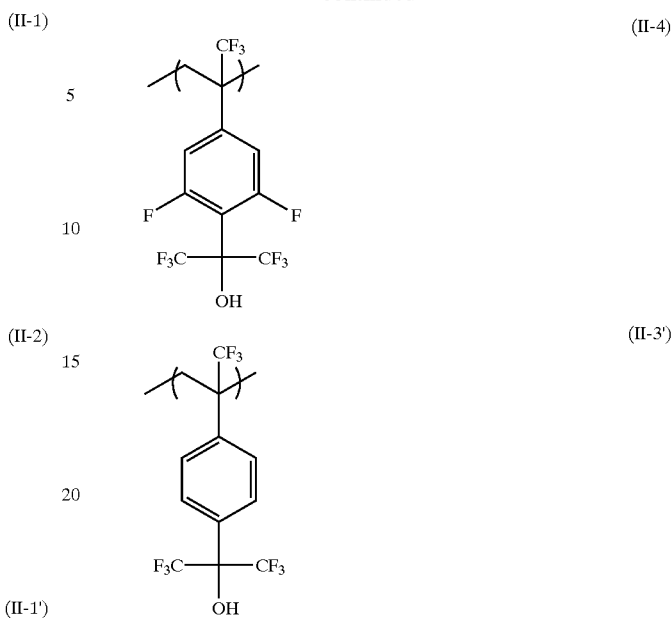
(II-3')
In addition, specific examples of the repeating unit represented by formula (IIA) include (F-40) to (F-45) shown above.
Specific examples of the repeating structural unit represented by formula (VIA) are set forth below, however, the present invention is not limited thereto.
(B-1)
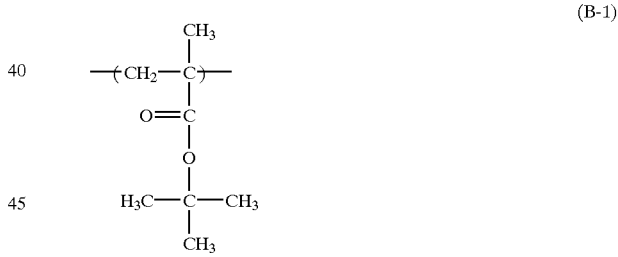
(B-2)
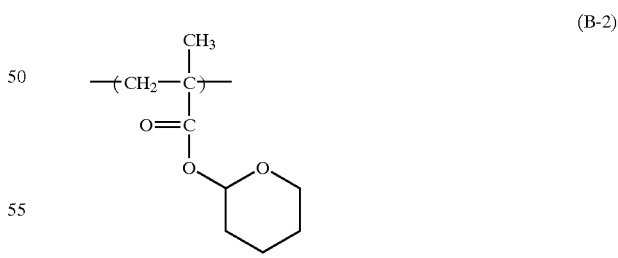
(B-3)
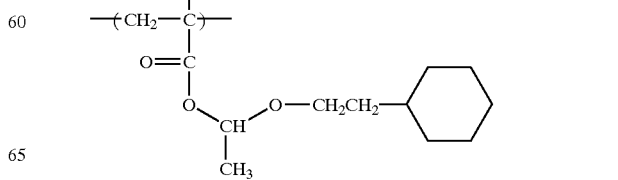

-continued
(B-4) 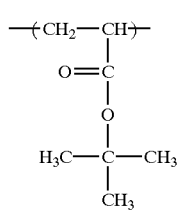
(B-5) 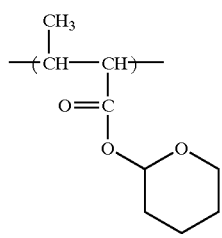
(B-6) 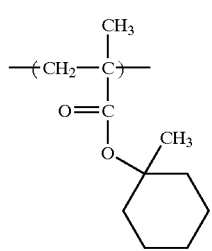
(B-7) 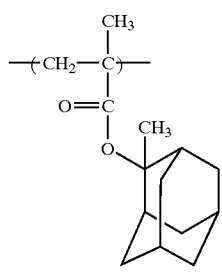
(B-8) 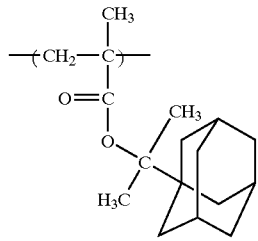
(B-9) 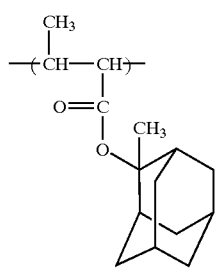
-continued
(B-10) 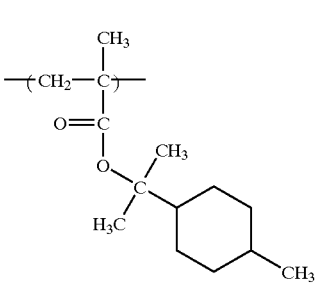
(B-11) 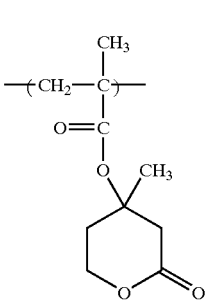
(B-12) 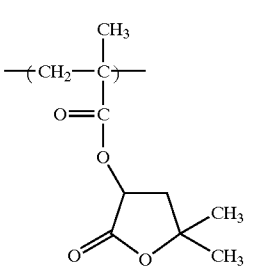
(B-13) 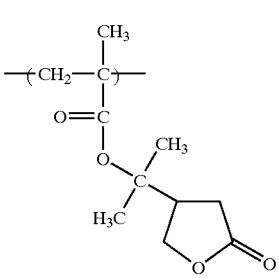
(B-14) 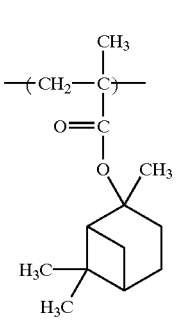

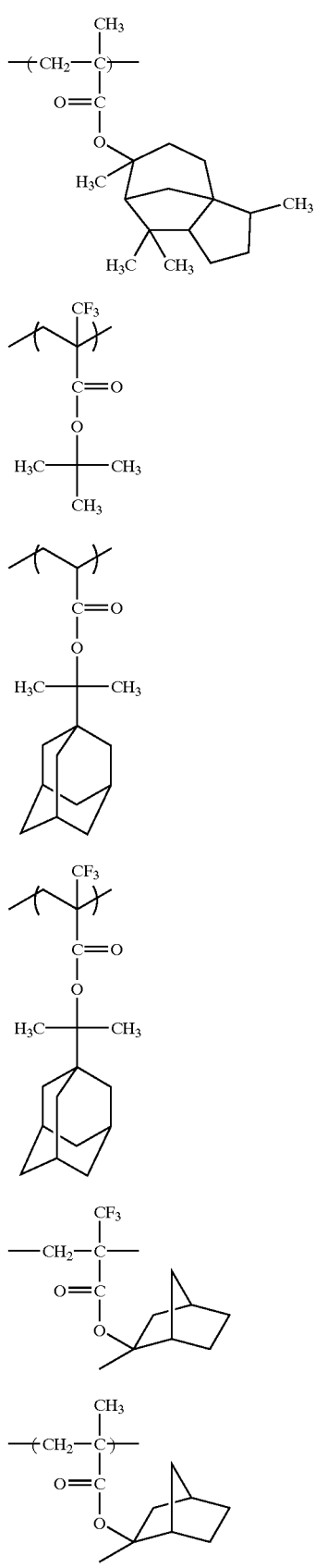
(B-15)
(B-1')
(B-8')
(B-8")
(B-12')
(B-12")
In addition, specific examples of the repeating structural unit represented by formula (VIA) include (F-29) to (F-38) and (F-47) to (F-54) shown above.
Specific examples of the repeating structural unit represented by formula (IIIA) are set forth below, however, the present invention is not limited thereto.
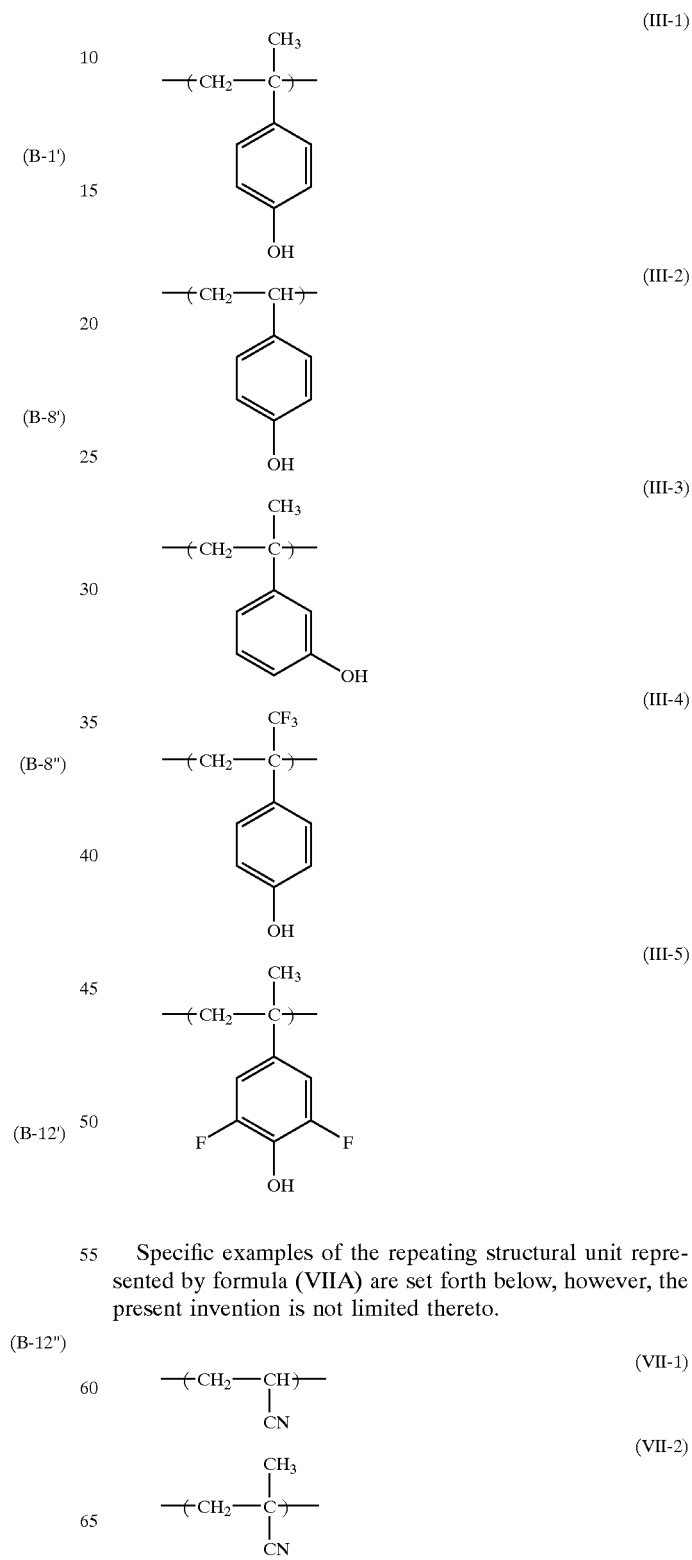

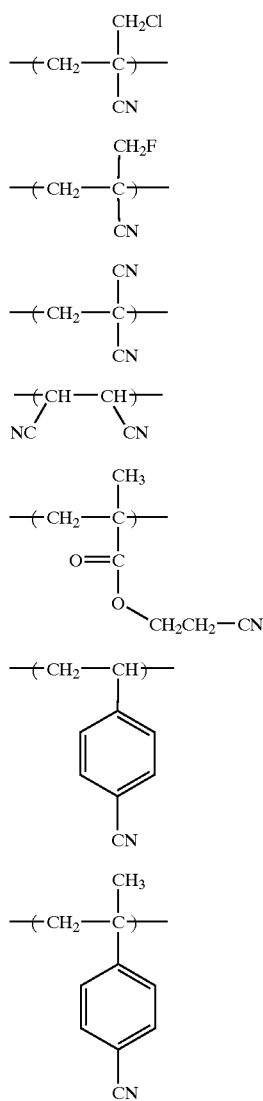

These specific examples of the repeating structural units may be used individually or as a mixture of a plurality of those units.

The resin (A) having the above-described repeating structural units preferably has a weight average molecular weight of 1,000 to 200,000, more preferably from 3,000 to 20,000. The molecular weight distribution is from 1 to 10, preferably from 1 to 3, more preferably from 1 to 2. As the molecular weight distribution is narrower, the resolution is higher, the resist shape is excellent, the side wall of the resist pattern is smoother and the roughness property is superior.

The amount added of the resin (A) for use in the present invention is, based on the solid content of the composition, generally from 50 to 99.5% by weight, preferably from 60 to 98% by weight, more preferably from 65 to 95% by weight.

[2] Compound (B) Capable of Generating Acid Upon Irradiation with Actinic Rays or Radiation of the Present Invention Examples of the compound capable of decomposing upon irradiation with actinic rays or radiation to generate an acid, which is used in the present invention, include a photoinitiator for photocationic polymerization, a photoinitiator for photoradical polymerization, a photo-decoloring agent for dyes, a photo-discoloring agent and a compound capable of generating an acid upon irradiation with known light used for microresist and the like (for example, ultraviolet or far ultraviolet ray of 200 to 400 nm, preferably g line, h line, i line and a KrF excimer laser ray) or with an ArF excimer laser ray, an electron beam, an X ray, a molecular beam or an ion beam. The compound may be appropriately selected from these and a combination thereof.

Other examples of the compound capable of generating an acid upon irradiation with actinic rays or radiation for use in the present invention include onium salts such as diazonium salts described in S. I. Schlesinger, $Photoqr.$ $Sci.$ $Eng.$, 18, 387 (1974), T. S. Bal et al., $Polymer$, 21, 423 (1980), etc., ammonium salts described in U.S. Pat. Nos. 4,069,055, 4,069,056 and Re27,992, JP-A-3-140140 (the term "JP-A" as used herein means an "unexamined published Japanese patent application"), etc., phosphonium salts described in D. C. Necker et al., $Macromolecules,$ 17, 2468 (1984), C. S. Wen et al., $Teh,$ $Proc.$ $Conf.$ $Rad.$ $Curing$ $ASIA$, p. 478, Tokyo, October (1988), U.S. Pat. Nos. 4,069,055 and 4,069,056, etc., iodonium salts described in J. V. Crivello et al., $Macromolecules,$ 10 (6) 1307 (1977), $Chem.$ $\&$ $Eng.$ $News$, November 28, p. 31 (1988), European Patents 104,143, 339,049 and 410,201, JP-A-2-150848, JP-A-2-296514, etc., sulfonium salts described in J. V. Crivello et al., $Polymer$ $J.,$ 17, 73 (1985), J. V. Crivello et al., $J.$ $Org.$ $Chem.,$ 43, 3055 (1978), W. R. Watt et al., $J.$ $Polymer$ $Sci.,$ $Polymer$ $Chem.$ $Ed.,$ 22, 1789 (1984), J. V. Crivello et al., $Polymer$ $Bull.,$ 14, 279 (1985), J. V. Crivello et al., $Macromolecules,$ 14 (5), 1141 (1981), J. V. Crivello et al., $J.$ $Polymer$ $Sci.,$ $Polymer$ $Chem.$ $Ed.,$ 17, 2877 (1979), European Patents 370,693, 161,811, 410,201, 339,049, 233,567, 297,443 and 297,442, U.S. Pat. Nos. 4,933,377, 3,902,114, 4,760,013, 4,734,444 and 2,833,827, German Patent 2,904,626, 3,604,580 and 3,604,581, etc., selenonium salts described in J. V. Crivello et al., $Macromolecules,$ 10 (6), 1307 (1977), J. V. Crivello et al., $J.$ $Polymer$ $Sci.,$ $Polymer$ $Chem.$ $Ed.,$ 17, 1047 (1979), etc., and arsonium salts described in C. S. Wen et al., $Teh,$ $Proc.$ $Conf.$ $Rad.$ $Curing$ $ASIA$, p. 478, Tokyo, October (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., $J.$ $Rad.$ $Curing,$ 13 (4), 26 (1986), T. P. Gill et al., $Inorg.$ $Chem.,$ 19, 3007 (1980), D. Astruc, $Acc.$ $Chem.$ $Res.,$ 19 (12), 377 (1896), JP-A-2-161445, etc.; photo-acid generators having an O-nitrobenzyl type protective group described in S. Hayase et al., $J.$ $Polymer$ $Sci.,$ 25, 753 (1987), E. Reichmanis et al., $J.$ $Polymer$ $Sci.,$ $Polymer$ $Chem.$ $Ed.,$ 23, 1 (1985), Q. Q. Zhu et al., $J.$ $Photochem.,$ 36, 85, 39, 317 (1987), B. Amit et al., $Tetrahedron$ $Lett.$, (24) 2205 (1973), D. H. R. Barton et al., $J.$ $Chem.$ $Soc.,$ 3571 (1965), P. M. Collins et al., $J.$ $Chem.$ $Soc.$, Perkin I, 1695 (1975), M. Rudinstein et al., $Tetrahedron$ $Lett.$, (17), 1445 (1975), J. W. Walker et al., $J.$ $Am.$ $Chem.$ $Soc.,$ 110, 7170 (1988), S. C. Busman et al., $J.$ $Imaging$ $Technol.,$ 11 (4), 191 (1985), H. M. Houlihan et al., $Macromolecules,$ 21, 2001 (1988), P. M. Collins et al., $J.$ $Chem.$ $Soc.,$ $Chem.$ $Commun.,$ 532 (1972), S. Hayase et al., $Macromolecules,$ 18, 1799 (1985), E. Reichmanis et al., $J.$ $Electrochem.$ $Soc.,$ $Solid$ $State$ $Sci.$ $Technol.,$ 130 (6), F. M. Houlihan et al., $Macromolecules,$ 21, 2001 (1988), European Patents 0,290,750, 046,083, 156,535, 271,851 and 0,388, 343, U.S. Pat. Nos. 3,901,710 and 4,181,531, JP-A-60-

198538, JP-A-53-133022, etc.; compounds which are photochemically decomposed to generate a sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199,672, 84,515, 044,115, 618,564 and 0,101,122, U.S. Pat. Nos. 4,371,605 and 4,431,774, JP-A-64-18143, JP-A-2-245756, JP-A-3-140109, etc.; and disulfone compounds described in JP-A-61-166544.

In addition, compounds in which the above-described group or compound capable of generating an acid upon irradiation with actinic rays or radiation is introduced into the main chain or side chain of a polymer may also be used and examples thereof include the compounds described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, the compounds capable of generating an acid upon irradiation with light, described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, European Patent 126,712, etc. may also be used.

Among these compounds capable of decomposing upon irradiation with actinic rays or radiation to generate an acid, particularly effective compounds are described belows.

(1) Oxazole derivative represented by the following formula (PAG1) and S-triazine derivative represented by formula (PAG2), which are each substituted by trihalomethyl group:

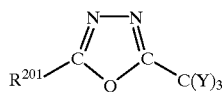
(PAG1)

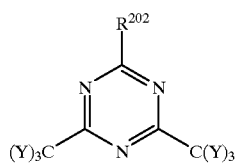
(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or —C(Y)$_3$, and Y represents a chlorine atom or a bromine atom.

Specific examples thereof include the following compounds, however, the present invention is not limited thereto.

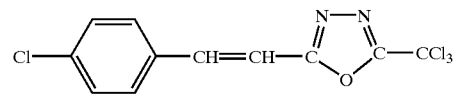
(PAG1-1)

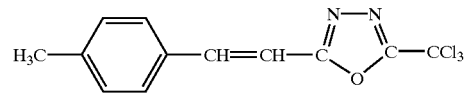
(PAG1-2)

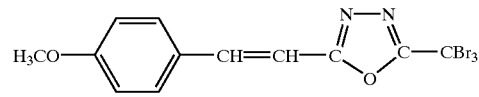
(PAG1-3)

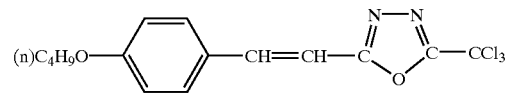
(PAG1-4)

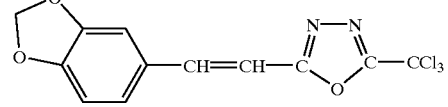
(PAG1-5)

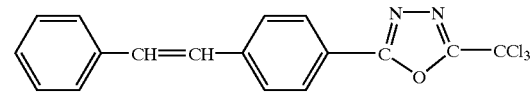
(PAG1-6)

(PAG1-7)

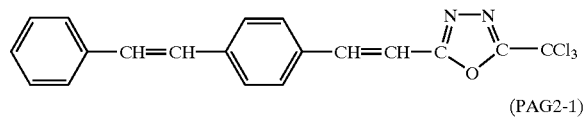
(PAG1-8)

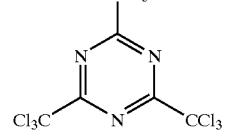
(PAG2-1)

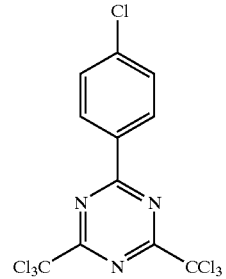
(PAG2-2)

(PAG2-3)
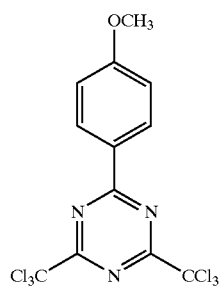
(PAG2-4)
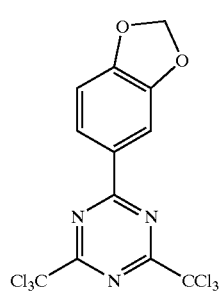
(PAG2-5)
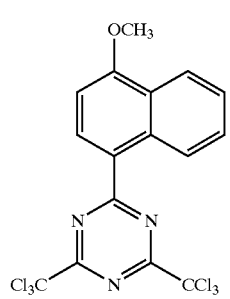
(PAG2-6)
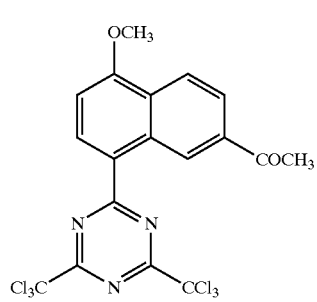
(PAG2-7)
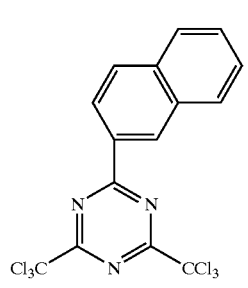
(PAG2-8)
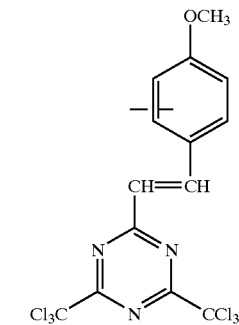
(PAG2-9)
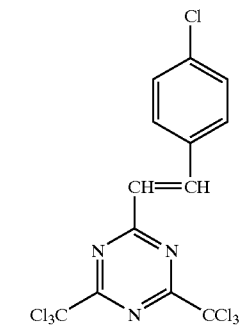
(PAG2-10)
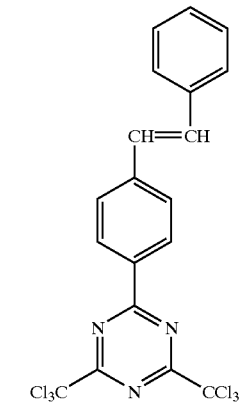
(2) Iodonium salt represented by the following formula (PAG3) and sulfonium salt represented by formula (PAG4):
(PAG3)
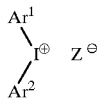
(PAG4)
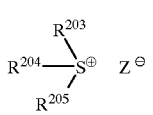

In formula (PAG3), $Ar^1$ and $Ar^2$ each independently represents a substituted or unsubstituted aryl group. The substituent is preferably an alkyl group, a haloalkyl group, a cycloalkyl group, an aryl group, an alkoxy group, a nitro group, a carboxyl group, an alkoxycarbonyl group, a hydroxy group, a mercapto group or a halogen atom.

In formula (PAG4), $R^{203}$, $R^{204}$ and $R^{205}$ each independently represents a substituted or unsubstituted alkyl group or a substituted or unsubstituted aryl group, and preferably an aryl group having from 6 to 14 carbon atoms, an alkyl group having from 1 to 8 carbon atoms or a substituted derivative thereof. The substituent of the aryl group is preferably an alkoxy group having from 1 to 8 carbon atoms, an alkyl group having from 1 to 8 carbon atoms, a cycloalkyl group, a nitro group, a carboxyl group, a mercapto group, a hydroxy group or a halogen atom, and the substituent of the alkyl group is preferably an alkoxy group having from 1 to 8 carbon atoms, a carboxyl group or an alkoxycarbonyl group.

In formulae (PAG3) and (PAG4), $Z^-$ represents an anion and specific examples thereof include alkyl sulfonate anion, cycloalkyl sulfonate anion, perfluoroalkyl sulfonate anion and aryl sulfonate anion (e.g., benzenesulfonate anion, naphthalene sulfonate anion and anthracene sulfonate, which may have a substituent).

Two of $R^{203}$, $R^{204}$ and $R^{205}$, or $Ar^1$ and $Ar^2$ may be combined through a single bond or a substituent.

Specific examples thereof include the following compounds, however, the present invention is not limited thereto.

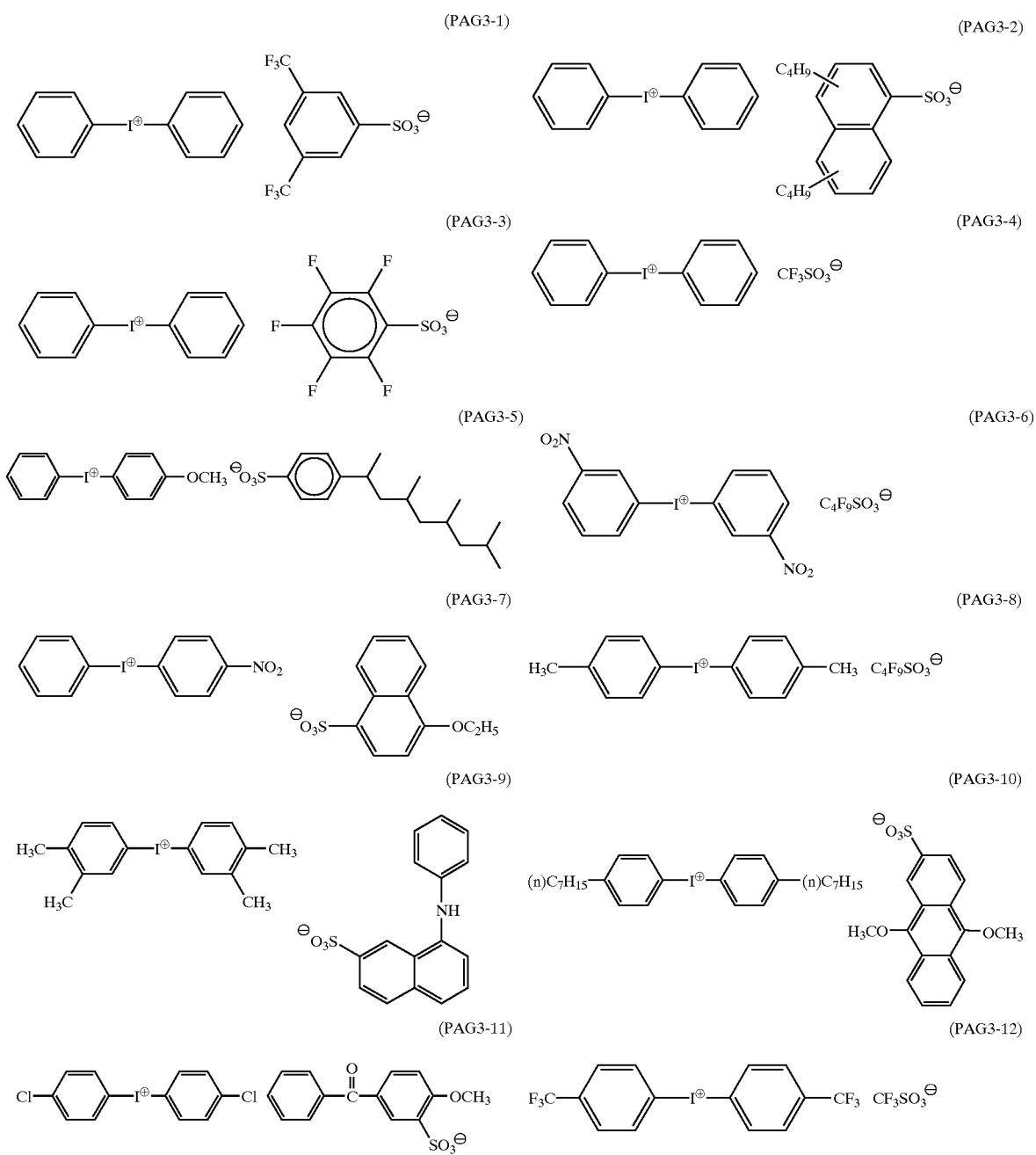

-continued
(PAG3-13)
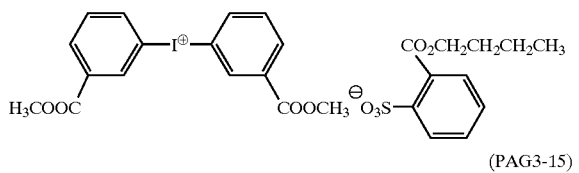
(PAG3-14)
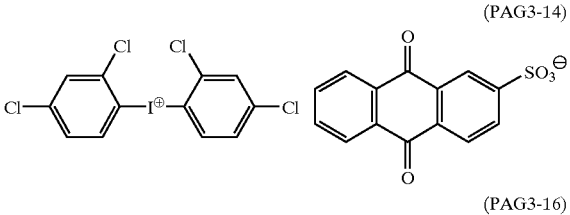
(PAG3-15)
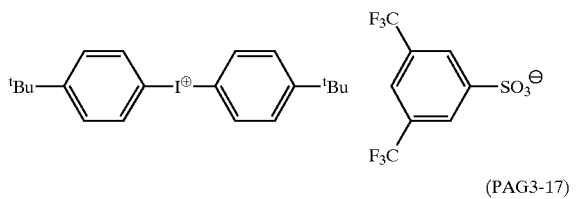
(PAG3-16)
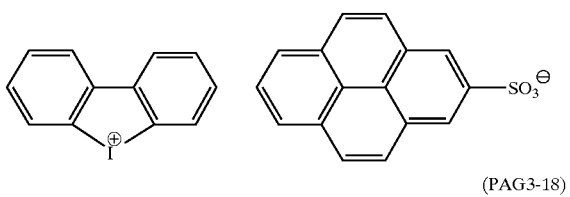
(PAG3-17)
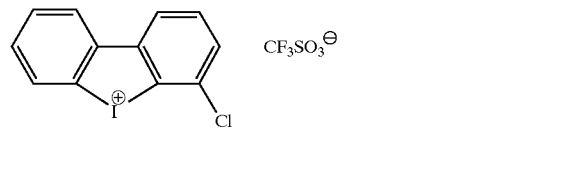
(PAG3-18)
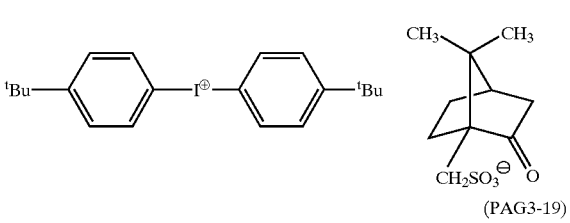
(PAG3-19)
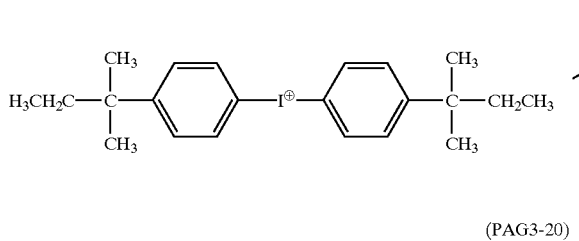
(PAG3-20)
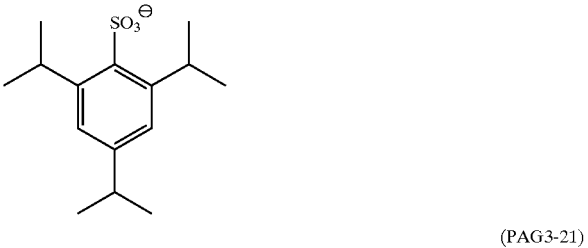
(PAG3-21)
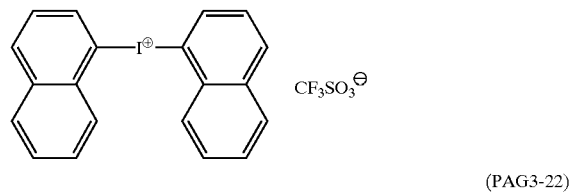
(PAG3-22)
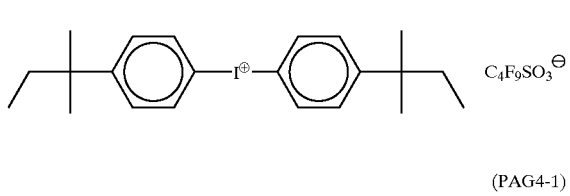
(PAG4-1)
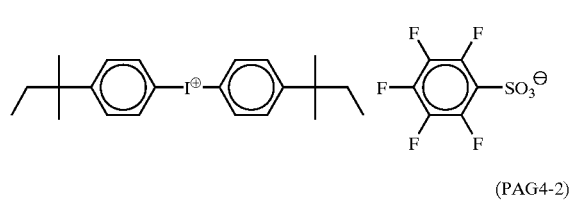
(PAG4-2)
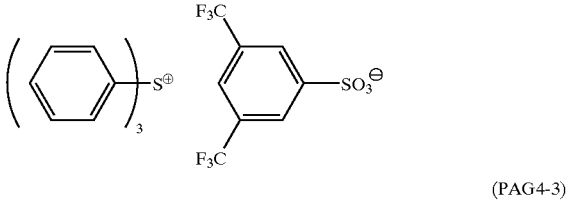
(PAG4-3)
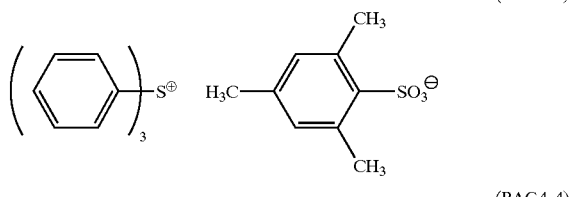
(PAG4-4)
(PAG4-5)
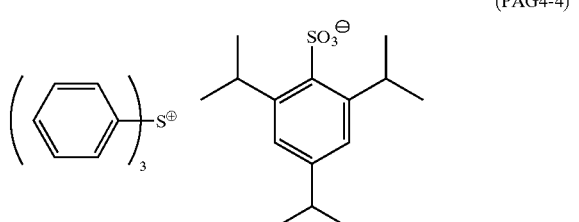
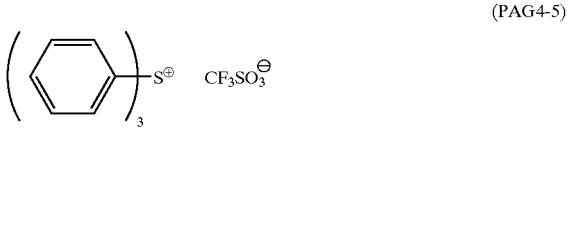

-continued
(PAG4-6) 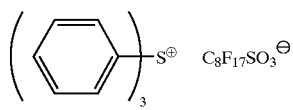
(PAG4-7) 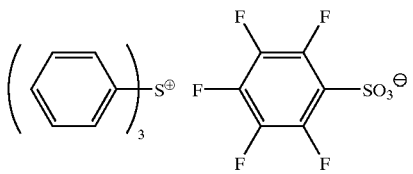
(PAG4-8) 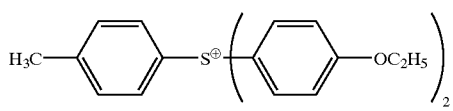
(PAG4-9) 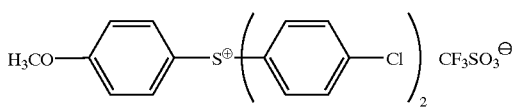
(PAG4-10) 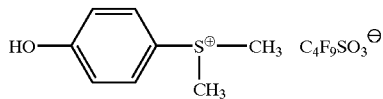
(PAG4-11) 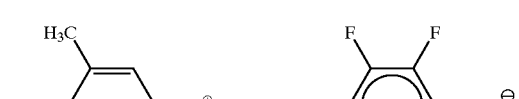
(PAG4-12) 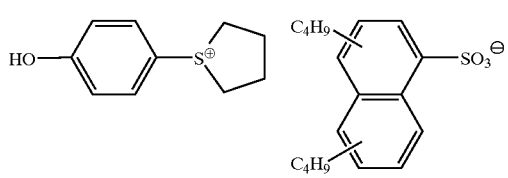
(PAG4-13) 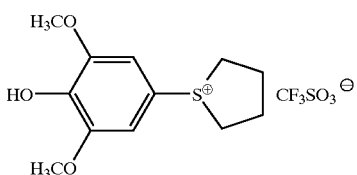
(PAG4-14) 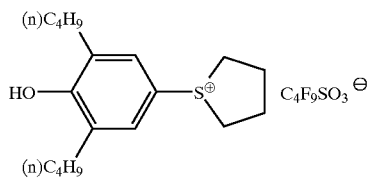
(PAG4-15) 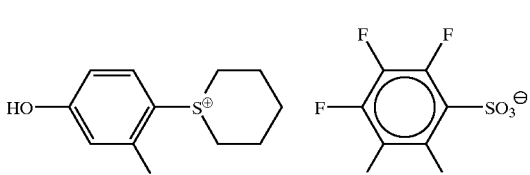
(PAG4-16) 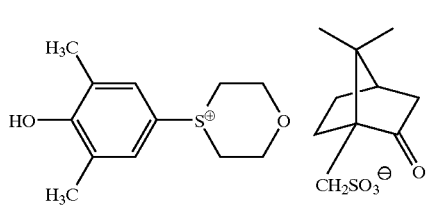
(PAG4-17) 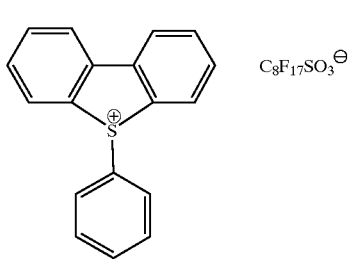
(PAG4-18) 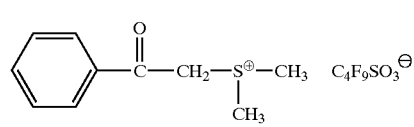
(PAG4-19) 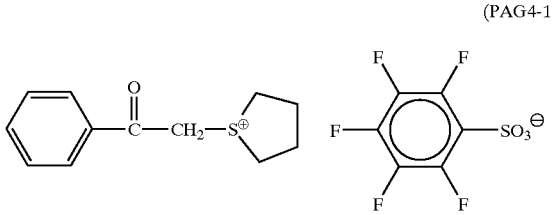
(PAG4-20) 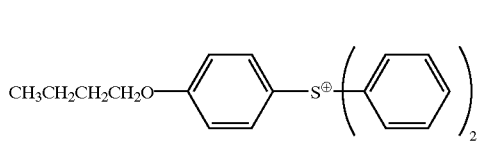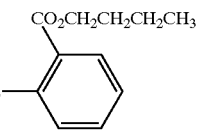

-continued
(PAG4-21)
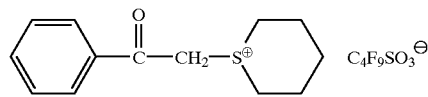
(PAG4-22)
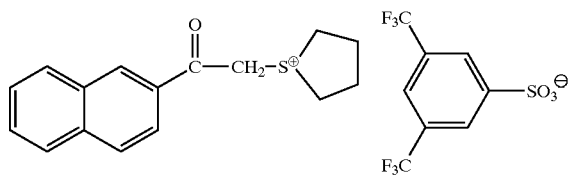
(PAG4-23)
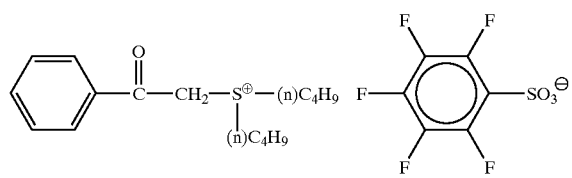
(PAG4-24)
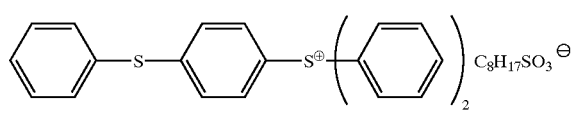
(PAG4-25)
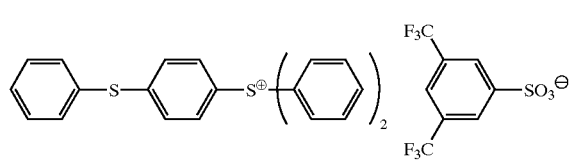
(PAG4-26)
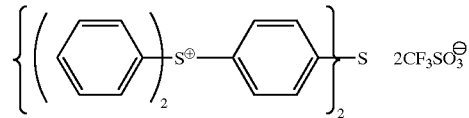
(PAG4-27)
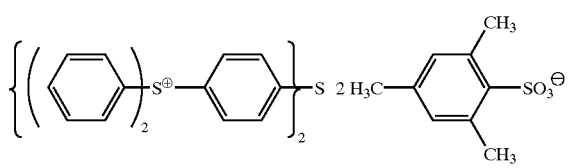
(PAG4-28)
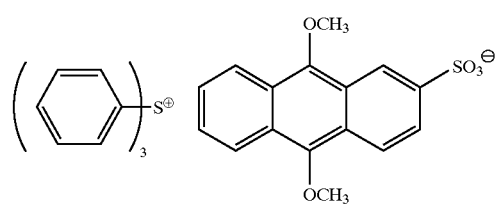
(PAG4-29)
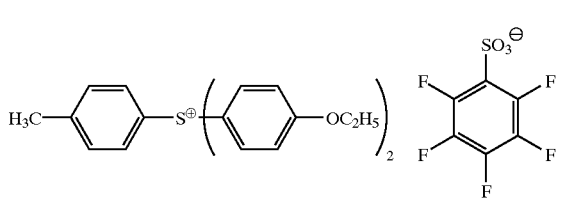
(PAG4-30)
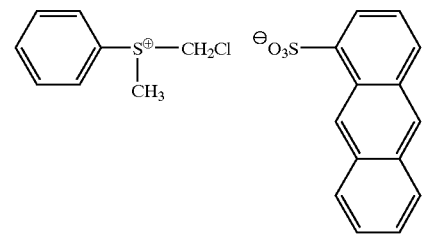
(PAG4-31)
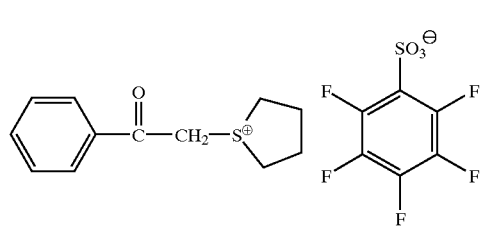
(PAG4-32)
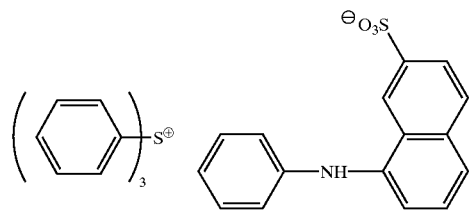

The above-mentioned onium salts represented by formulae (PAG3) and (PAG4) are known and can be synthesized by the method described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

(3) Disulfone derivative represented by the following formula (PAG5) and iminosulfonate derivative represented by formula (PAG6):

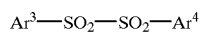
(PAG5)

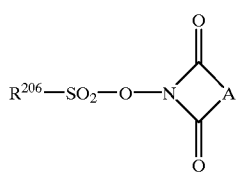
(PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include the following compounds, however, the present invention is not limited thereto.

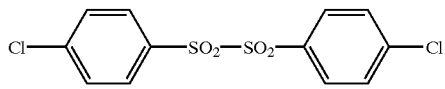
(PAG5-1)

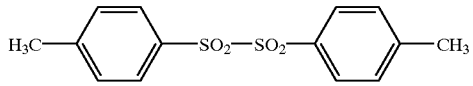
(PAG5-2)

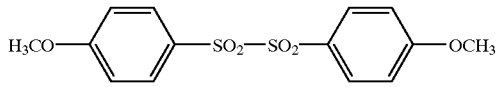
(PAG5-3)

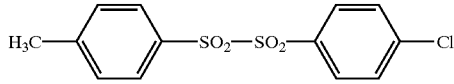
(PAG5-4)

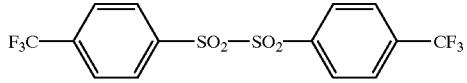
(PAG5-5)

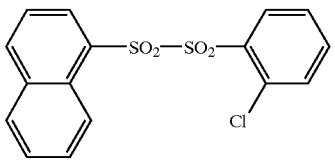
(PAG5-6)

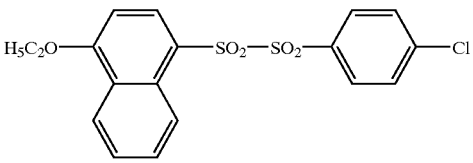
(PAG5-7)

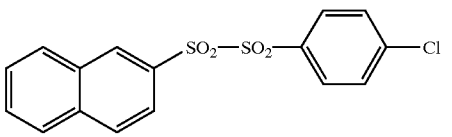
(PAG5-8)

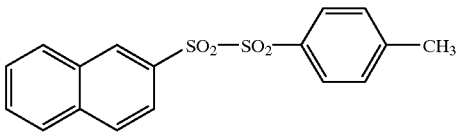
(PAG5-9)

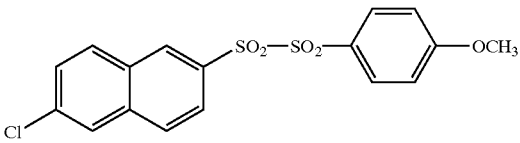
(PAG5-10)

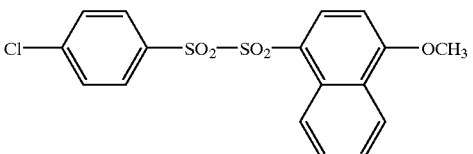
(PAG5-11)

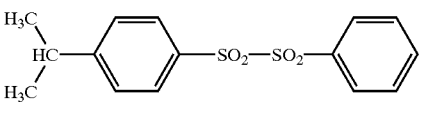
(PAG5-12)

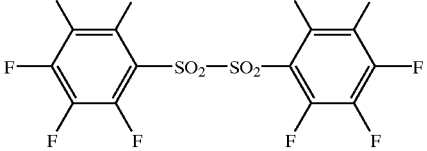
(PAG5-13)

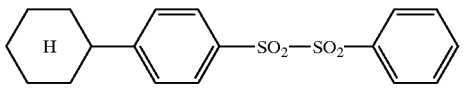
(PAG5-14)

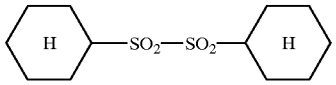
(PAG5-15)

(PAG6-1)
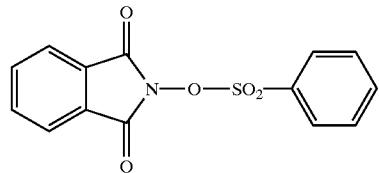
(PAG6-2)
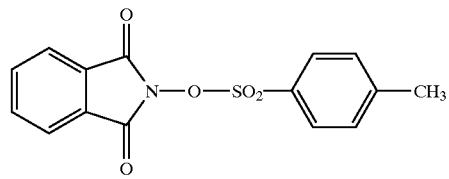
(PAG6-3)
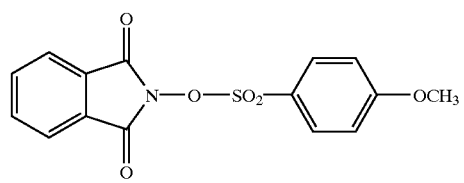
(PAG6-4)
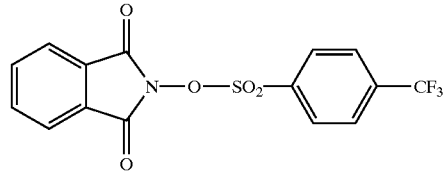
(PAG6-5)
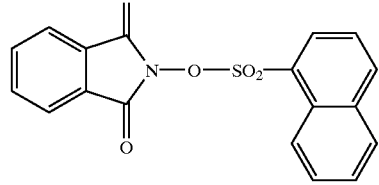
(PAG6-6)
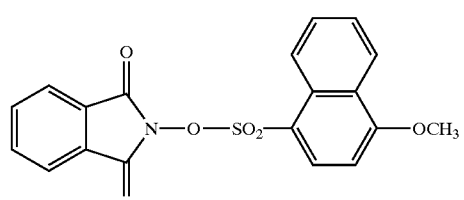
(PAG6-7)
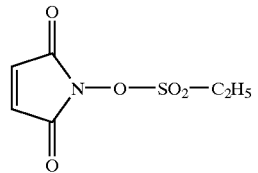
(PAG6-8)
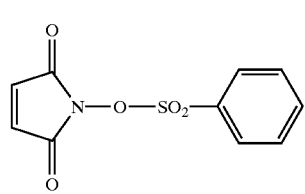
(PAG6-9)
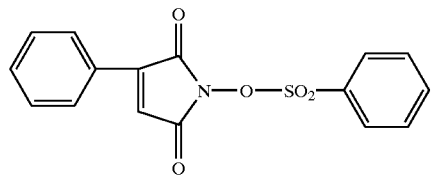
(PAG6-10)
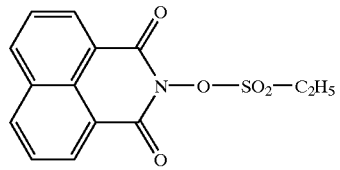
(PAG6-11)
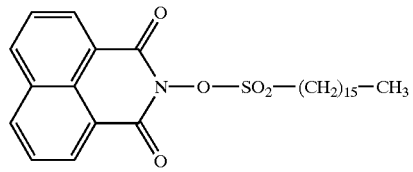
(PAG6-12)
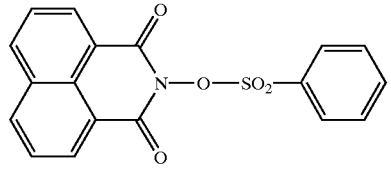
(PAG6-13)
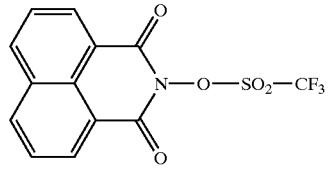
(PAG6-14)
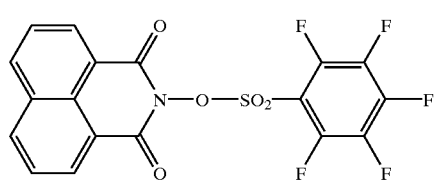
(PAG6-15)
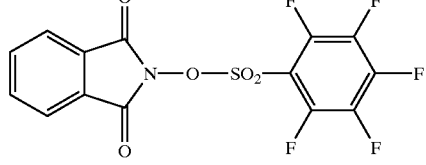
(PAG6-16)
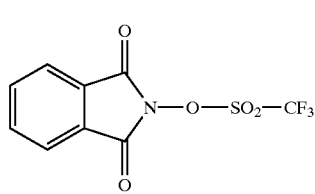

(PAG6-17)

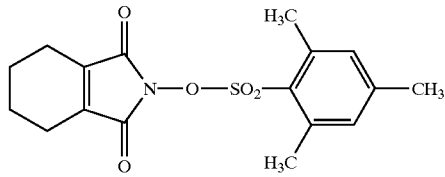

(PAG6-18)

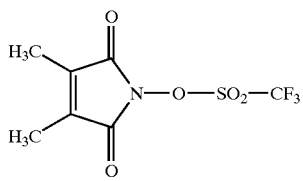

(PAG6-19)

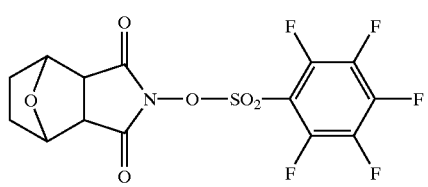

(PAG6-20)

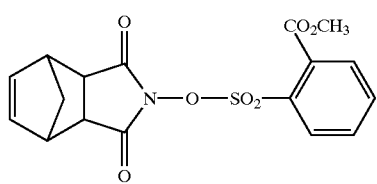

(4) Diazodisulfone derivative compound represented by the following formula (PAG7)

(PAG7)

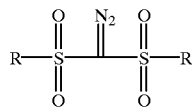

wherein R represents a linear, branched or cyclic alkyl group or an aryl group which may be substituted.

Specific examples thereof include the following compounds, however, the present invention is not limited thereto.

(PAG7-1)

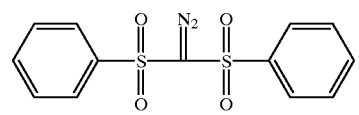

(PAG7-2)

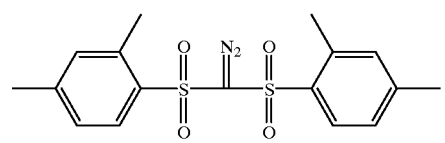

(PAG7-3)

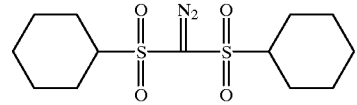

(PAG7-4)

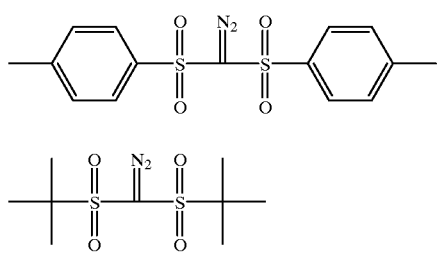

(PAG7-5)

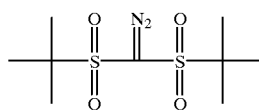

In the positive resist composition of the present invention, the compound (B) preferably comprises at least one compound selected from sulfonium salt and iodonium salt compounds capable of generating at least one of acids (i) to (iii) below upon irradiation with one of an actinic ray and radiation:

(i) a perfluoroalkylsulfonic acid having 2 or more carbon atoms;
(ii) a perfluoroarylsulfonic acid; and
(iii) an arylsulfonic acid having a perfluoroalkyl group as a substituent.

The iodonium salt and sulfonium salt compounds as the preferable compound (B) more preferably is represented by the (PAG3) or (PAG4) respectively, wherein $X^-$ represents an anion of any one of the acids (i) to (iii).

The amount added of the compound (B) capable of generating an acid upon irradiation with actinic rays or radiation, which is used in the present invention, is from 0.1 to 20% by weight, preferably from 0.5 to 10% by weight, more preferably from 1 to 7% by weight, based on the entire solid content of the composition of the present invention. These compounds may be used individually or as a mixture of a plurality of the compounds.

[3] Surfactant (C) of the Present Invention (Fluorine-Containing and/or Silicon-Containing Surfactant)

The positive photoresist composition of the present invention contains a fluorine-containing and/or silicon-containing surfactant (C). More specifically, the positive photoresist composition of the present invention contains any one of a fluorine-containing surfactant, a silicon-containing surfactant and a surfactant containing both a fluorine atom and a silicon atom, or contains two or more thereof. By the addition of this fluorine-containing and/or silicon-containing surfactant, the development defect is prevented and the coatability is improved.

Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,296,143, 5,294,511 and 5,824,451. The following commercially available surfactants each may also be used as it is.

Examples of the commercially available surfactant which can be used include fluorine-containing surfactants and silicon-containing surfactants, such as EFtop EF301, EF303 and EF352 (produced by Shin-Akita Kasei K.K.), Florad FC430 and 431 (produced by Sumitomo 3 M Inc.), Megafac F171, F173, F176, F189 and R08 (produced by Dainippon Ink & Chemicals, Inc.), Asahi Guard AG710, Surflon S-382, SC101, 102, 103, 104, 105 and 106 (produced by Asahi Glass Co., Ltd.), and Troysol S-366 (produced by Troy Chemical). In addition, polysiloxane polymer KP-341

(produced by Shin-Etsu Chemical Co., Ltd.) may also be used as a silicon-containing surfactant.

The amount of the surfactant blended is usually from 0.001 to 2% by weight, preferably from 0.01 to 1% by weight, based on the solid content in the composition of the present invention. These surfactants may be added individually or in combination of two or more thereof.

[4] Acid Diffusion Inhibitor (D) of the Present Invention

The composition of the present invention preferably contains an acid diffusion inhibitor for the purpose of preventing fluctuation in performance (e.g., T-top shape formation of pattern, fluctuation in sensitivity, fluctuation in line width of pattern) with the passage of time after the irradiation with actinic rays or radiation until the heat-treatment, fluctuation due to aging after the coating, or excess diffusion of acid (deterioration of resolution) at the time of heat-treatment after the irradiation with actinic rays or radiation. The acid diffusion inhibitor is an organic basic compound, for example, an organic basic compound containing a basic nitrogen, and a compound where the conjugate acid has a pKa value of 4 or more is preferably used.

Specific examples thereof include a compound having the following structures (A) to (E):

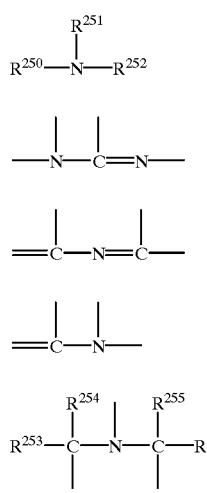

wherein $R^{250}$, $R^{251}$ and $R^{252}$, which may be identical or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may combine with each other to form a ring, and $R^{253}$, $R^{254}$, $R^{255}$ and $R^{256}$, which may be identical or different, each represents an alkyl group having from 1 to 6 carbon atoms.

The compound is more preferably a nitrogen-containing basic compound having two or more nitrogen atoms different in the chemical environment within one molecule, still more preferably a compound having both a substituted or unsubstituted amino group and a ring structure containing a nitrogen atom, or a compound having an alkylamino group.

Specific preferred examples thereof include a substituted or unsubstituted guanidine, a substituted or unsubstituted aminopyridine, a substituted or unsubstituted aminoalkylpyridine, a substituted or unsubstituted indazole, an imidazole, a substituted or unsubstituted pyrazole, a substituted or unsubstituted pyrazine, an substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group.

More preferred compounds are guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethyl-aminopyridine, 2-diethylaminopyridine, 2-(aminomethyl)-pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

These nitrogen-containing basic compounds are used individually or in combination of two or more thereof.

The ratio between the acid generator and the organic basic compound used in the composition is preferably 2.5 to 300 {(acid generator)/(organic basic compound) (by mol)}. If this molar ratio is less than 2.5, low sensitivity results and the resolution may decrease in some cases, whereas if it exceeds 300, the thickening of the pattern increases in aging after the exposure until the heat-treatment and the resolution sometimes decreases. The (acid generator)/(organic basic compound) (by mol) is preferably from 5.0 to 200, more preferably from 7.0 to 150.

[5] Other Components Used in the Composition of the Present Invention (1) Solvents The composition of the present invention is dissolved in a solvent which can dissolve the above-described respective components, and then coated on a substrate. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. These solvents are used individually or in combination.

For forming a pattern on a resist film, for example, in the production of a precision integrated circuit device, the positive photoresist composition of the present invention is coated on a substrate (e.g., transparent substrate such as silicon/silicon dioxide coating, glass substrate and ITO substrate), irradiated with actinic rays or radiation using a drawing apparatus, heated, developed, rinsed and dried, whereby a good resist pattern can be formed.

The developer which can be used for the positive resist composition of the present invention is an aqueous solution of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) or cyclic amines (e.g., pyrrole, piperidine). This aqueous alkali solution may be used after adding thereto an appropriate amount of an alcohol (e.g., isopropyl alcohol) or surfactant (e.g., nonionic surfactant).

Among these developers, preferred are quaternary ammonium salts, more preferred are tetramethylammonium hydroxide and choline.

The present invention is described in greater detail below, however, the present invention should not be construed as being limited thereto.

SYNTHESIS EXAMPLE 1

A 150-ml 1,1,2-trichloro-trifluoroethylene solution containing 9.4 g (0.10 mol) of norbornene and 19.4 g (0.10 mol) of tert-butyl norbornene-2-carbonate was charged into a 1 L-volume autoclave and a pressure was applied to 200 psi in a nitrogen atmosphere. Furthermore, 20 g (0.20 mol) of tetrafluoroethylene was injected and heated at 50° C. while stirring. To the reaction solution, a 15-ml 1,1,2-trichloro-trifluoroethylene solution containing 1.2 g of di(4-tert-butylcyclohexyl)peroxydicarbonate was injected over 20 minutes and the solution was continuously stirred for 20 hours. After the completion of reaction, the reaction solution was charged into 2 L of methanol while vigorously stirring to precipitate a white resin. The precipitated resin was separated by filtration and dried in a vacuum to obtain 23.5 g of Resin (1) of the present invention.

By the GPC measurement, the molecular weight of Resin (1) was 6,200 as a weight average (Mw). Also, the composition of Resin (1) was examined by the $C^{13}$-NMR measurement and found to be Structure (F-1)/norbornene/(B-16)=45/30/25 by mol.

SYNTHESIS EXAMPLE 2

14.3 g (0.04 mol) of Monomer (a) shown below, 3.9 g (0.04 mol) of maleic anhydride and 2.6 g (0.02 mol) of tert-butyl acrylate were dissolved in 100 ml of MEK and heated at 70° C. in a nitrogen stream. Thereto, 0.2 g of V-601 (produced by Wako Pure Chemical Industries, Ltd.) was added as a polymerization initiator and the solution was stirred for 3 hours. Then, 0.2 g of V-601 was added and the solution was continuously stirred for 4 hours. Thereafter, the reaction solution was charged into 1 L of tert-butyl methyl ether while vigorously stirring to precipitate a white resin. The precipitated resin was separated by filtration and dried in a vacuum to obtain 12.1 g of Resin (2) of the present invention.

By the GPC measurement, the molecular weight of Resin (2) was 8,900 as a weight average (Mw). Also, the composition of Resin (2) was examined by the $C^{13}$-NMR measurement and found to be Structure (F-21)/maleic anhydride/(B-4)=39/38/23 by mol.

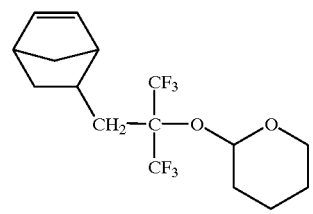

(a)

SYNTHESIS EXAMPLE 3

6.7 g (0.015 mol) of Monomer (b) shown below, 1.4 g (0.006 mol) of 2-methyl-2-adamantane methacrylate and 1.8 g 1(0.009 mol) of mevalonic lactone methacrylate were dissolved in 30 ml of 1-methoxy-2-propanol and thereto, 0.1 g of 2,2'-azobis(2,4-dimethylvaleronitrile) (V-65, trade name, produced by Wako Pure Chemical Industries, Ltd.) as a polymerization initiator and a 70-ml 1-methoxy-2-propanol solution containing 15.6 g (0.035 mol) of Monomer (b), 3.3 g (0.014 mol) of 2-methyl-2-adamantane methacrylate and 4.2 g (0.021 mol) of mevalonic lactone methacrylate were added dropwise over 2 hours at 70° C. while stirring in a nitrogen stream. After 2 hours, 0.1 g of the initiator was additionally added and the reaction was further allowed to proceed for 2 hours. Thereafter, the temperature was elevated to 90° C. and the stirring was continued for 1 hour. The reaction solution was allowed to cool and then charged into 1 L of ion exchanged water/methanol (1/1) while vigorously stirring to precipitate a white resin. The obtained resin was dried under reduced pressure to obtain 15.8 g of Resin (3) of the present invention.

By the GPC measurement, the molecular weight was 10,200 as a weight average (Mw). Also, the composition of Resin (3) was examined by the $C^{13}$-NMR measurement and found to be Structure (F-30)/(B-7)/(B-11)=48/21/31 by mol.

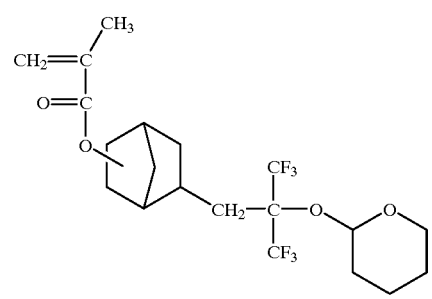

(b)

SYNTHESIS EXAMPLES 4 TO 12

The resins (A) of the present invention shown in Table 1 below were synthesized in the same manner as above.

TABLE 1

| Synthesis of Resin (A) of the Invention | | |
|---|---|---|
| Resin (A) | Composition (structural unit and molar ratio in resin) | Molecular Weight |
| (4) | (F-1)/(B-20)/(B-23) = 45/25/30 | 5,800 |
| (5) | (F-1)/(F-21)/(B-16) = 48/33/19 | 4,500 |

TABLE 1-continued

Synthesis of Resin (A) of the Invention

| Resin (A) | Composition (structural unit and molar ratio in resin) | Molecular Weight |
|---|---|---|
| (6) | (F-22)/maleic anhydride/(B-8) = 42/39/19 | 8,700 |
| (7) | (F-30)/(F-48)/(B-2) = 42/17/41 | 12,600 |
| (8) | (F-50)/(B-7)/(B-11) = 31/35/34 | 9,200 |
| (9) | (F-55)/maleic anhydride/(B-4) = 40/37/23 | 7,400 |
| (10) | (F-16)/maleic anhydride/(B-8) = 43/34/23 | 6,300 |
| (11) | (F-26)/maleic anhydride/(B-12) = 40/33/27 | 8,900 |
| (12) | (F-31)/(F-42)/(B-8) = 44/18/38 | 11,600 |

SYNTHESIS EXAMPLE 13

A 150-ml 1,1,2-trichloro-trifluoroethylene solution containing 9.4 g (0.10 mol) of norbornene and 35.8 g (0.10 mol) of Monomer (a) shown below was charged into a 1 L-volume autoclave and a pressure was applied to 200 psi in a nitrogen atmosphere. Furthermore, 20 g (0.20 mol) of tetrafluoroethylene was injected and heated at 50° C. while stirring. To the reaction solution, a 15-ml 1,1,2-trichloro-trifluoroethylene solution containing 1.2 g of di(4-tert-butylcyclohexyl)peroxydicarbonate was injected over 20 minutes and the solution was continuously stirred for 20 hours. After the completion of reaction, the reaction solution was charged into 2 L of methanol while vigorously stirring to precipitate a white resin. The precipitated resin was separated by filtration and dried in a vacuum to obtain 37.4 g of Resin (13) of the present invention.

By the GPC measurement, the molecular weight of Resin (13) was 8,800 as a weight average (Mw). Also, the composition of Resin (13) was examined by the $C^{13}$-NMR measurement and found to be Structure (F-1)/(F-21)/norbornene=48/30/22 by mol.

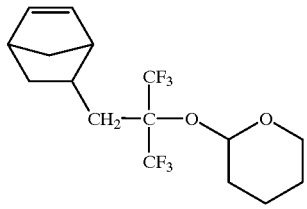

(a)

SYNTHESIS EXAMPLE 14

34.1 g of Resin (14) of the present invention was synthesized in the same manner as in Synthesis Example 13 except for using 32.2 g (0.04 mol) of Monomer (c) shown below in place of Monomer (a) used in Synthesis Example 13.

By the GPC measurement, the molecular weight of Resin (14) was 7,400 as a weight average (Mw). Also, the composition of Resin (14) was examined by the $C^{13}$-NMR measurement and found to be Structure (F-1)/(F-15)/norbornene=49/25/26 by mol.

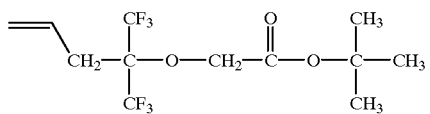

(c)

SYNTHESIS EXAMPLES 15 TO 22

The resins (A) of the present invention shown in Table 2 below were synthesized in the same manner as above.

TABLE 2

Synthesis of Resin (A) of the Invention

| Resin (A) | Composition (structural unit and molar ratio in resin) | Molecular Weight |
|---|---|---|
| (15) | (F-1)/(F-16)/norbornene = 45/26/29 | 8,700 |
| (16) | (F-1)/(F-20)/(B-4) = 48/30/22 | 9,300 |
| (17) | (F-2)/(F-22)/(B-4) = 42/39/19 | 7,900 |
| (18) | (F-7)/(F-20)/norbornene = 35/33/32 | 6,400 |
| (19) | (F-12)/(F-21)/norbornene = 23/38/39 | 5,800 |
| (20) | (F-1)/(F-25)/(B-4) = 48/23/29 | 7,200 |
| (21) | (F-1)/(F-16)/(B-16) = 44/26/40 | 9,500 |
| (22) | (F-1)/(F-15)/(B-16)/norbornene = 38/21/21/20 | 10,900 |

SYNTHESIS EXAMPLE 23

14.3 g (0.04 mol) of Monomer (a) shown below, 3.9 g (0.04 mol) of maleic anhydride and 11.7 g (0.02 mol) of perfluorooctylethyl norbornene-2-carboxylate were dissolved in 100 ml of MEK and heated at 70° C. in a nitrogen stream. Thereto, 0.2 g of V-601 (produced by Wako Pure Chemical Industries, Ltd.) was added as a polymerization initiator and the solution was stirred for 3 hours. Furthermore, 0.2 g of V-601 was added and the solution was continuously stirred for 4 hours. Thereafter, the reaction solution was charged into 1 L of tert-butyl methyl ether while vigorously stirring to precipitate a white resin. The precipitated resin was separated by filtration and dried in a vacuum to obtain 16.2 g of Resin (23) of the present invention.

By the GPC measurement, the molecular weight of Resin (23) was 8,700 as a weight average (Mw). Also, the composition of Resin (23) was examined by the $C^{13}$-NMR measurement and found to be Structure (F-21)/(F-55)/maleic anhydride=42/18/40 by mol.

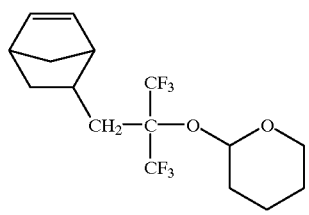

(a)

SYNTHESIS EXAMPLE 24

6.7 g (0.015 mol) of Monomer (b) shown below, 2.7 g (0.005 mol) of perfluorooctylethyl methacrylate, 1.2 g (0.005 mol) of 2-methyl-2-adamantane methacrylate and 1.0 g (0.005 mol) of mevalonic lactone methacrylate were dissolved in 30 ml of 1-methoxy-2-propanol and thereto, 0.1 g of 2,2'-azobis(2,4-dimethylvaleronitrile) (V-65, trade name, produced by Wako Pure Chemical Industries, Ltd.) as a polymerization initiator and a 70-ml 1-methoxy-2-propanol solution containing 15.6 g (0.035 mol) of Monomer (b), 6.4 g (0.012 mol) of perfluorooctylethyl methacrylate, 2.8 g (0.012 mol) of 2-methyl-2-adamantane methacrylate and 2.4 g (0.012 mol) of mevalonic lactone methacrylate were added dropwise over 2 hours at 70° C. while stirring in a nitrogen stream. After 2 hours, 0.1 g of the initiator was additionally added and the reaction was further allowed to proceed for 2 hours. Thereafter, the temperature was elevated to 90° C. and the stirring was continued for 1 hour. The reaction solution was allowed to cool and then charged into 1 L of ion exchanged water/methanol (1/1) while vigorously stirring to precipitate a white resin. The obtained resin was dried under reduced pressure to obtain 21.5 g of Resin (24) of the present invention.

By the GPC measurement, the molecular weight was 10,500 as a weight average (Mw). Also, the composition of Resin (24) was examined by the $C^{13}$-NMR measurement and found to be Structure (F-30)/(F-48)/(B-7)/(B-11)=48/15/18/19 by mol.

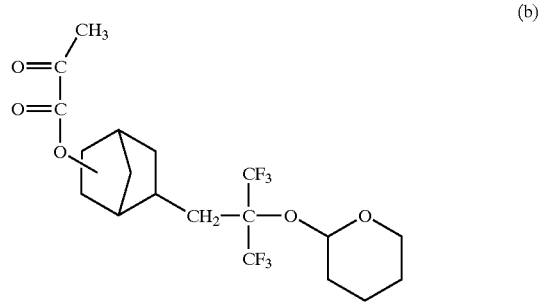

(b)

SYNTHESIS EXAMPLES 25 To 32

The resins (A) of the present invention shown in Table 3 below were synthesized in the same manner as above.

TABLE 3

Synthesis of Resin (A) of the Invention

| Resin (A) | Composition (structural unit and molar ratio in resin) | Molecular Weight |
|---|---|---|
| (25) | (F-15)/(F-58)/maleic anhydride = 30/24/46 | 9,700 |
| (26) | (F-16)/(F-55)/(B-4)/maleic anhydride = 26/14/22/38 | 10,600 |
| (27) | (F-21)/(F-60)/(B-4)/maleic anhydride = 28/14/21/37 | 8,500 |
| (28) | (F-21)/(F-64)/maleic anhydride = 37/23/40 | 9,400 |
| (29) | (F-25)/(F-55)/(B-4)/maleic anhydride = 21/18/25/36 | 7,800 |
| (30) | (F-30)/(F-50)/(B-2)/(B-12) = 45/16/15/24 | 10,400 |
| (31) | (F-30)/(F-53)/(B-8)/(B-11) = 40/18/25/17 | 9,700 |
| (32) | (F-30)/(F-54)/(B-7)/(B-13) = 38/15/31/16 | 9,900 |

SYNTHESIS EXAMPLE 33

13.5 g (0.05 mol) of 4-[bis(trifluoromethyl)hydroxymethyl]styrene and 3.4 g (0.05 mol) of methacrylonitrile were dissolved in 100 ml of N,N-dimethylacetamide and heated at 70° C. in a nitrogen stream. Thereto, 0.1 g of 2,2'-azobis(2,4-dimethylvaleronitrile) (V-65, trade name, produced by Wako Pure Chemical Industries, Ltd.) was added as a polymerization initiator and the solution was stirred for 3 hours. Then, 0.1 g of V-65 was additionally added and the stirring was continued for 4 hours. Thereafter, the reaction solution was charged into 1 L of methanol/tert-butyl methyl ether while vigorously stirring to precipitate a white resin. The precipitated resin was separated by filtration, dried in a vacuum and dissolved in 100 ml of THF. Thereto, 2.9 g (0.04 mol) of ethyl vinyl ether was added and a catalytic amount of p-toluenesulfonic acid was added. The resulting solution was stirred at room temperature for 8 hours. The reaction was stopped by adding triethylamine in an amount 2 times the p-toluenesulfonic acid catalyst and the reaction solution was charged into 3 L of ultrapure water while vigorously stirring. The precipitated resin was separated by filtration and dried to obtain 14.1 g of Resin (33) of the present invention.

By the GPC measurement, the molecular weight of Resin (33) was 10,900 as a weight average (Mw). Also, the composition of Resin (33) was examined by the $C^{13}$-NMR measurement and found to be Structure (F-39)/(F-42)/(C-10)=16/36/48 by mol.

SYNTHESIS EXAMPLES 34 TO 40

The resins (A) of the present invention shown in Table 4 below were synthesized in the same manner as above.

TABLE 4

Synthesis of Resin (A) of the Invention

| Resin (A) | Composition (structural unit and molar ratio in resin) | Molecular Weight |
|---|---|---|
| (34) | (F-39)/(F-41)/(C-10) = 14/38/48 | 11,100 |
| (35) | (F-44)/(C-10) = 53/47 | 9,800 |
| (36) | (F-42)/(C-12) = 55/45 | 10,700 |
| (37) | (F-39)/(F-43)/(C-10) = 13/39/48 | 12,600 |
| (38) | (F-1)/(F-21)/(C-5) = 40/35/25 | 6,800 |
| (39) | (F-19)/maleic anhydride/(C-8) = 35/33/32 | 8,300 |
| (40) | (F-1)/(B-4)/(C-8) = 43/34/23 | 7,400 |

SYNTHESIS EXAMPLES 41 TO 68

Synthesis of Resin (42)

Into a 100 ml-volume three neck flask equipped with a reflux tube and a nitrogen inlet tube, 4-(2-hydroxyhexafluoroisopropyl)styrene (produced by Central Glass Co., Ltd.) and 4-(1-methoxyethoxy)styrene (produced by Toso) were charged at a molar ratio of 50/50. Thereafter, tetrahydrofuran was added to prepare 30 g in total of a reaction solution having a monomer concentration of 30% by weight. This solution was stirred and heated to 65° C. in a nitrogen stream and thereto, an azo-type polymerization initiator V-65 (produced by Wako Pure Chemical Industries, Ltd.) was added in an amount of 5.0 mol % based on the total molar number of those two monomers and reacted for 8 hours while stirring in a nitrogen stream. To the obtained reaction solution, 200 ml of hexane was added and the produced polymer was precipitated from the solution and purified by separating unreacted monomers. The polymer composition determined by $C^{13}$NMR was 49/51.

The obtained polymer was analyzed by GPC (in THF solution, calculated in terms of standard polystyrene), as a result, the weight average molecular weight was 10,200, the dispersion degree was 2.20 and the percentage of resins having a molecular weight of 1,000 or less contained in the polymer was 15% by weight.

The resins (A) of the present invention shown in Table 5 below were synthesized in the same manner as above.

TABLE 5

| Resin (A) | Composition (structural unit and molar ratio in resin) | Molecular Weight |
|---|---|---|
| (41) | (II-1)/(A-1) = 48/52 | 8,900 |
| (42) | (II-1)/(A-2) = 49/51 | 10,200 |
| (43) | (II-1)/(A-3') = 53/47 | 5,800 |
| (44) | (II-1)/(A-10) = 61/39 | 9,200 |
| (45) | (II-1)/(A-19) = 64/36 | 8,500 |
| (46) | (II-1)/(A-34) = 60/40 | 8,600 |
| (47) | (II-1)/(A-35) = 51/49 | 8,800 |
| (48) | (II-1)/(A-36) = 50/50 | 8,400 |
| (49) | (II-2)/(A-19) = 64/36 | 10,100 |
| (50) | (II-1')/(A-20) = 61/39 | 9,200 |
| (51) | (II-1")/(A-26) = 55/45 | 9,100 |
| (52) | (II-3)/(A-26) = 49/51 | 7,800 |
| (53) | (II-4)/(A-26) = 52/48 | 12,100 |
| (54) | (II-1)/(B-1) = 58/42 | 14,200 |
| (55) | (II-1)/(B-1') = 70/30 | 16,600 |
| (56) | (II-1)/(B-7) = 78/22 | 9,200 |
| (57) | (II-1)/(B-8) = 73/27 | 8,400 |
| (58) | (II-1)/(B-12') = 69/31 | 8,600 |
| (59) | (II-1)/(A-19)/(VII-2) = 64/26/10 | 9,200 |
| (60) | (II-1)/(A-19)/(F-1) = 63/27/9 | 8,900 |
| (61) | (II-1)/(A-19)/(III-1) = 60/33/7 | 9,000 |
| (62) | (II-1)/(A-19)/(F-7) = 58/33/9 | 9,500 |
| (63) | (II-1)/(A-19)/(F-19) = 51/33/16 | 10,200 |
| (64) | (II-1)/(B-4)/(VII-2) = 61/24/15 | 10,600 |
| (65) | (II-1)/(B-12")/(F-2) = 59/33/8 | 10,000 |
| (66) | (II-1)/(B-10)/(III-3) = 56/30/14 | 7,200 |
| (67) | (II-3)/(B-8)/(F-7) = 49/36/15 | 9,200 |
| (68) | (II-4)/(B-12')/(F-24) = 59/33/8 | 8,300 |

EXAMPLE 1
Measurement of Transmittance 1.36 g of each resin synthesized above and 0.04 g of triphenylsulfonium nonaflate salt were dissolved in 8.5 g of propylene glycol monomethyl ether acetate and thereto, 0.005 g of dicyclohexylmethylamine and as a surfactant, 0.01 g of Megafac $R_{08}$ (produced by Dainippon Ink & Chemicals Inc.) were added to prepare resist compositions of the present invention.

Each sample solution was filtered through a 0.1-μm Teflon filter, coated on a calcium fluoride disk using a spin coater and dried under heating at 120° C. for 5 hours to obtain a resist film having a film thickness of 0.1 μm. The absorption of the coating film was measured by Acton CAMS-507 spectrometer and the transmittance at 157 nm was calculated.

The results are shown in Tables 6 and 7.

TABLE 6

| Resin of the Invention | Transmittance at 157 nm (%) |
|---|---|
| (1) | 58 |
| (2) | 52 |
| (3) | 53 |
| (4) | 56 |
| (5) | 63 |
| (6) | 51 |
| (7) | 68 |
| (8) | 52 |
| (9) | 51 |
| (10) | 55 |
| (11) | 50 |
| (12) | 49 |
| (13) | 66 |
| (14) | 60 |
| (15) | 61 |
| (16) | 63 |
| (17) | 65 |
| (18) | 60 |
| (19) | 60 |
| (20) | 62 |
| (21) | 64 |
| (22) | 58 |
| (23) | 58 |
| (24) | 57 |
| (25) | 59 |
| (26) | 53 |
| (27) | 55 |
| (28) | 60 |
| (29) | 52 |
| (30) | 59 |
| (31) | 58 |
| (32) | 56 |
| (33) | 48 |
| (35) | 46 |
| (37) | 47 |
| (39) | 51 |
| (40) | 53 |

TABLE 7

| Resin | Transmittance at 157 nm (%) |
|---|---|
| (41) | 55 |
| (42) | 48 |
| (43) | 52 |
| (44) | 53 |
| (45) | 50 |
| (46) | 49 |
| (47) | 47 |
| (48) | 45 |
| (49) | 51 |
| (50) | 50 |
| (51) | 49 |
| (52) | 47 |
| (53) | 45 |
| (54) | 51 |
| (55) | 50 |
| (56) | 47 |
| (57) | 48 |
| (58) | 49 |
| (59) | 51 |
| (60) | 58 |
| (61) | 57 |
| (62) | 56 |
| (63) | 52 |
| (64) | 51 |
| (65) | 55 |
| (66) | 58 |
| (67) | 51 |
| (68) | 49 |
| Comparative Example 1 (commercially available acetal-type resist for KrF) | 18 |

As seen from the results in Tables 6 and 7, the measured transmittance of the coating film using the composition of the present invention is almost in excess of 50% and this reveals that the coating film has a sufficiently high transmittance at 157 nm.

EXAMPLE 2
Evaluation of Coatability and Development Defect

The resist compositions of the present invention were prepared by changing the surfactant used in Example 1 to the following W-1 to W-4. The surfactant used is shown in Tables 8 and 9.

The surfactants used are:

W1: Megafac F176 (produced by Dainippon Ink & Chemicals Inc.) (containing fluorine)
W2: Megafac R08 (produced by Dainippon Ink & Chemicals Inc.) (containing fluorine and silicon)
W3: Polysiloxane polymer KP-341 (produced by Shin-Etsu Chemical Co., Ltd.
W4: Polyoxyethylene nonylphenyl ether Each sample solution was filtered through a 0.1-$\mu$m Teflon filter, coated on a silicon wafer treated with hexamethyldisilazane using a spin coater and dried under heating on a vacuum contact-type hot plate at 110° C. for 90 seconds to obtain resist films having a film thickness of 0.3 $\mu$m. The obtained resist films each was imagewise exposed using a KrF excimer stepper (FPA-3000EX5) manufactured by Canon, after-heated at 110° C. for 90 seconds and then developed with a 0.262N TMAH aqueous solution to form a 0.5-$\mu$m L/S pattern.

The development defect and coatability were evaluated as follows.

[Number of Development Defects]

The resist pattern obtained above was measured on the number of development defects using a machine KLA-2112 manufactured by KLA Tenchol and the obtained primary data value was used as the number of development defects.

Coatability (In-Plane Uniformity)

Each resist solution was coated on a 8-inch silicon wafer and treated in the same manner as in the above-described formation of resist layer to obtain a resist coating film for the measurement of in-plane uniformity. The film thickness of this coating film was measured using Lambda A manufactured by Dainippon Ink & Chemicals Inc. at 36 sites to make a cross at equal intervals along the diameter direction of the wafer.

From the measured values, a standard deviation was determined. When the triple of the standard deviation is less than 50, the rating was O and when 50 or more, X.

The results in the evaluation of performance are shown in Tables 8 and 9.

TABLE 8

| Resin (A) of the Invention | Surfactant Used | Development Defects | Coatability |
|---|---|---|---|
| (1) | W-1 | 25 | ○ |
| (2) | W-2 | 21 | ○ |
| (3) | W-2 | 28 | ○ |
| (4) | W-3 | 30 | ○ |
| (5) | W-1 | 27 | ○ |
| (6) | W-2 | 22 | ○ |
| (7) | W-3 | 26 | ○ |
| (8) | W-3 | 35 | ○ |
| (9) | W-2 | 32 | ○ |
| (10) | W-2 | 25 | ○ |
| (11) | W-1 | 29 | ○ |
| (12) | W-2 | 24 | ○ |
| (13) | W-1 | 25 | ○ |
| (14) | W-2 | 22 | ○ |
| (15) | W-2 | 23 | ○ |
| (16) | W-3 | 28 | ○ |
| (17) | W-3 | 26 | ○ |
| (18) | W-1 | 25 | ○ |
| (19) | W-2 | 21 | ○ |
| (20) | W-3 | 26 | ○ |
| (21) | W-2 | 24 | ○ |
| (22) | W-2 | 25 | ○ |
| (23) | W-2 | 29 | ○ |
| (24) | W-2 | 30 | ○ |

TABLE 8-continued

| Resin (A) of the Invention | Surfactant Used | Development Defects | Coatability |
|---|---|---|---|
| (25) | W-3 | 27 | ○ |
| (26) | W-1 | 24 | ○ |
| (27) | W-1 | 26 | ○ |
| (28) | W-3 | 31 | ○ |
| (29) | W-2 | 25 | ○ |
| (30) | W-2 | 30 | ○ |
| (31) | W-3 | 29 | ○ |
| (32) | W-1 | 28 | ○ |
| (33) | W-1 | 20 | ○ |
| (35) | W-2 | 22 | ○ |
| (37) | W-2 | 24 | ○ |
| (39) | W-3 | 27 | ○ |
| (40) | W-1 | 25 | ○ |

TABLE 9

| Resin (A) of the Invention | Surfactant Used | Development Defects | Coatability |
|---|---|---|---|
| (41) | W-1 | 24 | ○ |
| (42) | W-2 | 28 | ○ |
| (43) | W-1 | 25 | ○ |
| (44) | W-1 | 24 | ○ |
| (45) | W-2 | 26 | ○ |
| (46) | W-1 | 25 | ○ |
| (47) | W-3 | 25 | ○ |
| (48) | W-1 | 24 | ○ |
| (49) | W-2 | 22 | ○ |
| (50) | W-1 | 26 | ○ |
| (51) | W-1 | 24 | ○ |
| (52) | W-1 | 30 | ○ |
| (53) | W-3 | 24 | ○ |
| (54) | W-1 | 29 | ○ |
| (55) | W-2 | 24 | ○ |
| (56) | W-1 | 26 | ○ |
| (57) | W-3 | 22 | ○ |
| (58) | W-1 | 24 | ○ |
| (59) | W-2 | 20 | ○ |
| (60) | W-1 | 24 | ○ |
| (61) | W-3 | 25 | ○ |
| (62) | W-1 | 24 | ○ |
| (63) | W-2 | 27 | ○ |
| (64) | W-1 | 29 | ○ |
| (65) | W-1 | 24 | ○ |
| (66) | W-2 | 21 | ○ |
| (67) | W-1 | 21 | ○ |
| (68) | W-1 | 24 | ○ |
| (1) (Comparative Example 2) | None | 2000 | X |
| (1) (Comparative Example 3) | W-4 | 650 | X |

As seen from the results in Tables 8 and 9, the composition of the present invention containing a fluorine and/or silicon-containing surfactant has far excellent coatability as compared with Comparative Examples and also, is greatly reduced in the number of development defects.

EXAMPLE 3

Evaluation of Image-Forming Property

Using Resins (1) to (5), (13), (15), (17), (23), (25), (27), (33), (35), (40) and (41) to (68) of the present invention, resist solutions were prepared in the same manner as in Example 1.

Each sample solution was filtered through a 0.1-$\mu$m Teflon filter, coated on a silicon wafer treated with hexamethyldisilazane using a spin coater and dried under heating on a vacuum contact-type hot plate at 110° C. for 90 seconds to obtain resist films having a film thickness of 0.1 $\mu$m. The obtained resist films each was measured on the dissolution contrast between the exposed area and the unexposed area upon exposure at 157 nm using a 157-nm laser exposure/dissolution behavior analyzer VUVES-4500 (manufactured by Lisotec Japan).

The results are shown in Tables 10 and 11.

TABLE 10

| Resin of the Invention | Dissolution Contrast (tanθ) |
|---|---|
| (1) | 5.8 |
| (2) | 6.5 |
| (3) | 6.2 |
| (4) | 5.6 |
| (5) | 5.9 |
| (13) | 6.2 |
| (15) | 6.9 |
| (17) | 6.5 |
| (23) | 6.4 |
| (25) | 5.7 |
| (27) | 6.1 |
| (33) | 6.3 |
| (35) | 6.5 |
| (40) | 6.6 |

TABLE 11

| Resin | Dissolution Contrast (tanθ) |
|---|---|
| (41) | 5.8 |
| (42) | 5.7 |
| (43) | 6.1 |
| (44) | 5.9 |
| (45) | 6.3 |
| (46) | 5.4 |
| (47) | 5.9 |
| (48) | 6.1 |
| (49) | 5.8 |
| (50) | 5.5 |
| (51) | 5.6 |
| (52) | 5.8 |
| (53) | 5.8 |
| (54) | 6.2 |
| (55) | 5.9 |
| (56) | 5.8 |
| (57) | 6.1 |
| (58) | 5.8 |
| (59) | 5.8 |
| (60) | 5.8 |
| (61) | 5.8 |
| (62) | 6.1 |
| (63) | 6.3 |
| (64) | 6.1 |
| (65) | 6.2 |
| (66) | 5.8 |
| (67) | 6.1 |
| (68) | 6.1 |
| Comparative Example 4 (commercially available acetal-type resist for KrF) | 5.3*[1)] |

*[1)]A value at the exposure by KrF excimer laser (248 nm).

As seen from the results in Tables 10 and 11, the composition of the present invention provides a dissolution contrast, namely, image-forming property equal to that provided by the resist practically used for KrF excimer of Comparative Example.

According to the present invention, a positive resist composition exhibiting sufficiently high transmittance and image-forming property even with light at a short wavelength of 157 nm, ensuring excellent sensitivity and resolution, and improved in the problems of coatability and development defect ascribable to fluorine resin can be provided.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising:

(A) a fluorine group-containing resin having: a structure wherein at least one of the main chain and the side chain of the polymer skeleton has at least one fluorine atom; and a group capable of decomposing under the action of an acid to increase the solubility in an alkali developer;

(B) a compound capable of generating an acid upon irradiation with at least one of an actinic ray or radiation; and (C) a surfactant containing at least one of a silicon atom and fluorine atom.

2. The positive resist composition as claimed in claim 1, wherein the resin (A) comprises at least one of fluorine group-containing resins (i) and (ii) below:

(i) a fluorine group-containing resin having at least one selected from a perfluoroalkylene group and a perfluoroarylene group as a part or all of the main chain of the polymer skeleton;

(ii) a fluorine group-containing resin having at least one selected from a perfluoroalkyl group, a perfluoroaryl group, a hexafluoro-2-propanol group and a group wherein the OH group in a hexafluoro-2-propanol group is protected, as a part or all of the side chain of the polymer skeleton.

3. The positive resist composition as claimed in claim 1, wherein the resin (A) contains at least one of repeating units represented by formulae (I) to (X):

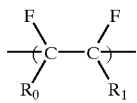
(I)

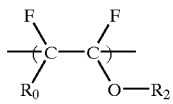
(II)

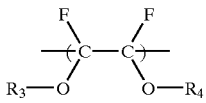
(III)

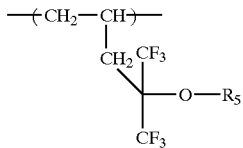
(IV)

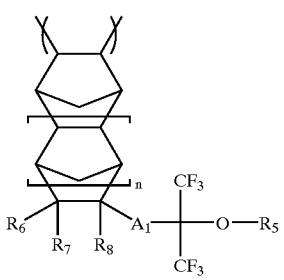
(V)

-continued (VI)
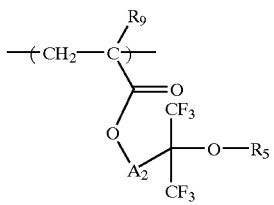

(VII)
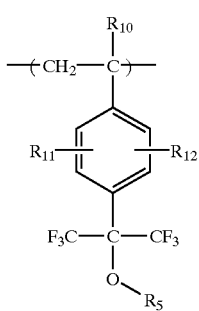

(VIII)
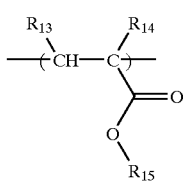

(IX)
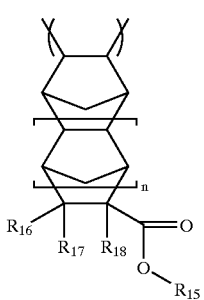

(X)
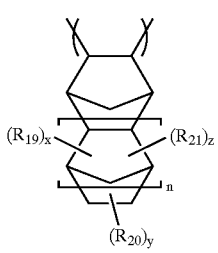

wherein $R_0$ and $R_1$ each represents a hydrogen atom, a fluorine atom, or an alkyl, perfluoroalkyl, cycloalkyl or aryl group, each of which may have a substituent;

$R_2$ to $R_4$ each represents an alkyl, perfluoroalkyl, cycloalkyl or aryl group, each of which may have a substituent and $R_0$ and $R_1$ may combine to form a ring, $R_0$ and $R_2$ may combine to form a ring and $R_3$ and $R_4$ may combine to form a ring;

$R_5$ represents a hydrogen atom, an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom or an alkyl, perfluoroalkyl or alkoxy group, each of which may have a substituent;

$R_9$ and $R_{10}$ each represents a hydrogen atom, a halogen atom, a cyano group, or an alkyl or haloalkyl group, each of which may have a substituent;

$R_{11}$ and $R_{12}$ each represents a hydrogen atom, a hydroxyl group, a halogen atom a cyano group, an alkoxy group, an acyl group, an alkyl, cycloalkyl, alkenyl, aralkyl or aryl group, and the alkyl, the cycloalkyl, the alkenyl, the aralkyl or the aryl group each may have a substituent;

$R_{13}$ and $R_{14}$ each represents a hydrogen atom, a halogen atom, a cyano group, or an alkyl or haloalkyl, each of which may have a substituent;

$R_{15}$ represents an alkyl, monocyclic or polycyclic cycloalkyl, alkenyl, aralkyl or aryl group, each of which has a fluorine atom;

$R_{16}$, $R_{17}$ and $R_{18}$ each represents a hydrogen atom, a halogen atom, a cyano group, or an alkyl, perfluoroalkyl, alkoxy or —CO—O—$R_{15}$ group, each of which may have a substituent;

$R_{19}$, $R_{20}$ and $R_{21}$ each represents a hydrogen atom, a fluorine atom or an alkyl, monocyclic or polycyclic cycloalkyl, alkenyl, aralkyl, aryl or alkoxy group, each of which has a fluorine atom, provided that at least one of $R_{19}$, $R_{20}$ and $R_{21}$ is a group other than a hydrogen atom;

$A_1$ and $A_2$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane group or a ureido group;

$R_{24}$ represents a hydrogen atom or an alkyl, cycloalkyl, aralkyl or aryl group, each of which may have a substituent;

n represents 0 or 1; and x, y and z each represents an integer of 0 to 4.

4. The positive resist composition as claimed in claim 1, wherein the resin (A) contains at least one of repeating units represented by formulae (XI) to (XIII):

(XI)
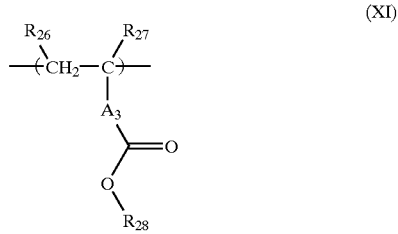

-continued

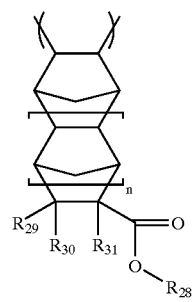
(XII)

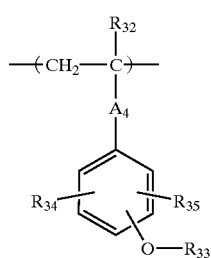
(XIII)

wherein $R_{26}$, $R_{27}$ and $R_{32}$ each represents a hydrogen atom, a halogen atom, a cyano group, or an alkyl or haloalkyl group, each of which may have a substituent;

$R_{28}$ and $R_{33}$ each represents $-C(R_{36})(R_{37})(R_{38})$, $-C(R_{36})(R_{37})(OR_{39})$ or a group represented by formula (XIV):

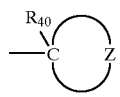
(XIV)

wherein $R_{29}$, $R_{30}$ and $R_{31}$ each represents a hydrogen atom, a halogen atom, a cyano group or an alkyl, perfluoroalkyl, alkoxy or $-CO-O-R_{28}$ group, each of which may have a substituent;

$R_{34}$ and $R_{35}$ each represents a hydrogen atom, a hydroxyl group, a halogen atom, a cyano group, an alkoxy group, an acyl group, an alkyl, cycloalkylene, alkenyl, aralkyl or aryl group, and the alkyl, cycloalkylene, alkenyl, aralkyl or aryl group each may have a substituent;

$R_{36}$, $R_{37}$, $R_{38}$ and $R_{39}$ each represents an alkyl, cycloalkyl, alkenyl, aralkyl or aryl group, each of which may have a substituent, and two of $R_{36}$, $R_{37}$ and $R_{38}$, or two of $R_{36}$, $R_{37}$ and $R_{39}$ may combine to form a ring;

$R_{40}$ represents an alkyl, cycloalkyl, alkenyl, alkynyl, aralkyl or aryl group, each of which may have a substituent;

$A_3$ and $A_4$ each represents a single bond, a divalent alkylene, alkenylene, cycloalkylene, arylene group, $-O-CO-R_{22}-$, $-CO-O-R_{23}-$ or $-CO-N(R_{24})-R_{25}-$, and the divalent alkylene, alkenylene, cycloalkylene or arylene group, each of which may have a substituent;

$R_{22}$ to $R_{25}$ have the same meanings as above;

Z represents an atomic group constituting a monocyclic or polycyclic alicyclic group together with the carbon atom; and n represents 0 or 1.

5. The positive composition as claimed in claim 1, wherein the resin (A) contains at least one of repeating units represented by formulae (XV) to (XVII):

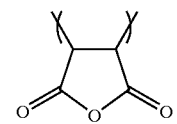
(XV)

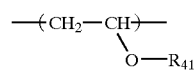
(XVI)

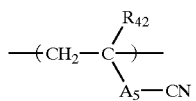
(XVII)

wherein $R_{41}$ represents an alkyl, cycloalkyl, aralkyl or aryl group, each of which may have a substituent;

$R_{42}$ represents a hydrogen atom, a halogen atom, a cyano group, or an alkyl or haloalkyl group, each of which may have a substituent;

$A_5$ represents a single bond, a divalent alkylene, alkenylene, cycloalkylene, arylene group, $-O-CO-R_{22}-$, $-CO-O-R_{23}-$ or $-CO-N(R_{24})-R_{25}-$, and the divalent alkylene, alkenylene, cycloalkylene or arylene group each may have a substituent;

$R_{22}$ to $R_{25}$ have the same meanings as above.

6. The positive resist composition as claimed in claim 1, wherein the resin (A) contains: at least one of repeating units represented by formulae (I) to (III); and at least one of repeating units represented by formulae (IV) to (VI):

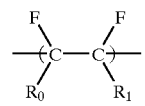
(I)

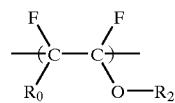
(II)

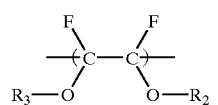
(III)

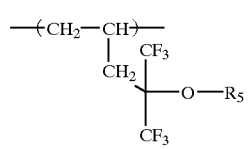
(IV)

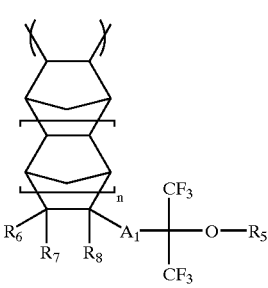
(V)

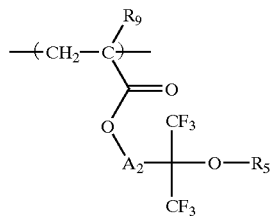
(VI)

wherein $R_0$ and $R_1$ each represents a hydrogen atom, a fluorine atom or an alkyl, perfluoroalkyl, cycloalkyl or aryl group, each of which may have a substituent,

- $R_2$ to $R_4$ each represents an alkyl, perfluoroalkyl, cycloalkyl or aryl group, each of which may have a substituent, and $R_0$ and $R_1$ may combine to form a ring, $R_0$ and $R_2$ may combine to form a ring, and $R_3$ and $R_4$ may combine to form a ring;

- $R_5$ represents a hydrogen atom or an alkyl, perfluoroalkyl, monocyclic or polycyclic cycloalkyl, acyl or alkoxycarbonyl group, each of which may have a substituent;

- $R_6$, $R_7$ and $R_8$ each represents a hydrogen atom, a halogen atom or an alkyl, perfluoroalkyl or alkoxy group, each of which may have a substituent;

- $R_9$ represents a hydrogen atom, a halogen atom, a cyano group, or an alkyl or haloalkyl group, each of which may have a substituent;

- $A_1$ and $A_2$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

- $R_{22}$, $R_{23}$ and $R_{25}$ each represents a single bond or a divalent alkylene, alkenylene, cycloalkylene or arylene group, each of which may have an ether group, an ester group, an amide group, a urethane or a ureido group;

- $R_{24}$ represents a hydrogen atom or an alkyl, cycloalkyl, aralkyl or aryl group, each of which may have a substituent; and

- n represents 0 or 1.

7. The positive resist composition as claimed in claim 1, wherein the resin (A) contains: at least one of repeating units represented by formulae (IV) to (VI) below; and at least one of repeating units represented by formulae (VIII) to (X) below:

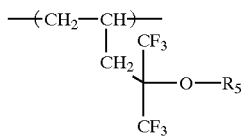
(IV)

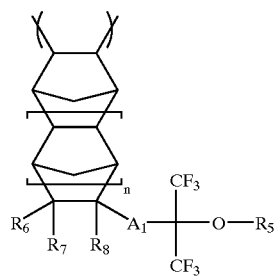
(V)

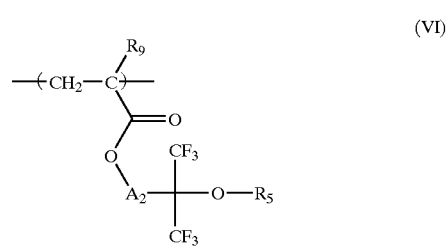
(VI)

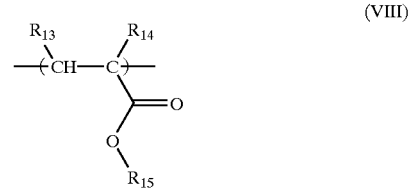
(VIII)

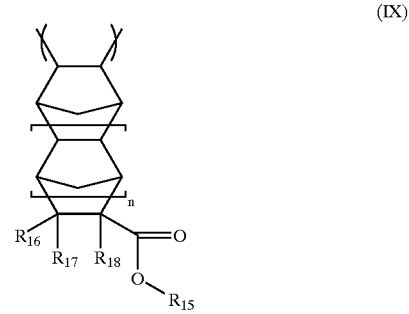
(IX)

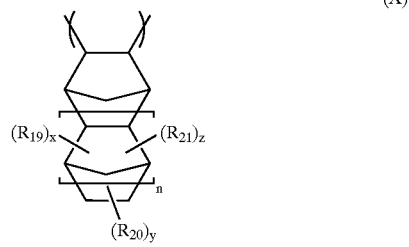
(X)

wherein $R_5$ represents a hydrogen atom or an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom or an alkyl, perfluoroalkyl or alkoxy group, each of which may have a substituent;

$R_9$ represents a hydrogen atom, a halogen atom, a cyano group, or an alkyl or haloalkyl group, each of which may have a substituent;

$R_{13}$ and $R_{14}$ each represents a hydrogen atom, a halogen atom, a cyano group, or an alkyl or haloalkyl group, each of which may have a substituent;

$R_{15}$ represents an alkyl, monocyclic or polycyclic cycloalkyl, alkenyl, aralkyl or aryl group, each of which has a fluorine atom;

$R_{16}$, $R_{17}$ and $R_{18}$ each represents a hydrogen atom, a halogen atom, a cyano group, or an alkyl, perfluoroalkyl, alkoxy or —CO—O—$R_{15}$ group, each of which may have a substituent;

$R_{19}$, $R_{20}$ and $R_{21}$ each represents a hydrogen atom, a fluorine atom or an alkyl, monocyclic or polycyclic cycloalkyl, alkenyl, aralkyl, aryl or alkoxy group, each of which has a fluorine atom, provided that at least one of $R_{19}$, $R_{20}$ and $R_{21}$ is a group other than a hydrogen atom;

$A_1$ and $A_2$ each represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane group or a ureido group;

$R_{24}$ represents a hydrogen atom or an alkyl, cycloalkyl, aralkyl or aryl group, each of which may have a substituent;

n represents 0 or 1; and x, y and z each represents an integer of 0 to 4.

8. The positive resist composition as claimed in claim 1, wherein the resin (A) contains: at least one of repeating units represented by formulae (IV) to (VII) below; and at least one of repeating units represented by formulae (XV) to (XVII) below:

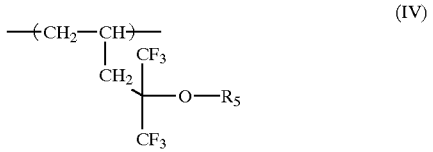
(IV)

(V)

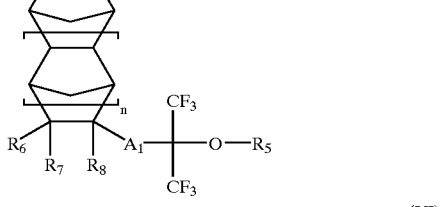
(VI)

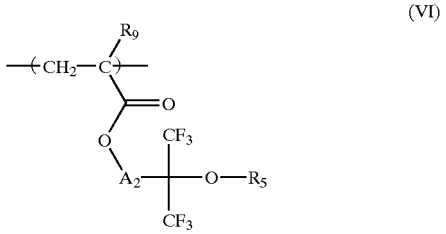

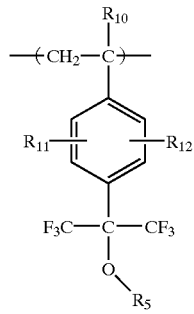
(VII)

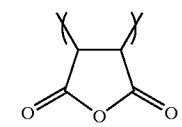
(XV)

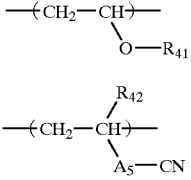
(XVI)

(XVII)

wherein $R_5$ represents a hydrogen atom or an alkyl, perfluoroalkyl, monocyclic or polycyclic cycloalkyl, acyl or alkoxycarbonyl group, each of which may have a substituent;

$R_6$, $R_7$ and $R_8$ each represents a hydrogen atom, a halogen atom, or an alkyl, perfluoroalkyl or alkoxy group, each of which may have a substituent;

$R_9$ and $R_{10}$ each represents a hydrogen atom, a halogen atom, a cyano group, or an alkyl or haloalkyl group, each of which may have a substituent;

$R_{11}$ and $R_{12}$ each represents a hydrogen atom, a hydroxyl group, a halogen atom, a cyano group, an alkoxy group, an acyl group, an alkyl, cycloalkyl, alkenyl, aralkyl or aryl group, and the alkyl, cycloalkyl, alkenyl, aralkyl or aryl group each may have a substituent;

$A_1$ and $A_2$ each represents a single bond or a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent;

$R_{22}$, $R_{23}$ and $R_{25}$ each represents a single bond or a divalent alkylene, alkenylene, cycloalkylene or arylene group, each of which may have an ether group, an ester group, an amide group, a urethane group or a ureido group;

$R_{24}$ represents a hydrogen atom or an alkyl, cycloalkyl, aralkyl or aryl group, each of which may have a substituent;

n represents 0 or 1;

$R_{41}$ represents an alkyl, cycloalkyl, aralkyl or aryl group, each of which may have a substituent;

$R_{42}$ represents a hydrogen atom, a halogen atom, a cyano group, or an alkyl or haloalkyl group, each of which may have a substituent; and $A_5$ represents a single bond, a divalent alkylene, alkenylene, cycloalkylene, arylene group, —O—CO—$R_{22}$—, —CO—O—$R_{23}$— or —CO—N($R_{24}$)—$R_{25}$—, and the divalent alkylene, alkenylene, cycloalkylene or arylene group each may have a substituent.

9. The positive resist composition as claimed in claim 1, wherein the resin (A) contains: at least one of repeating units represented by formula (IA) below; and at least one of repeating units represented by formula (IIA) below:

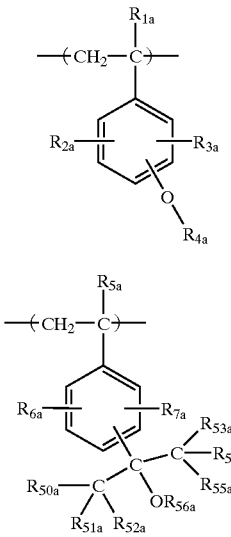

wherein $R_{1a}$ and $R_{5a}$ each represents a hydrogen atom, a halogen atom, a cyano group or an alkyl group which may have a substituent;

$R_{2a}$, $R_{3a}$, $R_{6a}$ and $R_{7a}$ each represents a hydrogen atom, a a halogen atom, a cyano group, a hydroxyl group or an alkyl, cycloalkyl, alkoxy, acyl, acyloxy, alkenyl, aryl or aralkyl group, each of which may have a substituent;

$R_{50a}$ to $R_{55a}$ each represents a hydrogen atom, a fluorine atom or an alkyl group which may have a substituent, and at least one of $R_{50a}$ to $R_{55a}$ represents a fluorine atom or an alkyl group where at least one hydrogen atom is substituted by a fluorine atom;

$R_{56a}$ represents a hydrogen atom or an alkyl, cycloalkyl, acyl or alkoxycarbonyl group, each of which may have a substituent;

$R_{4a}$ represents a group represented by formula (IVA) or (VA):

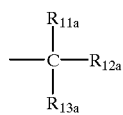

(IVA)

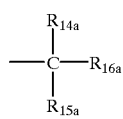

(VA)

wherein in formula (IVA), $R_{11a}$, $R_{12a}$ and $R_{13a}$ each represents an alkyl, cycloalkyl, alkenyl, aralkyl or aryl group, each of which may have a substituent; and in formula (VA), $R_{14a}$ and $R_{15a}$ each represents a hydrogen atom or an alkyl group which may have a substituent; and $R_{16a}$ represents an alkyl, cycloalkyl, aralkyl or aryl group, each of which may have a substituent, and two of $R_{14a}$ to $R_{16a}$ may combine to form a ring.

10. The positive resist composition as claimed in claim 1, wherein the resin (A) contains: at least one of repeating units represented by formula (IIA) below; and at least one of repeating units represented by (VIA) below:

(IIA)

(VIA)

wherein in formula (IIA), $R_{5a}$ represents a hydrogen atom, a halogen atom, a cyano group or an alkyl group which may have a substituent;

$R_{6a}$ and $R_{7a}$ each represents a hydrogen atom, a halogen atom, a cyano group, a hydroxyl, or an alkyl, cycloalkyl, alkoxy, acyl, acyloxy, alkenyl, aryl or aralkyl group, each of which may have a substituent;

$R_{50a}$ to $R_{55a}$ each represents a hydrogen atom, a fluorine atom or an alkyl group which may have a substituent, and at least one of $R_{50a}$ to $R_{55a}$ represents a fluorine atom or an alkyl group where at least one hydrogen atom is substituted by a fluorine atom;

$R_{56a}$ represents a hydrogen atom or an alkyl, cycloalkyl, acyl or alkoxycarbonyl group, each of which may have a substituent;

in formula (VIA), $R_{17a1}$ and $R_{17a2}$ each represents a hydrogen atom, a halogen atom, a cyano group or an alkyl group which may have a substituent;

$R_{18a}$ represents —$C(R_{18a1})(R_{18a2})(R_{18a3})$ or —$C(R_{18a1})(R_{18a2})(OR_{18a4})$; $R_{18a1}$ to $R_{18a4}$ each represents a hydrogen atom or an alkyl, cycloalkyl, alkenyl, aralkyl or aryl group, each of which may have a substituent, and two of $R_{18a1}$, $R_{18a2}$ and $R_{18a3}$ or two of $R_{18a1}$, $R_{18a2}$ and $R_{18a4}$ may combine to form a ring; and $A_0$ represents a single bond or a divalent linking group which may have a substituent.

11. The positive resist composition as claimed in claim 10, wherein in formula (VIA), $R_{18a}$ is a group represented by formula (VIA-A):

(VIA-A)

wherein $R_{18a5}$ and $R_{18a6}$ each represents an alkyl group which may have a substituent; and $R_{18a7}$ represents a cycloalkyl group which may have a substituent.

12. The positive resist composition as claimed in claim 10, wherein in formula (VIA), $R_{18a}$ is a group represented by formula (VIA-B):

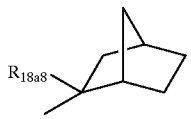

(VIA-B)

wherein $R_{18a8}$ represents an alkyl, alkenyl, alkynyl, aralkyl or aryl group, each of which may have a substituent.

13. The positive resist composition as claimed in claim 9, wherein at least one of $R_{1a}$ in formula (IA) and $R_{5a}$ in formula (IIA) is a trifluoromethyl group.

14. The positive resist composition as claimed in claim 10, wherein at least one of $R_{5a}$ in formula (IIA) and $R_{17a2}$ in formula (VIA) is a trifluoromethyl group.

15. The positive resist composition as claimed in claims 9, wherein the resin (A) further contains at least one of repeating units represented by formulae (IIIA) and (VIIA):

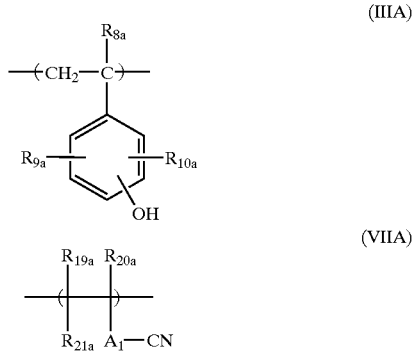

(IIIA)

(VIIA)

wherein in formula (IIIA), $R_{8a}$ represents a hydrogen atom, a halogen atom, a cyano group or an alkyl group which may have a substituent; $R_{9a}$ and $R_{10a}$ each represents a hydrogen atom, a halogen atom, a cyano group or an alkyl, cycloalkyl, alkoxy, acyl, acyloxy, alkenyl, aryl or aralkyl group, each of which may have a substituent; and in formula (VIIA), $R_{19a}$ and $R_{20a}$ each represents a hydrogen atom, a halogen atom, a cyano group or an alkyl group which may have a substituent, $R_{21a}$ represents a hydrogen atom, a halogen atom, an alkyl which may have a substituent or $-A_1$-CN group; and $A_1$ represents a single bond or a divalent linking group.

16. The positive resist composition as claimed in claim 10, wherein the resin (A) further contains at least one of repeating units represented by formulae (IIIA) and (VIIA):

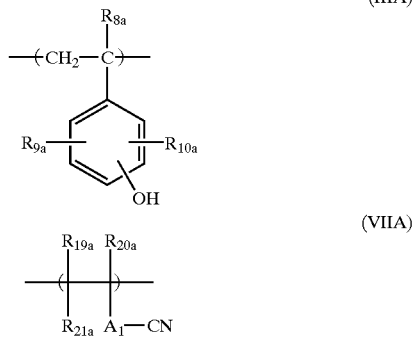

(IIIA)

(VIIA)

wherein in formula (IIIA), $R_{8a}$ represents a hydrogen atom, a halogen atom, a cyano group or an alkyl group which may have a substituent; $R_{9a}$ and $R_{10a}$ each represents a hydrogen atom, a halogen atom, a cyano group or an alkyl, cycloalkyl, alkoxy, acyl, acyloxy, alkenyl, aryl or aralkyl group, each of which may have a substituent; and in formula (VIIA), $R_{19a}$ and $R_{20a}$ each represents a hydrogen atom, a halogen atom, a cyano group or an alkyl group which may have a substituent, $R_{21a}$ represents a hydrogen atom, a halogen atom, an alkyl which may have a substituent or $-A_1$-CN group; and $A_1$ represents a single bond or a divalent linking group.

17. The positive resist composition as claimed in claim 1, which further comprises a compound containing a basic nitrogen atom.

18. The positive resist composition as claimed in claim 1, wherein the compound (B) comprises at least one compound selected from sulfonium salt and iodonium salt compounds capable of generating at least one of acids (i) to (iii) below upon irradiation with one of an actinic ray and radiation:

(i) a perfluoroalkylsulfonic acid having 2 or more carbon atoms;

(ii) a perfluoroarylsulfonic acid; and (iii) an arylsulfonic acid having a perfluoroalkyl group as a substituent.

19. The positive resist composition as claimed in claim 1, which is a composition to be irradiated with an ultraviolet ray having a wave length of 160 nm or less.

20. The positive resist composition as claimed in claim 19, wherein the ultraviolet ray is $F_2$ excimer laser ray having a wave length of 157 nm.

* * * * *